US008852847B2

(12) United States Patent
Tsubaki

(10) Patent No.: US 8,852,847 B2
(45) Date of Patent: Oct. 7, 2014

(54) METHOD OF FORMING PATTERNS

(71) Applicant: Fujifilm Corporation, Tokyo (JP)

(72) Inventor: Hideaki Tsubaki, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/074,156

(22) Filed: Nov. 7, 2013

(65) Prior Publication Data

US 2014/0057209 A1    Feb. 27, 2014

Related U.S. Application Data

(63) Continuation of application No. 13/306,174, filed on Nov. 29, 2011, now Pat. No. 8,632,942, which is a continuation-in-part of application No. 12/959,147, filed on Dec. 2, 2010, now Pat. No. 8,088,557, which is a continuation of application No. 12/137,371, filed on Jun. 11, 2008, now Pat. No. 8,017,298.

(30) Foreign Application Priority Data

Jun. 12, 2007  (JP) ................................ 2007-155323

(51) Int. Cl.
*G03F 7/004* (2006.01)
*G03F 7/26* (2006.01)
*G03B 27/32* (2006.01)
*G03B 27/52* (2006.01)

(52) U.S. Cl.
USPC .............. 430/270.1; 355/18; 355/55; 355/27; 355/30

(58) Field of Classification Search
USPC ........ 430/270.1, 434, 435; 355/18, 27, 30, 55
See application file for complete search history.

(56) References Cited

U.S. PATENT DOCUMENTS

| 4,099,062 | A | 7/1978 | Kitcher |
| 4,212,935 | A | 7/1980 | Canavello et al. |
| 4,267,258 | A | 5/1981 | Yoneda et al. |
| 4,318,976 | A | 3/1982 | Shu et al. |
| 4,491,628 | A | 1/1985 | Ito et al. |
| 4,690,887 | A | 9/1987 | Fukuda et al. |
| 4,777,119 | A | 10/1988 | Brault et al. |
| 5,250,375 | A | 10/1993 | Sebald et al. |

(Continued)

FOREIGN PATENT DOCUMENTS

| EP | 0102450 | A2 | 3/1984 |
| EP | 0519297 | A2 | 12/1992 |

(Continued)

OTHER PUBLICATIONS

Notification of Reasons for Refusal dated Jul. 13, 2010, in counterpart Japanese Application No. 2007-155323.

(Continued)

*Primary Examiner* — Amanda C. Walke
(74) *Attorney, Agent, or Firm* — Sughrue Mion, PLLC

(57) ABSTRACT

A method of forming patterns includes (a) coating a substrate with a resist composition for negative development to form a resist film having a receding contact angle of 70 degrees or above with respect to water, wherein the resist composition for negative development contains a resin capable of increasing the polarity by the action of an acid and becomes more soluble in a positive developer and less soluble in a negative developer upon irradiation with an actinic ray or radiation, (b) exposing the resist film via an immersion medium, and (c) performing development with a negative developer.

10 Claims, 4 Drawing Sheets

(56) References Cited

U.S. PATENT DOCUMENTS

| | | |
|---|---|---|
| 5,268,260 A | 12/1993 | Bantu et al. |
| 5,326,840 A | 7/1994 | Przybilla et al. |
| 5,378,975 A | 1/1995 | Schweid et al. |
| 5,470,693 A | 11/1995 | Sachdev et al. |
| 5,738,975 A | 4/1998 | Nakano et al. |
| 5,858,620 A | 1/1999 | Ishibashi et al. |
| 5,866,304 A | 2/1999 | Nakano et al. |
| 6,030,541 A | 2/2000 | Adkisson et al. |
| 6,147,394 A | 11/2000 | Bruce et al. |
| 6,221,568 B1 | 4/2001 | Angelopoulos et al. |
| 6,338,934 B1 | 1/2002 | Chen et al. |
| 6,406,829 B1 | 6/2002 | Tachikawa et al. |
| 6,509,134 B2 | 1/2003 | Ito et al. |
| 6,555,607 B1 | 4/2003 | Kanda et al. |
| 6,579,657 B1 | 6/2003 | Ishibashi et al. |
| 6,593,058 B1 | 7/2003 | Feiring et al. |
| 6,800,423 B2 | 10/2004 | Yokoyama et al. |
| 6,872,503 B2 | 3/2005 | Wheland et al. |
| 6,998,358 B2 | 2/2006 | French et al. |
| 7,016,754 B2 | 3/2006 | Poolla et al. |
| 7,129,199 B2 | 10/2006 | Zhang et al. |
| 7,348,127 B2 | 3/2008 | Hinsber, III |
| 7,354,693 B2 | 4/2008 | Hatakeyama et al. |
| 7,371,510 B2 | 5/2008 | Hirayama et al. |
| 7,396,482 B2 | 7/2008 | Brandl |
| 7,399,577 B2 | 7/2008 | Yamato et al. |
| 7,445,883 B2 | 11/2008 | Baba-Ali et al. |
| 7,455,952 B2 | 11/2008 | Hatakeyama et al. |
| 7,608,386 B2 | 10/2009 | Nozaki et al. |
| 7,670,750 B2 | 3/2010 | Harada et al. |
| 7,678,537 B2 | 3/2010 | Allen et al. |
| 7,700,260 B2 | 4/2010 | Kanna et al. |
| 7,771,914 B2 | 8/2010 | Hatakeyama et al. |
| 7,851,140 B2 | 12/2010 | Tsubaki |
| 7,985,534 B2 | 7/2011 | Tsubaki |
| 7,998,655 B2 | 8/2011 | Tsubaki |
| 8,017,298 B2 | 9/2011 | Tsubaki |
| 8,017,304 B2 | 9/2011 | Tarutai et al. |
| 8,034,547 B2 | 10/2011 | Tsubaki et al. |
| 8,071,272 B2 | 12/2011 | Tsubaki |
| 8,088,557 B2 | 1/2012 | Tsubaki |
| 8,227,183 B2 | 7/2012 | Tsubaki et al. |
| 8,241,840 B2 | 8/2012 | Tsubaki et al. |
| 2002/0045122 A1 | 4/2002 | Iwasa et al. |
| 2002/0132184 A1 | 9/2002 | Babcock |
| 2003/0022095 A1 | 1/2003 | Kai et al. |
| 2003/0073027 A1 | 4/2003 | Namiki et al. |
| 2003/0091936 A1 | 5/2003 | Rottstegge et al. |
| 2003/0143483 A1 | 7/2003 | Takechi |
| 2004/0023150 A1 | 2/2004 | Fiering et al. |
| 2004/0023152 A1 | 2/2004 | Feiring et al. |
| 2004/0096780 A1 | 5/2004 | Nozaki et al. |
| 2004/0229157 A1 | 11/2004 | Rhodes et al. |
| 2004/0242798 A1 | 12/2004 | Sounik et al. |
| 2005/0095532 A1 | 5/2005 | Kodama et al. |
| 2005/0203262 A1 | 9/2005 | Fiering et al. |
| 2005/0224923 A1 | 10/2005 | Daley et al. |
| 2006/0008736 A1 | 1/2006 | Kanda et al. |
| 2006/0040203 A1 | 2/2006 | Kodama et al. |
| 2006/0073420 A1 | 4/2006 | Nozaki et al. |
| 2006/0105267 A1 | 5/2006 | Khojasteh et al. |
| 2006/0147836 A1 | 7/2006 | Hatakeyama et al. |
| 2006/0189138 A1 | 8/2006 | Nishimura et al. |
| 2006/0204890 A1 | 9/2006 | Kodama |
| 2006/0257781 A1 | 11/2006 | Benoit et al. |
| 2007/0003878 A1 | 1/2007 | Paxton et al. |
| 2007/0054217 A1 | 3/2007 | Kodama et al. |
| 2007/0059639 A1 | 3/2007 | Kanda et al. |
| 2007/0081782 A1 | 4/2007 | Maeda et al. |
| 2007/0087288 A1 | 4/2007 | Nishiyama et al. |
| 2007/0105045 A1 | 5/2007 | Iwato et al. |
| 2007/0254237 A1 | 11/2007 | Allen et al. |
| 2008/0063984 A1 | 3/2008 | Zhang et al. |
| 2008/0113300 A2 | 5/2008 | Choi et al. |
| 2008/0131820 A1 | 6/2008 | Van Steenwinckel et al. |
| 2008/0187860 A1 | 8/2008 | Tsubaki et al. |
| 2008/0261150 A1 | 10/2008 | Tsubaki et al. |
| 2008/0311530 A1 | 12/2008 | Allen et al. |
| 2008/0318171 A1 | 12/2008 | Tsubaki |
| 2009/0011366 A1 | 1/2009 | Tsubaki et al. |
| 2009/0042147 A1 | 2/2009 | Tsubaki |
| 2009/0183390 A1 | 7/2009 | Miller et al. |
| 2010/0040971 A1 | 2/2010 | Tarutani et al. |
| 2010/0040972 A1 | 2/2010 | Tarutani et al. |
| 2010/0167201 A1 | 7/2010 | Tsubaki |
| 2010/0190106 A1 | 7/2010 | Tsubaki |
| 2010/0239984 A1 | 9/2010 | Tsubaki |
| 2010/0323305 A1 | 12/2010 | Tsubaki et al. |
| 2010/0330507 A1 | 12/2010 | Tsubaki et al. |
| 2011/0020755 A1 | 1/2011 | Tsubaki et al. |
| 2011/0045413 A1 | 2/2011 | Tsubaki |
| 2011/0229832 A1 | 9/2011 | Kamimura et al. |
| 2011/0250543 A1 | 10/2011 | Tsubaki |
| 2011/0300485 A1 | 12/2011 | Tsubaki et al. |
| 2011/0305992 A1 | 12/2011 | Tarutani et al. |
| 2012/0088194 A1 | 4/2012 | Tsubaki |
| 2012/0135355 A1 | 5/2012 | Tsubaki |

FOREIGN PATENT DOCUMENTS

| | | | |
|---|---|---|---|
| EP | 1338921 A2 | 8/2003 | |
| EP | 1 500 977 A1 | 1/2005 | |
| EP | 1612604 A2 | 1/2006 | |
| EP | 1 720 072 A1 | 11/2006 | |
| EP | 1 764 652 A2 | 3/2007 | |
| EP | 1980911 A2 | 10/2008 | |
| JP | 57-153433 A | 9/1982 | |
| JP | 59-45439 A | 3/1984 | |
| JP | 04-039665 Q1 | 2/1992 | |
| JP | 05-241348 A | 9/1993 | |
| JP | 05-265212 A | 10/1993 | |
| JP | 06-138666 A | 5/1994 | |
| JP | 6-194847 A | 7/1994 | |
| JP | 07-181677 A | 7/1995 | |
| JP | 7-199467 A | 8/1995 | |
| JP | 7-220990 A | 8/1995 | |
| JP | 07-261392 A | 10/1995 | |
| JP | 9-244247 A | 9/1997 | |
| JP | 10-073927 A | 3/1998 | |
| JP | 11-145036 A | 5/1999 | |
| JP | 2000-199953 A | 7/2000 | |
| JP | 2000-321789 A | 11/2000 | |
| JP | 2001-019860 A | 1/2001 | |
| JP | 2001-109154 A | 4/2001 | |
| JP | 2001-215731 A | 8/2001 | |
| JP | 2002525683 A | 8/2002 | |
| JP | 2002-260991 A | 9/2002 | |
| JP | 2003-76019 A | 3/2003 | |
| JP | 2003-122024 A | 4/2003 | |
| JP | 2003-195502 A | 7/2003 | |
| JP | 2003-249437 A | 9/2003 | |
| JP | 2003-270789 A | 9/2003 | |
| JP | 2004-061668 A | 2/2004 | |
| JP | 2004-514952 A | 5/2004 | |
| JP | 2004-527113 A | 9/2004 | |
| JP | 2004-310082 A | 11/2004 | |
| JP | 2005-109146 A | 4/2005 | |
| JP | 2005-533097 A | 11/2005 | |
| JP | 2005-533907 A | 11/2005 | |
| JP | 2006072326 A | 3/2006 | |
| JP | 2006-156422 A | 6/2006 | |
| JP | 2006-227174 A | 8/2006 | |
| JP | 2006-518779 A | 8/2006 | |
| JP | 2006-303504 A | 11/2006 | |
| JP | 2006-309245 A | 11/2006 | |
| JP | 2007-25240 A | 2/2007 | |
| JP | 2007-065024 A | 3/2007 | |
| JP | 2007-71978 A | 3/2007 | |
| JP | 2007-108581 A | 4/2007 | |
| JP | 2007-140188 A | 6/2007 | |
| JP | 2007-156450 A | 6/2007 | |
| JP | 2008-522206 A | 6/2008 | |
| JP | 2008-292975 A | 12/2008 | |
| JP | 2008-310314 A | 12/2008 | |

(56) References Cited

FOREIGN PATENT DOCUMENTS

| KR | 1020070030701 A | 3/2007 |
|---|---|---|
| WO | 99-14635 A1 | 3/1999 |
| WO | 00/17712 A1 | 3/2000 |
| WO | 02/44845 A2 | 6/2002 |
| WO | 2004/068242 A1 | 8/2004 |
| WO | 2004/074937 A1 | 9/2004 |
| WO | 2004/076495 A2 | 9/2004 |
| WO | 2004/077158 A1 | 9/2004 |
| WO | 2005/019937 A1 | 3/2005 |
| WO | 2005/043239 A1 | 5/2005 |
| WO | 2006/056905 A2 | 6/2006 |
| WO | 2007/037213 A1 | 4/2007 |
| WO | 2008129964 A1 | 10/2008 |
| WO | 2008140119 A1 | 11/2008 |

OTHER PUBLICATIONS

B.J. Lin,"Semiconductor Foundry, Lithography, and Partners", Emerging Lithograhic of SPIE, 2002, pp. 11-24, vol. 4688, SPIE.
J. A. Hoffnagle et al., "liquid Immersion Deep-Ultraviolet Interferometric Lithography", J. Vac. Sci. Tehcnol. B, Nov./Dec. 1999, pp. 3306-3309, vol. 17, American Vacuum Society.
Notification of Reason for Refusal dated Jul. 13, 2010, issued in counterpart Japanese Application No. 2007-155322.
US Office Action issued in U.S. Appl. No. 12/137,232; dated Sep. 3, 2010.
"Microdevices", Apr. 2004, pp. 76-87, Nikkei Microdevices.
US Office Action issued U.S. Appl. No. 12/137,371; dated Sep. 2, 2010.
Taiwanese Office Action, dated Nov. 16, 2010, issued in Application No. 097121644.
Japanese Office Action for Application No. 2008-128797, dated Apr. 6, 2010.
Extended European Search Report dated Apr. 27, 2009, in European Application No. 08010596.8.
Extended European Search Report dated May 28, 2009 in European Application No. 08007245.7.
Notification of Reasons for Refusal in counterpart Japanese Application No. 2007-325915, dated Mar. 30, 2010.
European Search Report dated Sep. 20, 2010 issued in counterpart application No. 07025004.8.
European OA issued in Application No. 08007245.7, dated Dec. 21, 2010.
European OA issued in Application No. 08010596.8, dated Dec. 17, 2010.
European OA issued in Application No. 08010600.8, dated Dec. 17, 2010.
Korean OA issued in Application No. 10-2008-0055449, dated Dec. 18, 2010.
Korean OA issued in Application No. 10-2008-0055461, dated Dec. 3, 2010.
David Van Steenwinckel, et al.; "Resis effects at small pitches"; American Vacuum Society, Journal Vacuum Science Technology B vol. 24 No. 1; Jan./Feb. 2006; pp. 316-320.
International Search Report (PCT/ISA /210) for PCT/JP2008/058976, dated Jun. 17, 2008.
International Search Report (PCT/ISA/210) issued for PCT/JP2008/060800, dated Jul. 22, 2008.
Karen E. Petrillo, et al.; "Effect of photo acid generator concentration on the process latitude of a chemically amplified resist"; American Vacuum Society; Journal of Vacuum Science Technology B; vol. 12 No. 6; Nov./Dec. 1994; pp. 3863-3867.
M. Maenhoudt, et al.; "Double Patterning scheme for sub-0.25 k1 single damascene structures at NA=0.75, λ=193nm"; Optical Microlithography XVIII; SPIE vol. 5754; pp. 1508-1518.
PCT/ISA/237 issued for PCT/JP2008/058976, dated Jun. 17, 2008.
Shinji Tarutani, et al.; "Development of Materials and Processes for Double Patterning toward 32 nm Node ArF Immersion Lithography"; Journal of Photoplymer Science and Tech; 2008, vol. 21 No. 5; pp. 685-690.
Steven R. J. Brueck, et al.; "Extension of 193-nm immersion optical lithography to the 22-nm half-pitch node"; Optical Microlithography VXII, SPIE vol. 5377; pp. 1315-1322.
Sungkoo Lee, et al.; "Double exposure technology using silicon containing materials"; Advances in Resist Technology and Processing XXII, SPIE Col. 6153; pp. 61531K-1 to 61531K-7.
Written Opinion (PCT/ISA/237) issued for PCT/JP2008/060800, dated Jul. 22, 2008.
Correspondence Record prepared Jul. 13, 2010, in counterpart Japanese Application No. 2007-325915.
English Translation of JP 2000-199953.
International Search Report (PCT/SA/210) issued in PCT/JP2008/057187, on May 20, 2008.
Submission of Publication dated Jun. 11, 2010, in related Japanese Application No. 2007-325915.
Written Opinion (PCT/ISA/237) issued in PCT/JP2008/057187 on May 20, 2008.
Non-Final Office Action issued in related U.S. Appl. No. 12/145,151, dated Mar. 26, 2010.
Non-Final Office Action issued is related U.S. Appl. No. 12/145,151, dated Jul. 6, 2009.
United States Office Action, dated Sep. 13, 2010 issued in counterpart application No. 11/964,454.
US Office Action issued Dec. 13, 2010 in U.S. Appl. No. 11/964,454.
US Office Action issued Nov. 2, 2010, in U.S. Appl. No. 12/145,270.
US Office Action issued Oct. 28, 2010, in U.S. Appl. No. 12/600,038.
European Office Action Issued on May 29, 2012 in corresponding application 08010600.8.
European Office Action issued on May 29, 2012 in corresponding application 08010596.8.
Communication dated Dec. 11, 2012 from the European Patent Office in counterpart application No. 08010596.8.
Search Report dated Mar. 11, 2013 issued in European Patent Application No. 12197458.8.
Office Action, dated Aug. 27, 2013, issued by the Taiwanese Patent Office in counterpart Taiwanese Applciation No. 099138811.
Office Action, dated Aug. 5, 2013, issued by the Korean Intellectual Property Office, in counterpart Application No. 1020100112983.
Extended European Search Report dated Jan. 14, 2011 in EP Application No. 07025004.8.
Office Action dated Nov. 30, 2010 in U.S. Appl. No. 12/578,520.
Office Action dated Feb. 25, 2011 in U.S. Appl. No. 12/895,516.
Extended European Search Report dated Apr. 27, 2009 in EP Application No. 08010600.8.
Office Action dated Jan. 9, 2014, issued by the Korean Intellectual Property Office in counterpart Korean Application No. 10-2013-0112983.
Office Action dated Jun. 5, 2014, issued by the European Patent Office in European Application No. 12 197 458.8.

METHOD OF FORMING PATTERNS

CROSS-REFERENCE TO RELATED APPLICATIONS

This application is a Continuation of U.S. application Ser. No. 13/306,174 filed Nov. 29, 2011, which is a Continuation-In-Part of U.S. application Ser. No. 12/959,147, filed Dec. 2, 2010, now U.S. Pat. No. 8,088,557, which is a Continuation Application of U.S. application Ser. No. 12/137,371, filed Jun. 11, 2008, now U.S. Pat. No. 8,017,298, which claims priority from Japanese Application No. 2007-155323, filed Jun. 12, 2007; all of which are hereby incorporated herein by reference in their entirety.

BACKGROUND OF THE INVENTION

1. Field of the Invention

The present invention relates to a method of forming patterns, which is usable in a production process of semiconductors, such as ICs, manufacturing of circuit boards for liquid crystal displays or thermal heads, and other lithography processes of photofabrication. More specifically, the invention is concerned with a method of forming patters by using a resist composition for negative development and a negative developer preferable used in the lithography process performing light exposure by means of immersion-type projection exposure apparatus.

2. Description of the Related Art

As semiconductor devices have become increasingly finer, progress has been made in developing exposure light sources of shorter wavelengths and projection lenses having higher numerical apertures (higher NAs). Up to now, steppers using as light sources ArF excimer laser with a wavelength of 193 nm and having NA of 1.35 have been developed. As generally well known, relationships of these factors to resolution and depth of focus can be given by the following expressions;

$$\text{(Resolution)} = k_1 \cdot (\lambda/NA)$$

$$\text{(Depth of Focus)} = \pm k_2 \cdot \lambda/NA^2$$

where $\lambda$ is the wavelength of an exposure light source, NA is the numerical aperture of a projection lens, and $k_1$ and $k_2$ are coefficients concerning a process.

As an art of heightening the resolution in an optical microscope, the method of filling the space between a projection lens and a test specimen with a liquid having a high refractive index (hereinafter referred to as an immersion liquid or an immersion medium), or the so-called immersion method, has hitherto been known.

This "immersion effect" can be explained as follows. When the immersion method is applied, the foregoing resolution and depth of focus can be given by the following expressions;

$$\text{(Resolution)} = k_1 \cdot (\lambda_0/n)/NA_0$$

$$\text{(Focal depth)} = \pm k_2 \cdot (\lambda_0/n)/NA_o^2$$

where $\lambda_0$ is the wavelength of an exposure light source in the air, n is the refractive index of an immersion liquid relative to the air and $NA_0$ is equal to sin θ when the convergent half angle of incident rays is represented by θ. That is to say, the effect of immersion is equivalent to the use of exposure light with a 1/n wavelength. In other words, application of the immersion method to a projection optical system having the same NA value can multiply the focal depth by a factor of n.

This art is effective on all shapes of patterns, and besides, it can be used in combination with super-resolution techniques under study at present, such as a phase-shift method and an off-axis illumination method.

Examples of apparatus utilizing this effect for transfer of fine circuit patterns in semiconductor devices are disclosed in Patent Document 1 (JP-A-57-153433) and Patent Document 2 (JP-A-7-220990), but these documents have no description of resist suitable for immersion lithography.

Recent progress of immersion lithography is reported, e.g., in Non-patent Document 1 (*Proc. SPIE*, 4688, 11 (2002)), Non-patent Document 2 (*J. Vac. Sci. Technol., B* 17 (1999)), Patent Document 3 (WO 2004/077158) and Patent Document 4 (WO 2004/068242). In the case where ArF excimer laser is used as a light source, purified water (refractive index at 193 nm: 1.44) is the most promising immersion liquid in point of not only handling safety but also transmittance and refractive index at 193 nm, and actually applied in mass production too. On the other hand, it is known that immersion exposure using a medium of a higher refractive index as immersion liquid can offer higher resolution (Non-patent Document 3: *Nikkei Microdevices*, April in 2004).

For the purpose of supplementing the sensitivity of resist, which has been reduced by light absorption from the resist for KrF excimer laser (248 nm) onward, the image formation method referred to as a chemical amplification technique has been adopted as a method of patterning resist. To illustrate an image formation method utilizing chemical amplification by a positive-working case, images are formed in such a process that exposure is performed to cause decomposition of an acid generator in the exposed areas, thereby generating an acid, and conversion of alkali-insoluble groups into an alkali-soluble groups by utilizing the acid generated as a reaction catalyst is caused by bake after exposure (PEB: Post Exposure Bake) to allow the removal of exposed areas by an alkaline developer.

Since application of immersion lithography to chemical amplification resist brings the resist layer into contact with an immersion liquid at the time of exposure, it is pointed out that the resist layer suffers degradation and ingredients having adverse effects on the immersion liquid are oozed from the resist layer. More specifically, Patent Document 4 (WO 2004/068242) describes cases where the resists aimed at ArF exposure suffer changes in resist performance by immersion in water before and after the exposure, and indicates that such a phenomenon is a problem in immersion lithography.

In addition, there is apprehension that, when an immersion exposure process is carried out using a scanning immersion photolithography machine, reduction in exposure speed occurs unless an immersion liquid moves on with movements of a lens, and has an adverse effect on productivity. When the immersion liquid is water, it is expect that hydrophobic resist film is better in following capability of water. However, the hydrophobicity imparted to resist film brings about unfavorable situations, such as an increase in amount of resist residues (referred to as "scum" too) developed, and degrades image quality of resist. Therefore, it is desirable to remedy the matters mentioned above.

At present, an aqueous alkali developer containing 2.38 mass % of TMAH (tetramethylammonium hydroxide) has broad use as developers for g-ray, i-ray, KrF, ArF, EB and EUV lithographic processes.

As a developer other than the aqueous alkali developer, the developer used for performing development by dissolving exposed areas of a resist material reduced in molecular weight through cleavage of its polymer chains by exposure to radiation, and that characterized by having at least two functional groups of more than one kind chosen from an acetic acid group, a ketone group, an ether group or a phenyl group and a molecular weight of 150 or above, is disclosed, e.g., in Patent Document 5 (JP-A-2006-227174). In addition, the developers used for performing development by dissolving exposed areas of specified resist materials containing fluorine atoms and chosen from supercritical fluids, halogenated organic solvents or non-halogenated organic solvents are disclosed in Patent Document 6 (JP-T-2002-525683, the term "JP-T" as used herein means a published Japanese translation of a PCT patent application) and Patent Document 7 (JP-T-2005-533907).

However, as semiconductor devices become finer, it becomes exceedingly difficult to find suitable combinations of resist composition, developer and so on for formation of totally high-quality patterns. No matter how difficult it may be, it has been required to find pattern formation methods applicable suitably to immersion lithography, which can ensure, e.g. reduction in scum appearing after development, satisfactory line edge roughness, high in-plane uniformity of line width, and good following capability of an immersion liquid.

SUMMARY OF THE INVENTION

The invention aims to solve the aforesaid problems and to provide a pattern formation method that allows reduction in scum appearing after development, and besides, that can ensure reduced line edge roughness, enhanced in-plane uniformity of line width and satisfactory following capability of an immersion liquid, thereby achieving consistent formation of high-accuracy fine patterns for fabrication of high-integration, high-precision electronic devices.

The following are aspects of the invention, and thereby the aforesaid aims of the invention are accomplished.

<1> A method of forming patterns, comprising:
(a) coating a substrate with a resist composition for negative development to form a resist film having a receding contact angle of 70 degrees or above with respect to water, wherein the resist composition for negative development contains a resin capable of increasing the polarity by the action of an acid and becomes more soluble in a positive developer and less soluble in a negative developer upon irradiation with an actinic ray or radiation,
(b) exposing the resist film via an immersion medium, and
(c) performing development with a negative developer.

<2> The method of forming patterns of <1>, wherein the resist composition for negative development comprises:
(A) said resin capable of increasing the polarity by the action of an acid, which becomes more soluble in a positive developer and less soluble in a negative developer upon irradiation with an actinic ray or radiation,
(B) a compound capable of generating an acid upon irradiation with an actinic ray or radiation,
(C) a solvent, and
(D) a resin having at least either a fluorine atom or a silicon atom.

<3> A method of forming patterns, comprising:
(a') coating a substrate with a resist composition for negative development to form a resist film, wherein the resist composition contains a resin capable of increasing the polarity by the action of an acid and becomes more soluble in a positive developer and less soluble in a negative developer upon irradiation with an actinic ray or radiation,
(b) exposing the resist film via an immersion medium, and
(c) performing development with a negative developer.

wherein
the resist composition for negative development comprises:
(A) said resin capable of increasing the polarity by the action of an acid, which becomes more soluble in a positive developer and less soluble in a negative developer upon irradiation with an actinic ray or radiation,
(B) a compound capable of generating an acid upon irradiation with an actinic ray or radiation,
(C) a solvent, and
(D) a resin having at least either a fluorine atom or a silicon atom.

<4> The method of forming patterns of <2> or <3>, wherein the resin (D) has a group represented by the following formula (F3a):

(F3a)

wherein
each of $R_{62a}$ and $R_{63a}$ independently represents an alkyl group at least one hydrogen atom of which is substituted with a fluorine atom, and $R_{62a}$ and $R_{63a}$ may combine with each other to form a ring, and $R_{64a}$ represents a hydrogen atom, a fluorine atom or an alkyl group.

<5> The method of forming patterns of any of <2> to <4>, wherein
the resin (D) has a group represented by any of the following formulae (CS-1) to (CS-3):

(CS-1)

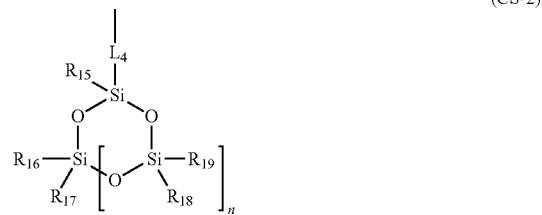

(CS-2)

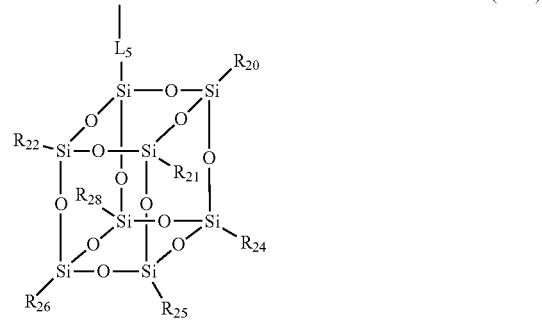

(CS-3)

wherein each of $R_{12}$ to $R_{26}$ independently represents a straight-chain alkyl group, a branched alkyl group, or a cycloalkyl group, each of $L_3$ to $L_5$ represents a single bond or a divalent linkage group, and n represents an integer of 1 to 5.

<6> The method of forming patterns of any of <1> to <5>, wherein the negative developer in the process (c) of performing development contains an organic solvent.

<7> The method of forming patterns of any of <1> to <6>, further comprising:

(d) performing development with a positive developer.

Furthermore, preferred embodiments of the invention are described below.

<8> The method of forming patterns of any of <1> to <7>, wherein the negative developer in the process (c) of performing development contains at least one kind of solvent selected from organic solvents having vapor pressures of 5 kPa or below at 20° C.

<9> The method of forming patterns of <8>, wherein the organic solvents having vapor pressures of 5 kPa or below at 20° C. are ketone solvents, ester solvents or ether solvents.

<10> The method of forming patterns of <8> or <9>, wherein the organic solvents having vapor pressures of 5 kPa or below at 20° C. are ester solvents.

<11> The method of forming patterns of any of (8) to (10), wherein the organic solvents having vapor pressures of 5 kPa or below at 20° C. are butyl acetate.

<12> The method of forming patterns of any of <1> to <11>, further comprising:

(e) performing cleaning with a rinse liquid containing an organic solvent subsequently to the process (c) of performing.

<13> The method of forming patterns of <12>, wherein the rinse liquid in the process (e) of performing cleaning contains at least one kind of organic solvent selected from hydrocarbon solvents, ketone solvents, ester solvents, alcohol solvents, amide solvents or ether solvents.

<14> The method of forming patterns of <12> or <13>, wherein the rinse liquid in the process (e) of performing cleaning contains at least one kind of organic solvent selected from ester solvents or alcohol solvents.

<15> The method of forming patterns of any of <12> to <14>, wherein the rinse liquid in the process (e) of performing cleaning contains a monohydric alcohol.

<16> The method of forming patterns of any of <12> to <15>, wherein the rinse liquid in the process (e) of performing cleaning contains at least one ingredient of the negative developer in the process (c) of performing development.

<17> The method of forming patterns of any of <1> to <16>, wherein the process (c) of performing development comprises a process of feeding the negative developer onto a surface of the substrate while spinning the substrate.

<18> The method of forming patterns of any of <12> to <17>, wherein the process (e) of performing cleaning comprises a process of feeding the rinse liquid onto a surface of the substrate while spinning the substrate.

<19> The method of forming patterns of <7>, wherein the positive developer in the process (d) of performing development contains an aqueous solution of at least one kind of amine compound selected from primary amine compounds, secondary amine compounds tertiary amine compounds or quaternary amine compounds.

<20> The method of forming patterns of <19>, wherein the positive developer in the process (d) of performing development contains an aqueous solution of tetramethylammonium hydroxide.

<21> The method of forming patterns of <19> or <20>, wherein the positive developer contains the amine compound in a concentration ranging from 0.01 to 20 weight % based on a total weight of the positive developer.

<22> The method of forming patterns of any of <7>, <19> to <21>, further comprising:

(f) performing rinsing, after the process (d) of performing development with a positive developer.

<23> The method of forming patters of <22>, wherein a rinsed fluid in the process (f) of performing rinsing is purified water.

<24> The method of forming patterns of any of <1> to <23>, wherein the process of (b) exposing the resist film is performed with light having a wavelength of 200 nm or shorter.

<25> The method of forming patterns of any of <1> to <24>, wherein the immersion medium of the process of (b) exposing the resist film is water.

<26> The method of forming patterns of any of <1> to <25>, further comprising:

(g) performing heating, after the process (b) of exposing the resist film.

<27> The method of forming patterns of any of <2> to <26>, wherein the resin (D) of the resist composition is a resin stable to an acid and insoluble in an alkali developer.

<28> The method of forming patterns of <27>, wherein the resin (D) of the resist composition is a resin soluble in the negative developer.

<29> The method of forming patterns of any of <2> to <28>, wherein the resin (D) of the resist composition contains repeating units having a alkali-soluble group or a group capable of increasing the solubility to the developer by the action of an acid or an alkali in a total proportion of 20 mole % or below with respect to the total repeating units constituting the resin (D).

<30> The method of forming patterns of <2> to <29>, wherein the resin (D) is contained in an amount of 0.1 to 5 mass % based on the total solids in the resist composition.

<31> The method of forming patterns of any of <2> to <30>, wherein the resin (D) of the resist composition is a resin selected from the following resins (D-1) to (D-6):

(D-1) a resin that has (a) a repeating unit containing a fluoroalkyl group, (D-2) a resin that has (b) a repeating unit containing a trialkylsilyl group or a cyclic siloxane structure, (D-3) a resin that has (a) a repeating unit containing a fluoroalkyl group and (c) a repeating unit containing a branched alkyl group, a cycloalkyl group, a branched alkenyl group, a cycloalkenyl group or an aryl group, (D-4) a resin that has (b) a repeating unit containing a trialkylsilyl group or a cyclic siloxane structure and (c) a repeating unit containing a branched alkyl group, a cycloalkyl group, a branched alkenyl group, a cycloalkenyl group or an aryl group, (D-5) a resin that has (a) a repeating unit containing a fluoroalkyl group and (b) a repeating unit containing a trialkylsilyl group or a cyclic siloxane structure, and (D-6) a resin that has (a) a repeating unit containing a fluoroalkyl group, (b) a repeating unit containing a trialkylsilyl group or a cyclic siloxane structure and (c) a repeating unit containing a branched alkyl group, a cycloalkyl group, a branched alkenyl group, a cycloalkenyl group or an aryl group.

<33> The method of forming patterns of any of <2> to <31>, wherein
the resin (D) of the resist composition has a repeating unit represented by the following formula (Ia):

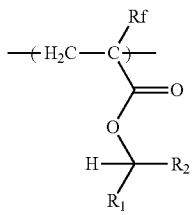

wherein
Rf represents a hydrogen atom, a fluorine atom or an alkyl group at least one hydrogen atom of which is substituted with a fluorine atom,
$R_1$ represents an alkyl group, and
$R_2$ represents a hydrogen atom or an alkyl group.

<33> The method of forming patterns of any of <2> to <32>, wherein the resin (D) of the resist composition has a repeating unit represented by the following formula (II) and a repeating unit represented by the following formula (III):

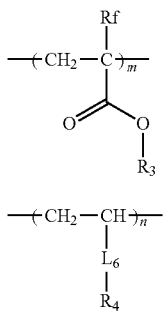

wherein Rf represents a hydrogen atom, a fluorine atom or an alkyl group at least one hydrogen atom of which is substituted with a fluorine atom,
$R_3$ represents an alkyl group, a cycloalkyl group, an alkenyl group or a cycloalkenyl group,
$R_4$ represents an alkyl group, a cycloalkyl group, an alkenyl group, a cycloalkenyl group, a trialkylsilyl group or a group having a cyclic siloxane structure,
$L_6$ represents a single bond or a linkage group,
m is a numeric value of from 0 to 100, and n is a numeric value of 0 to 100.

<34> The method of forming patterns of any of <2> to <33>, wherein
the resin (A) of the resist composition is a resin having an alicyclic hydrocarbon structure.

<35> The method of forming patterns of any of <2> to <34>, wherein
the resin (A) of the resist composition is a resin having, in its side chain, an alicyclic hydrocarbon-containing partial structure represented by any of the following formulae (pI) to (pV);

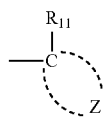

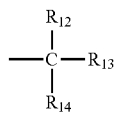

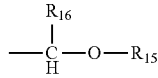

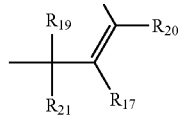

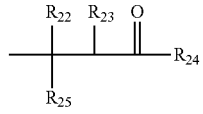

wherein
$R_{11}$ represents a methyl group, an ethyl group, an n-propyl group, an isopropyl group, an n-butyl group, an isobutyl group or a sec-butyl group,
Z represents atoms forming a cycloalkyl group together with the carbon atom,
each of $R_{12}$ to $R_{16}$ independently represent a 1-4C straight-chain or branched alkyl group, or a cycloalkyl group, provided that at least one of $R_{12}$ to $R_{14}$, or either $R_{15}$ or $R_{16}$ represents a cycloalkyl group,
each of $R_{17}$ to $R_{21}$ independently represents a hydrogen atom, a 1-4C straight-chain or branched alkyl group or a cycloalkyl group, provided that at least one of $R_{17}$ to $R_{21}$ represents a cycloalkyl group, and besides, either $R_{19}$ or $R_{21}$ represents a 1-4C straight-chain or branched alkyl group or a cycloalkyl group; and
each of $R_{22}$ to $R_{25}$ independently represent a hydrogen atom, a 1-4C straight-chain or branched alkyl group or a cycloalkyl group, provided that at least one of $R_{22}$ to $R_{25}$ represents a cycloalkyl group, and $R_{23}$ and $R_{24}$ may combine with each other to form a ring.

<36> The method of forming patterns of any of <2> to <35>, wherein
the resin (A) of the resist composition has its weight average molecular weight in a range of 1,000 to 200,000.

<37> The method of forming patterns of any of <34> to <36>, wherein the resin (A) of the resist composition is an alicyclic hydrocarbon-containing acid-decomposable resin having a lactone structure.

<38> The method of forming patterns of any of <1> to <37>, wherein
the resist composition further contains a basic compound.

<39> The method of forming patterns of any of <1> to <38>, wherein
the resist composition further contains at least one of a fluorine-containing surfactant and a silicon-containing surfactant.

<40> The method of forming patterns of any of <2> to <39>, wherein the solvent (C) is a mixture of two or more solvents including propylene glycol monomethyl ether acetate.

DETAILED DESCRIPTION OF THE INVENTION

Best modes for carrying out the invention are described below.

Incidentally, the term "group (atomic group)" used in this specification is intended to include both unsubstituted and substituted ones when neither a word of substituted nor a word of unsubstituted is added thereto. For instance, the term "an alkyl group" is intended to include not only an alkyl group having no substituent (an unsubstituted alkyl group) but also an alkyl group having a substituent or substituents (a substituted alkyl group).

Figure 1:
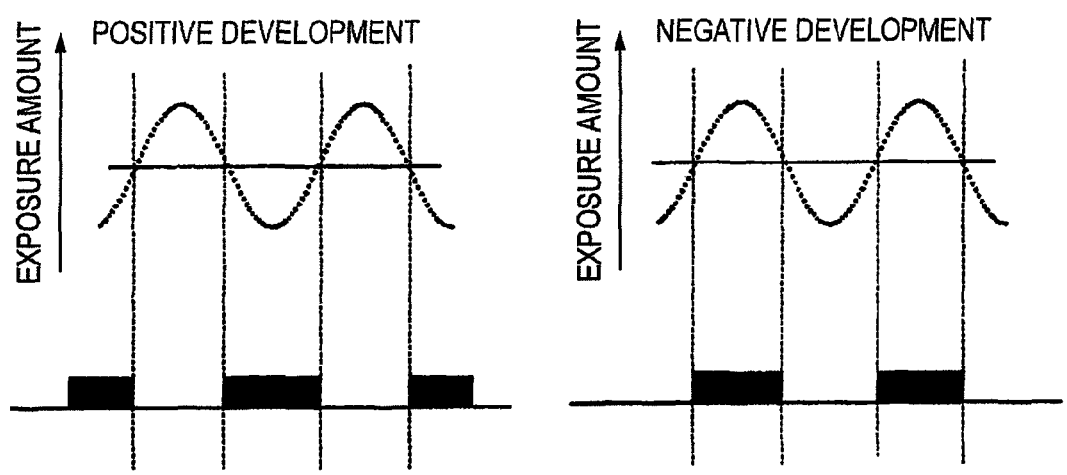
FIG. 1 is schematic diagrams showing relations of exposure amounts to positive development and negative development, respectively, according to methods currently in use.

To begin with, explanations for terms used in this specification are given. There are two modes of pattern formation, a positive mode and a negative mode, and both modes utilize a change caused in developer solubility of resist film by chemical reaction for which exposure to light acts as a trigger, and more specifically, a case where exposed portions dissolve in a developer is referred to as the positive mode, and a case where non-exposed portions dissolve in a developer is referred to as the negative mode. As to developers used therein, there are two types of developers, a positive developer and a negative developer. The term "positive developer" is defined as a developer allowing selective dissolution and removal of portions given exposure amounts (which are shown by a dotted line in FIG. 1) above a certain threshold value as shown by a solid line in FIG. 1, while the term "negative developer" is defined as a developer allowing selective dissolution and removal of portions given exposure amounts below the aforementioned certain threshold value. The development process using a positive developer is referred to as positive development (or a positive development process too), and the development process using a negative developer is referred to as negative development (or a negative development process too). The term multiple development (or a multiple development process) refers to the development mode utilizing a combination of the development process using a positive developer and the development process using a negative developer. In the invention, a resist composition used in negative development is referred to as a resist composition for negative development, and a resist composition used in multiple development is referred to as a resist composition for multiple development. The simple wording "a resist composition" as used hereinafter indicates a resist composition for negative development. The term "a rinse liquid for negative development" means a rinse liquid which contains an organic solvent and is used in a cleaning process after a negative development process.

Figure 2:
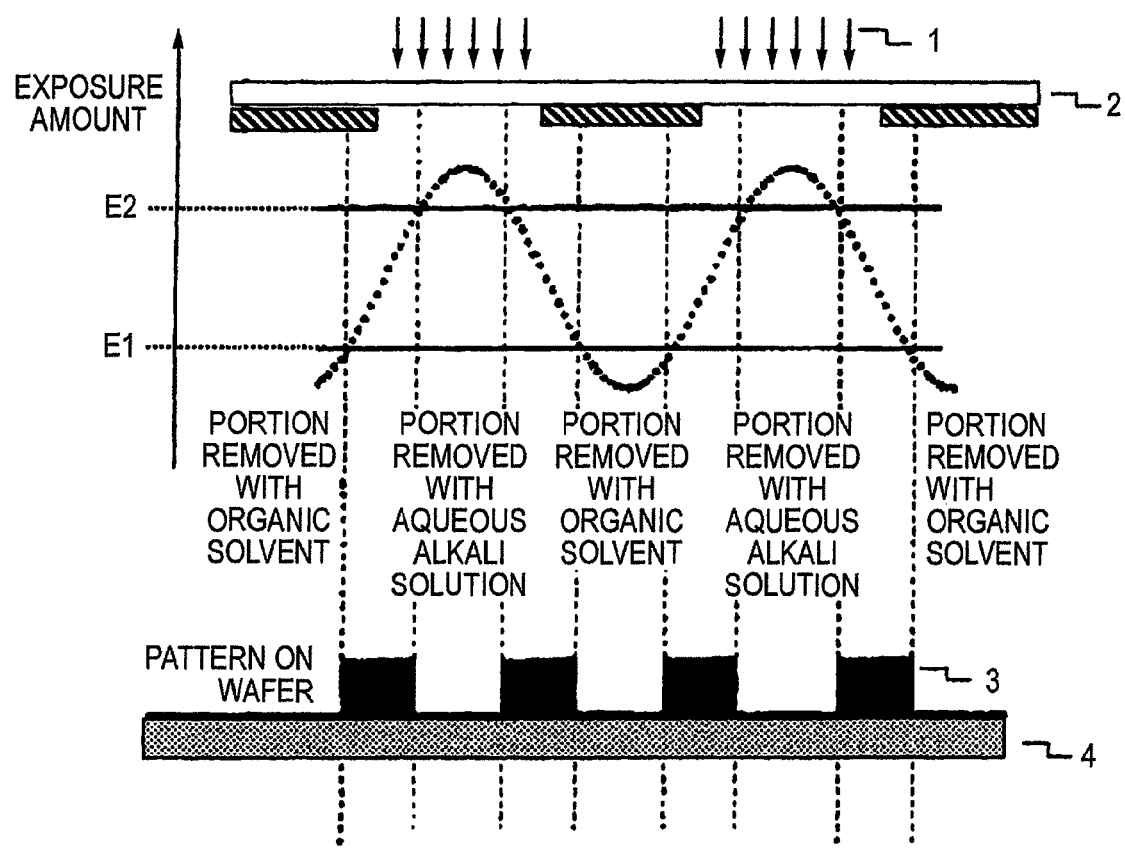
FIG. 2 is a schematic diagram illustrating a pattern formation method in which a combination of positive development and negative development is used.

As an art suitable for immersion lithography-utilized pattern formation, the invention provides a new pattern formation method including a combination of (a) coating a substrate with a resist composition for negative development to form a resist film having a receding contact angle of 70 degrees or above with respect to water, wherein the resist composition for negative development contains a resin capable of increasing the polarity by the action of an acid and becomes more soluble in a positive developer and less soluble in a negative developer upon irradiation with an actinic ray or radiation, (b) exposing the resist film via an immersion medium and (c) performing development with a negative developer which, as shown in FIG. 2, allows selective dissolution and removal of portions exposed in exposure amounts of no higher than a specified threshold value (b), or a new pattern formation method including a combination of (a') coating a substrate with a resist composition for negative development to form a resist film, wherein the resist composition contains a resin capable of increasing the polarity by the action of an acid and becomes more soluble in a positive developer and less soluble in a negative developer upon irradiation with an actinic ray or radiation, (b) exposing the resist film via an immersion medium and (c) performing development with a negative developer, with the resist composition for negative development containing (A) a resin capable of increasing the polarity by the action of an acid and becoming more soluble in a positive developer and less soluble in a negative developer upon irradiation with an actinic ray or radiation, (B) a compound capable of generating an acid upon irradiation with an actinic ray or radiation, (C) a solvent and (D) a resin having at least either a fluorine atom or a silicon atom.

For carrying out the invention, (i) a resist composition for negative development which contains a resin capable of increasing the polarity by the action of an acid and becomes more soluble in a positive developer and less soluble in a negative developer upon irradiation with an actinic ray or radiation and (ii) a negative developer (preferably an organic developer) are required. The resist composition for negative development (i) is required to be a resist composition that forms a resist film having a receding contact angle of 70 degrees or above with respect to water, or a resist composition that contains (A) a resin capable of increasing the polarity by the action of an acid and becoming more soluble in a positive developer and less soluble in a negative developer upon irradiation with an actinic ray or radiation, (B) a compound capable of generating an acid upon irradiation with an actinic ray or radiation, (C) a solvent and (D) a resin having at least either a fluorine atom or a silicon atom.

For performing the invention, it is favorable that (iii) a positive developer (preferably an alkali developer) is further used.

For performing the invention, it is also favorable that (iv) an organic solvent-containing rinse liquid for negative development is further used.

The resist composition for negative development as used in the invention is a resin composition containing a resin capable of increasing its polarity by the action of an acid and forming a film which becomes more soluble in a positive developer and less soluble in a negative developer upon irradiation with an actinic ray or radiation. Therefore, the present resist composition for negative development can be used suitably for pattern formation through multiple development utilizing a combination of a developer (a positive developer) allowing selective dissolution and removal of portions given exposure amounts above a specified threshold value (a), a developer (a negative developer) allowing selective dissolution and removal of portions given exposure amounts below a differently specified threshold value (b) and a resist composition for negative development.

Figure 3:
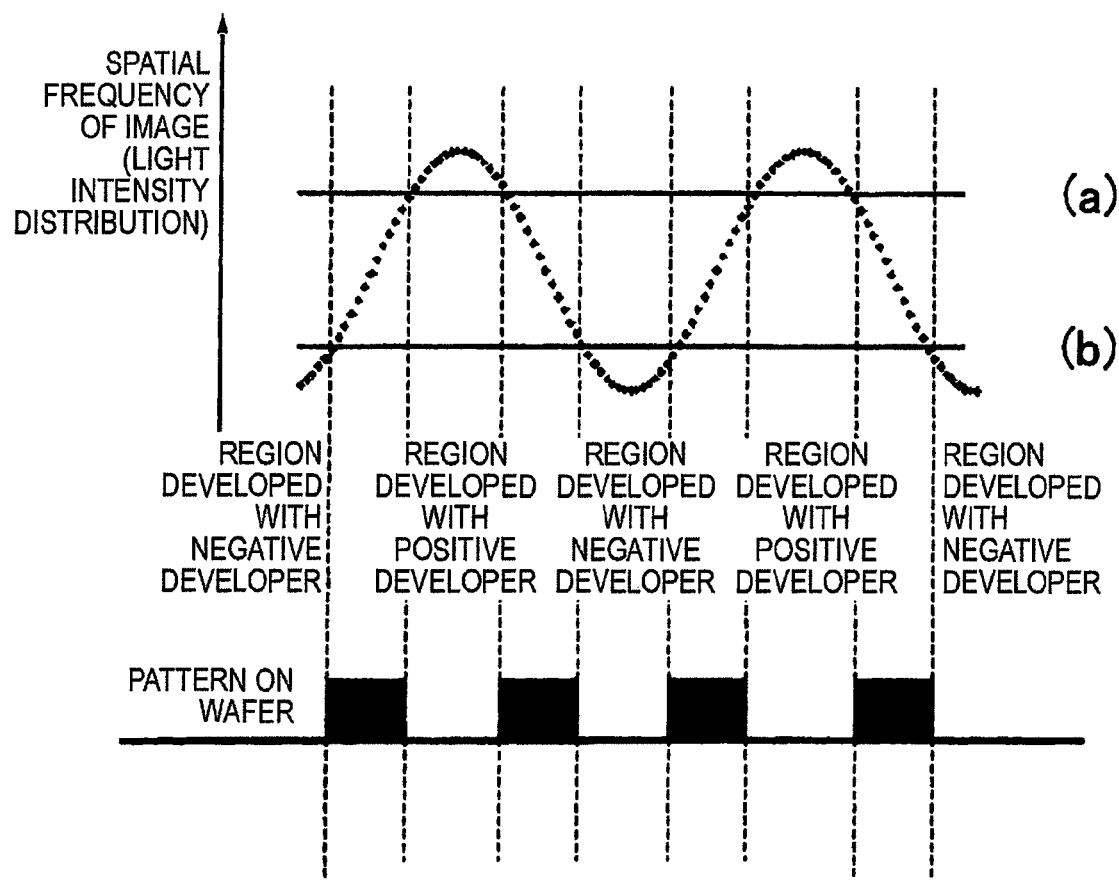
FIG. 3 is a schematic diagram showing a relation of exposure amounts to the positive development and negative development.

More specifically, when pattern elements on an exposure mask are projected onto a wafer coated with a resist film by light irradiation, as shown in FIG. 3, a pattern with resolution equivalent to double the spatial frequency of the optical image (light intensity distribution) can be formed through selective dissolution and removal of regions exposed to light of high intensities (resist portions given exposure amounts above the specified threshold value (a)) by use of a positive developer and selective dissolution and removal of regions exposed to light of low intensities (resist portions given exposure amounts below the specified threshold value (b)) by use of a negative developer.

When the pattern formation process using two types of developers, a positive developer and a negative developer, is carried out, the sequence of these developments has no particular restriction, and more specifically, it is appropriate that development be carried out using either a positive developer or a negative developer after exposure is performed, and then negative or positive development be carried out using a developer different from the developer used in the first development. And it is preferable that, after the negative development, cleaning with an organic solvent-containing rinse liquid for negative development is carried out. By the cleaning with a rinse liquid containing an organic solvent after negative development, more satisfactory pattern formation becomes possible.

The pattern formation method for carrying out the invention is described below in more detail.

<Method of Pattern Formation>

The present method of pattern formation preferably includes the following processes, but not limited to these processes.

The processes included in the present method of pattern formation can be:

(a) coating a substrate with a resist composition for negative development to form a resist film having a receding contact angle of 70 degrees or above with respect to water, wherein the resist composition for negative development contains a resin capable of increasing the polarity by the action of an acid and becomes more soluble in a positive developer and less soluble in a negative developer upon irradiation with an actinic ray or radiation, (b) exposing the resist film via an immersion medium, and (c) performing development with a negative developer.

Alternatively, the processes included in the present method of pattern formation can be:

(a') coating a substrate with a resist composition for negative development to form a resist film, wherein the resist composition contains a resin capable of increasing the polarity by the action of an acid and becomes more soluble in a positive developer and less soluble in a negative developer upon irradiation with an actinic ray or radiation, (b) exposing the resist film via an immersion medium, and (c) performing development with a negative developer.

wherein the resist composition for negative development contains:

(A) a resin capable of increasing the polarity by the action of an acid and becoming more soluble in a positive developer and less soluble in a negative developer upon irradiation with an actinic ray or radiation, (B) a compound capable of generating an acid upon irradiation with an actinic ray or radiation, (C) a solvent, and (D) a resin having at least either a fluorine atom or a silicon atom It is preferable that the present method of pattern formation further includes (d) performing development with a positive developer to form resist patterns. By including this process, the pattern with resolution equivalent to double the spatial frequency of an optical image (light intensity distribution) can be formed.

The process (a) of coating a substrate with a resist composition for negative development to form a resist film having a receding contact angle of 70 degrees or above with respect to water, wherein the resist composition for negative development contains a resin capable of increasing the polarity by the action of an acid and becomes more soluble in a positive developer and less soluble in a negative developer upon irradiation with an actinic ray or radiation, or the process (a') of coating a substrate with a resist composition for negative development to form a resist film, wherein the resist composition contains a resin capable of increasing the polarity by the action of an acid and becomes more soluble in a positive developer and less soluble in a negative developer upon irradiation with an actinic ray or radiation may be performed using any method as long as it allows coating a substrate with the resist composition. Examples of such a method include coating methods hitherto known, such as a spin coating method, a spraying method, a roller coating method and a dip coating method. For applying a coating of resist composition, a spin coating method is preferable to the others. After applying a coating of resist composition, the substrate is heated (pre-baked) as required. By this heating, it becomes possible to evenly form the coating from which undesired residual solvents are eliminated. The pre-bake temperature has no particular limitations, but it is preferably from 50° C. to 160° C., far preferably from 60° C. to 140° C.

The substrate on which resist film is formed has no particular restrictions in the invention, and it is possible to use any of inorganic substrates made from silicon, SiN, $SiO_2$ and the like, coating-type inorganic substrates including SOG, and substrates generally used in lithographic processes for production of semiconductors, such as ICs, and circuit boards of liquid crystal displays, thermal heads and the like, and photo fabrication of other devices.

Before the resist film is formed, the substrate may be coated with an antireflective film in advance.

As the antireflective film, any of inorganic ones formed from titanium, titanium oxide, titanium nitride, chromium oxide, carbon and amorphous silicon, respectively, and organic ones formed from, e.g., a combination of a light absorbent and a polymeric material can be used. In addition, commercially available organic antireflective films including DUV-30 series and DUV-40 series manufactured by Brewer Science Inc., AR-2, AR-3 and AR-5 manufactured by Shipley Company, and ARC series, such as ARC29A, manufactured by Nissan Chemical Industries, Ltd. can also be used.

The film formed on a substrate through application of a resist composition for negative development in the invention has a high receding contact angle with respect to an immersion liquid.

The term "receding contact angle" as used herein refers to the contact angle measured when the contact line at a liquid droplet-substrate interface recedes, and this contact angle is generally known to be useful for simulation of the mobility of a liquid droplet in a dynamic state. And the receding contact angle is defined simply as a contact angle measured under a condition that the liquid droplet interface is receding by causing a liquid droplet discharged from a needle tip to draw back into the needle after the liquid droplet has deposited on the substrate surface, and can be determined by use of a contact angle measurement method generally referred to as the extension-contraction method.

In the immersion exposure process, it is required for an immersion liquid to move over a wafer so as to follow movements of an exposure head in a state of scanning the wafer at a high speed and forming exposure patterns. Therefore, the contact angle of an immersion liquid in a dynamic state with respect to a resist film becomes important, and it is required for the resist film to have properties of avoiding liquid droplets from remaining on the surface and allowing the immersion liquid to follow high-speed scanning of an exposure head.

To be more specific, it is preferable in the invention that the film formed on a substrate through application of a resist composition for negative development has a receding contact angle of 70 degrees or above with respect to water. By enhancing the receding contact angle, it becomes possible to follow lens movements in immersion exposure and to form patterns of satisfactory LWR in a high throughput. In addition, it also becomes possible to ensure an even contact of a negative developer with a wafer during development, thereby allowing prevention of scum formation by poor development.

The receding contact angle of the resist film with respect to water is preferably from 70 degrees to 100 degrees, far preferably from 70 degrees to 90 degrees, especially preferably from 75 degrees to 90 degrees.

In order to form a resist film having a high receding contact angle with respect to an immersion liquid, "resist compositions for negative development" as described below can be used. Of such compositions, Resin (D)-containing resist compositions for negative development" are used to advantage.

When a resist composition for negative development is free of Resin (D), it is preferable that Resin (A) in the resist composition is highly hydrophobic enough to form a film having a high receding contact angle with respect to an immersion liquid. More specifically, it is preferable to use resins free of alkali-soluble groups (such as carboxylic acid groups or sulfonic acid groups) other than fluorinated alcohol groups.

In the method of the invention, (i) a resist composition for negative development which contains a resin capable of increasing the polarity by the action of an acid and becomes more soluble in a positive developer and less soluble in a negative developer and (ii) a negative developer (preferably an organic developer) are required. Of resist compositions of such a kind, compositions usable for exposure to light of wavelengths of 250 nm or shorter are preferred, and those usable for exposure to light of wavelengths of 200 nm or shorter are far preferred. Examples of such compositions include those containing combinations of the ingredients described hereafter in the section <Resist Composition for Negative Development>.

In the process (b) exposing the resist film via an immersion medium, the exposure of a resist film to light can be carried out according to any of generally well-known methods. The resist film is preferably exposed via an immersion liquid to an actinic ray or radiation having passed through a given mask. The exposure amount, though can be chosen as appropriate, is generally adjusted to a range of 1 to 100 mJ/cm$^2$.

The present method poses no particular limitations to wavelengths of a light source used in exposure apparatus, but light with wavelengths of 250 nm or shorter, especially 200 nm or shorter, is used to advantage. Examples of a light source suitable for use in the invention include a KrF excimer laser (248 nm), an ArF laser (193 nm), a F$_2$ excimer laser (157 nm), an EUV source (13.5 nm) and electron-beam sources. Of these light sources, an ArF excimer laser (193 nm) is used to greater advantage.

At the occasion of performing the immersion exposure process, a process of cleaning the film surface with an aqueous chemical may be carried out (1) after formation of the film on a substrate, and that before the exposure process, and/or (2) after the process of exposing the film to light via an immersion liquid, and that before a process of heating the film.

The immersion liquid (immersion medium) used therein is preferably a liquid which is transparent to exposure light, and the refractive index of which has the smallest possible temperature coefficient in order to minimize deformation of optical images projected onto the film. When an ArF excimer laser (wavelength: 193 nm) in particular is used as a light source, the use of water as the immersion liquid is preferred in point of easiness of acquisition and handling in addition to the above viewpoints.

When water is used, an additive (liquid) for reducing the surface tension of water and increasing the surface activity of water may be added in a slight proportion. This additive is preferably a liquid in which the resist layer on a wafer does not dissolve, and besides, which has negligible influence on an optical coat applied to the bottom of lens elements. And the water used is preferably distilled water. Alternatively, purified water obtained by further filtering distilled water through an ion exchange filter may be used. By use of purified water, the optical image projected onto the resist can be prevented from suffering deformation by impurities mixed in water.

Alternatively, a medium having a refractive index of 1.5 or above can also be used from the viewpoint of a further increase in refractive index. This medium may be an aqueous solution or an organic solvent.

Between a resist film and an immersion liquid, film having poor solubility in the immersion liquid (hereinafter referred to as "topcoat", too) may be provided in order not to bring the resist film into direct contact with the immersion liquid. Features required of the topcoat are application suitability to the upper resist layer, transparency to radiation, notably 193-nm radiation, and poor solubility in an immersion liquid. In other words, it is preferable that the topcoat does not mingle with resist, nevertheless, it can be applied as a uniform coating to the upper resist layer.

In point of transparency to 193-nm radiation, the topcoat is preferably formed from a polymer free of aromatic groups, and examples of such a polymer include hydrocarbon polymers, acrylate polymers, polymethacrylic acid, polyacrylic acid, polyvinyl ether, silicon-containing polymers and fluorine-containing polymers.

The topcoat may be stripped off by using a developer, or a stripping agent separately. As the stripping agent, a solvent low in permeability into the resist is suitable. In point of possibility of performing the stripping-off process simultaneously with the resist development process, it is advantageous for the topcoat to be stripped off with an alkali developer. From the viewpoint of stripping-off with an alkali developer, the topcoat is preferably acidic, while the topcoat may be neutral or alkaline in point of no intermixing with resist.

In the present method of pattern formation, an exposure process may be carried out two or more times. Although each exposure process is carried out using far ultraviolet light, extreme ultraviolet light or an electron beam, a different light source may be used each time, or the same light source may be used every time. However, it is preferred that an ArF excimer laser (wavelength: 193 nm) be used in the first exposure process. And the process of performing exposure via an immersion medium can also be repeated two or more times.

After the exposure process, (g) a heating process (referred to as bake, or PEB (post exposure bake) too) is preferably carried out, followed by development and subsequent rinse processes. Through these processes, good-quality patterns can be formed. The PEB temperature has no particular limitations so long as good-quality resist patterns are obtained, but it is generally within the range of 40° C. to 160° C. The heating process may be carried out two or more times.

In the invention, (c) development is carried out using a negative developer, and thereby a resist pattern is formed.

When the negative development is carried out, an organic developer containing an organic solvent is preferably used.

The organic developer usable in carrying out negative development is a polar solvent, such as a ketone solvent, an ester solvent, an alcohol solvent, an amide solvent or an ether solvent, or a hydrocarbon solvent. Examples of a ketone solvent usable therein include 1-octanone, 2-octanone, 1-nonanone, 2-nonanone, acetone, 4-heptanone, methyl amyl ketone (IUPAC name: 2-heptanone), 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonyl alcohol, acetyl carbinol, acetophenone, methyl naphthyl ketone, isophorone and propylene carbonate; and examples of an ester solvent usable therein include methyl acetate, butyl acetate, ethyl acetate, isopropyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate and propyl lactate.

Examples of an alcohol solvent usable therein include alcohol compounds, such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol and n-decanol; glycol solvents, such as ethylene glycol, diethylene glycol and triethylene glycol; and glycol ether solvents, such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethyl butanol.

Examples of an ether solvent usable therein include dioxane and tetrahydrofuran in addition to the glycol ether solvents as recited above.

Examples of an amide solvent usable therein include N-methyl-2-pyrrolidone, N,N-dimethylacetamide, N,N-dimethylformamide, hexamethylphosphoric triamide and 1,3-dimethyl-2-imidazolidinone.

Examples of a hydrocarbon solvent usable therein include aromatic hydrocarbon solvents, such as toluene and xylene, and aliphatic hydrocarbon solvents, such as pentane, hexane, octane and decane.

The solvents as recited above may be used as mixtures of two or more thereof, or as mixtures with other solvents or water.

The vapor pressure of a negative developer at 20° C. is preferably 5 kPa or below, far preferably 3 kPa or below, particularly preferably 2 kPa or below. By adjusting the vapor pressure of a negative developer to 5 kPa or below, evaporation of the developer on the substrate or inside a development cup can be controlled, and thereby in-plane temperature uniformity of a wafer is improved to result in improvement of in-plane dimensional uniformity of a wafer.

Examples of an organic solvent usable for a negative developer having a vapor pressure of 5 kPa or below at 20° C. include ketone solvents, such as 1-octanone, 2-octanone, 1-nonanone, 2-nonanone, 4-heptanone, methyl amyl ketone (IUPAC name: 2-heptanone), 2-hexanone, diisobutyl ketone, cyclohexanone, methylcyclohexanone, phenylacetone and methyl isobutyl ketone; ester solvents, such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, butyl formate, propyl formate, ethyl lactate, butyl lactate and propyl lactate; alcohol solvents, such as n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol and n-decanol; glycol solvents, such as ethylene glycol, diethylene glycol and triethylene glycol; and glycol ether solvents, such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethyl butanol; ether solvents, such as tetrahydrofuran; amide solvents, such as N-methyl-2-pyrrolidone, N,N-dimethylacetamide and N,N-dimethylformamide; aromatic hydrocarbon solvents, such as toluene and xylene; and aliphatic hydrocarbon solvents, such as octane and decane.

Examples of an organic solvent having a vapor pressure of 2 kPa or below at 20° C. include ketone solvents, such as 1-octanone, 2-octanone, 1-nonanone, 2-nonanone, 4-heptanone, methyl amyl ketone (IUPAC name: 2-heptanone), 2-hexanone, diisobutyl ketone, cyclohexanone, methylcyclohexanone and phenylacetone; ester solvents, such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, ethyl lactate, butyl lactate and propyl lactate; alcohol solvents, such as n-butyl alcohol, sec-butyl alcohol, tert-butyl alcohol, isobutyl alcohol, n-hexyl alcohol, n-heptyl alcohol, n-octyl alcohol and n-decanol; glycol solvents, such as ethylene glycol, diethylene glycol and triethylene glycol; and glycol ether solvents, such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethyl butanol; amide solvents, such as N-methyl-2-pyrrolidone, N,N-dimethylacetamide and N,N-dimethylformamide; aromatic hydrocarbon solvents, such as xylene; and aliphatic hydrocarbon solvents, such as octane and decane.

Of the negative developers as recited above, the negative developers containing organic solvents selected from ketone solvents, ester solvents or ether solvents are used to good advantage, the negative developers containing organic solvents selected from ester solvents are used to better advantage, and the negative developers containing butyl acetate are used to best advantage.

To a developer which can be used when negative development is carried out, a surfactant can be added in an appropriate amount, if needed.

The developer has no particular restriction as to the surfactant added thereto, so addition of, e.g., an ionic or nonionic surfactant containing at least one fluorine atom and/or at least one silicon atom may be made. Examples of such an ionic or nonionic surfactant include the surfactants disclosed in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, and U.S. Pat. Nos. 5,405,720, 5,360,692, 5,529,881, 5,296,330, 5,436,098, 5,576,143, 5,294,511 and 5,824,451. Of these surfactants, nonionic surfactants are preferable to the others. Though no particular restrictions are imposed on such nonionic surfactants, it is far preferable to use a surfactant containing at least one fluorine atom or a surfactant containing at least one silicon atom.

The amount of a surfactant used is generally from 0.001 to 5 mass %, preferably from 0.005 to 2 mass %, far preferably from 0.01 to 0.5 mass %, of the total amount of the developer to which the surfactant is added.

Examples of a development method applicable herein include a method of dipping a substrate for a predetermined period of time into a tank filled with a developer (dip method), a method of developing by mounding a developer on a substrate surface by surface tension and leaving the developer at rest for a fixed period of time (puddle method), a method of spraying a developer on a substrate surface (spray method) and a method of keeping on dispensing a developer onto a substrate spinning at a constant speed while scanning the substrate at a constant speed with a developer dispense nozzle (dynamic dispense method).

The process of performing development is preferably a process of feeding a negative developer onto the surface of a substrate while spinning the substrate.

After the process of negative development, a process of stopping the development while replacing the negative developer with another solvent may be carried out.

After the completion of the negative development, the present method preferably includes a cleaning process using an organic solvent-containing rinse liquid for negative development.

The rinse liquid used in the rinse process after negative development has no particular restrictions so long as it does not dissolve resist patterns, and solutions containing general organic solvents can be used. More specifically, the solution suitably used as the rinse liquid is a solution containing at least one kind of organic solvent chosen from hydrocarbon solvents, ketone solvents, ester solvents, alcohol solvents, amide solvents or ether solvents. And it is preferable that, after negative development, the cleaning process is carried out using a rinse liquid containing at least one kind of solvent chosen from ketone solvents, ester solvents, alcohol solvents or amide solvents. It is preferable by far that, after negative development, the cleaning process is carried out using a rinse liquid containing an alcohol solvent or an ester solvent, and it is especially preferable that, after negative development, the cleaning process is carried out using a rinse liquid containing monohydric alcohol. Herein, the monohydric alcohol used in the rinse process after the negative development may have any of straight-chain, branched or cyclic forms, with examples including 1-butanol, 2-butanol, 3-methyl-1-butanol, tert-butyl alcohol, 1-pentanol, 2-pentanol, 1-hexanol, 1-heptanol, 1-octanol, 2-hexanol, 2-heptanol, 2-octanol, 3-hexanol, 3-heptanol, 3-octanol and 4-octanol. Of these alcohol solvents, 1-hexanol, 2-hexanol, 1-heptanol and 3-methyl-1-butanol are preferred over the others.

Two or more of the ingredients recited above may be mixed together, or each ingredient may be used as a mixture with an organic solvent other than the above-recited ones.

The process of cleaning with a rinse liquid containing an organic solvent can also be carried out two or more times by using two or more different rinse liquids, respectively.

The rinse liquid used in the process (e) of cleaning with a rinse liquid containing an organic solvent preferably contains at least one of the developer incredients used in the process (c) of performing development with a negative developer.

The water content in the rinse liquid is preferably 10 mass % or below, far preferably 5 mass % or below, particularly preferably 3 mass % or below. By controlling the water content to 10 mass % or below, satisfactory developing properties can be attained.

The vapor pressure of the rinse liquid used after negative development, as measured at 20° C., is preferably from 0.05 kPa to 5 kPa, far preferably from 0.1 kPa to 5 kPa, especially preferably from 0.12 kPa to 3 kPa. By adjusting the vapor pressure of the rinse liquid to the range of 0.05 kPa to 5 kPa, in-plane temperature uniformity of a wafer is enhanced, and besides, wafer swelling caused by penetration of the rinse liquid can be controlled; as a result, in-plane dimensional uniformity of a wafer can be improved.

It is also possible to use the rinse liquid to which a surfactant is added in an appropriate amount.

In the rinse process, the wafer having undergone the negative development is subjected to cleaning treatment with the organic solvent-containing rinse liquid. There is no particular restriction on the method for the cleaning treatment. For example, a method of keeping on coating a substrate spinning at a constant speed with a rinse liquid (spin coating method), a method of dipping a substrate in a tank filled with a rinse liquid (dip method) and a method of spraying a rinse liquid onto the substrate surface (spray method) can be applied thereto.

The process of cleaning with a rinse liquid containing an organic solvent is preferably a process of feeding the rinse liquid onto the surface of a substrate while spinning the substrate.

It is particularly preferred that the cleaning process be performed by a spin coating method and then the rinse liquid be eliminated from the substrate by spinning the substrate at revs ranging from 2,000 rpm to 4,000 rpm.

In the present method of forming resist patterns, it is preferred that (d) a process of performing development with a positive developer be further included.

As the positive developer, an alkali developer can be suitably used. The developer preferred as the alkali developer is a developer containing an aqueous solution of at least one amine compound selected from primary amine compounds, secondary amine compounds, tertiary amine compounds or quaternary amine compounds. Examples of usable alkali developers include alkaline aqueous solutions of inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcoholamines such as dimethylethanolamine and triethanolamine, quaternary ammonium salts such as tetramethylammonium hydroxide and tetraethylammonium hydroxide, and cyclic amines such as pyrrole and piperidine. Of these alkaline aqueous solutions, an aqueous solution of tetraethylammonium hydroxide is preferred over the others.

The alkali developers as recited above may also be used after alcohol compounds and surfactants are further added thereto in appropriate amounts.

The alkali concentration of an alkali developer (the amine compound concentration in a developer, relative to the total mass of the developer) is generally from 0.01 to 20 mass %.

The pH of an alkali developer is generally from 10.0 to 15.0.

The time to perform development with an alkali developer is generally from 10 to 300 seconds.

The alkali concentration (and pH) of an alkali developer and the development time can be adjusted as appropriate in response to patterns to be formed.

After the process (d) of performing development with a positive developer, it is preferred that (f) a rinse process be further included.

It is far preferred that the rinse liquid used in the rinse process (f) be purified water.

It is also possible to use a rinse liquid to which an appropriate amount of surfactant is added.

Further, it is possible to carry out treatment with a supercritical fluid after development processing or rinse processing for the purpose of eliminating the developer or the rinse liquid adhering to patterns.

Furthermore, it is possible to carry out heat treatment after the treatment with a supercritical fluid for the purpose of eliminating water remaining in patterns.

Resist compositions for negative development, which are usable in the invention, are described below.

<Resist Composition for Negative Development>

(A) Resin that can Increase Polarity by Action of Acid

The resin usable in a resist composition according to the invention and capable of increasing the polarity by the action of an acid is a resin having groups capable of decomposing by the action of an acid to produce alkali-soluble groups (hereinafter referred to as "acid-decomposable groups") in either its main chain, or side chains, or both (hereinafter referred to as "an acid-decomposable resin", "an acid-decomposable Resin (A)" or "a Resin (A)"), and preferably a resin having mononuclear or polynuclear alicyclic hydrocarbon structures and capable of increasing its polarity, increasing its solubility in an alkali developer and decreasing its solubility in an organic solvent by the action of an acid (hereinafter referred to as "an alicyclic hydrocarbon-containing acid-decomposable resin"). Reasons for those changes are not clear, but as a reason it is likely thought that the resin causes a great change in polarity by undergoing the irradiation with an actinic ray or radiation to result in enhancement of dissolution contrasts in both the case of development with a positive developer (preferably an alkali developer) and the case of development with a negative developer (preferably an organic solvent). Further, it is thought that, because of high hydrophobicity of the resin having mononuclear or polynuclear aliphatic hydrocarbon structures, the developability enhancement is caused in the case where resist film regions low in irradiation intensity are developed with a negative developer (preferably an organic solvent).

The present resist composition containing a resin capable of increasing its polarity by the action of an acid can be used suitably for the case of irradiation with ArF excimer laser.

The acid-decomposable resin includes a unit having an acid-decomposable group.

A group suitable as the group capable of decomposing by the action of an acid (the acid-decomposable group) is a group obtained by substituting a group capable of splitting off by the action of an acid for a hydrogen atom of an alkali-soluble group.

Examples of alkali-soluble groups include groups respectively having a phenolic hydroxyl group, a carboxylic acid group, a fluorinated alcohol group, a sulfonic acid group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group and a tris(alkylsulfonyl)methylene group.

Of these alkali-soluble groups, a carboxylic acid group, a fluorinated alcohol group (preferably a hexafluoroisopropanol group) and a sulfonic acid group are preferred over the others.

Examples of a group capable of splitting off by the action of an acid include groups of formula —$C(R_{36})(R_{37})(R_{38})$, groups of formula —$C(R_{36})(R_{37})(OR_{39})$, and groups of formula —$C(R_{01})(R_{02})(OR_{39})$.

In these formulae, $R_{36}$ to $R_{39}$ each represent an alkyl group, a cycloalkyl group, an aryl group, an aralkyl group or an alkenyl group independently. $R_{36}$ and $R_{37}$ may combine with each other to form a ring. $R_{01}$ and $R_{02}$ each represent a hydrogen atom, an alkyl group, a cycloalkyl group, an aryl group, an aralkyl group or an alkenyl group independently.

Examples of a group suitable as an acid decomposable group include cumyl ester groups, enol ester groups, acetal ester groups and tertiary alkyl ester groups. Of these groups, tertiary alkyl ester groups are preferred over the others.

The alicyclic hydrocarbon-containing acid-decomposable resin is preferably a resin having at least one kind of repeating units selected from repeating units having alicyclic hydrocarbon-containing partial structures represented by any of the following formulae (pI) to (pV) or repeating units represented by the following formula (II-AB).

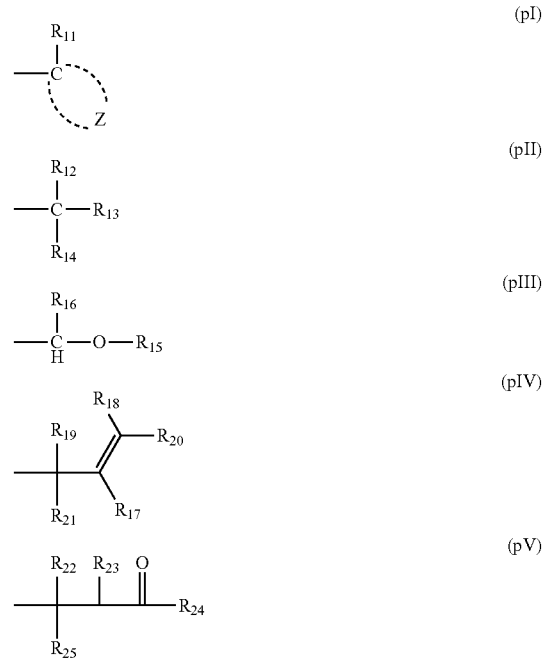

In the formulae (pI) to (pV), $R_{11}$ represents a methyl group, an ethyl group, an n-propyl group, an isopropyl group, an n-butyl group, an isobutyl group or a sec-butyl group, and Z represents atoms forming a cycloalkyl group together with the carbon atom.

$R_{12}$ to $R_{16}$ each represent a 1-4C straight-chain or branched alkyl group, or a cycloalkyl group independently, provided that at least one of $R_{12}$ to $R_{14}$, or either $R_{15}$ or $R_{16}$ represents a cycloalkyl group.

$R_{17}$ to $R_{21}$ each represent a hydrogen atom, a 1-4C straight-chain or branched alkyl group or a cycloalkyl group independently, provided that at least one of $R_{17}$ to $R_{21}$ represents a cycloalkyl group. In addition, either $R_{19}$ or $R_{21}$ is required to represent a 1-4C straight-chain or branched alkyl group or a cycloalkyl group.

$R_{22}$ to $R_{25}$ each represent a hydrogen atom, a 1-4C straight-chain or branched alkyl group or a cycloalkyl group independently, provided that at least one of $R_{22}$ to $R_{25}$ represents a cycloalkyl group. Alternatively, $R_{23}$ and $R_{24}$ may combine with each other to form a ring.

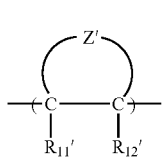
(II-AB)

In the formula (II-AB), $R_{11}'$ and $R_{12}'$ each represent a hydrogen atom, a cyano group, a halogen atom or an alkyl group independently.

Z' represents atoms forming an alicyclic structure together with the two bonded carbon atoms (C—C).

The formula (II-AB) is preferably the following formula (II-AB 1) or formula (II-AB2).

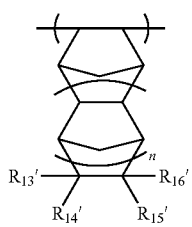
(II-AB1)

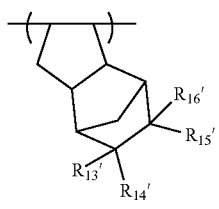
(II-AB2)

In the formulae (II-AB1) and (II-AB2), $R_{13}'$ to $R_{16}'$ each independently represent a hydrogen atom, a halogen atom, a cyano group, —COOH, —COOR$_5$, a group capable of decomposing by the action of an acid, —C(=O)—X-A'—R$_{17}'$, an alkyl group or a cycloalkyl group. At least two of $R_{13}'$ to $R_{16}'$ may combine with each other to form a ring.

Herein, $R_5$ represents an alkyl group, a cycloalkyl group or a group having a lactone structure.

X represents an oxygen atom, a sulfur atom, —NH—, —NHSO$_2$— or —NHSO$_2$NH—.

A' represents a single bond or a divalent linkage group.

$R_{17}'$ represents —COOH, —COOR$_5$, —CN, a hydroxyl group, an alkoxyl group, —CO—NH—R$_6$, —CO—NH—SO$_2$—R$_6$ or a group having a lactone structure.

$R_6$ represents an alkyl group or a cycloalkyl group.

n represents 0 or 1.

The alkyl group which $R_{12}$ to $R_{25}$ each can represent in the formulae (pI) to (pV) is preferably a 1-4C straight-chain or branched alkyl group.

The cycloalkyl group which $R_{11}$ to $R_{25}$ each can represent or the cycloalkyl group which can be formed of Z and the carbon atom may be monocyclic or polycyclic. Examples of such a cycloalkyl group include groups each containing at least 5 carbon atoms and having a monocyclo, bicyclo, tricyclo or tetracyclo structure. The number of carbon atoms in such a structure is preferably from 6 to 30, particularly preferably from 7 to 25. These cycloalkyl groups may have substituents.

Suitable examples of such a cycloalkyl group include an adamantyl group, a noradamantyl group, a decaline residue, a tricyclodecanyl group, a tetracyclododecanyl group, a norbornyl group, a cedrol group, a cyclopentyl group, a cyclohexyl group, a cycloheptyl group, a cyclooctyl group, a cyclodecanyl group and a cyclododecanyl group. Of these groups, an adamantyl group, a norbornyl group, a cyclohexyl group, a cyclopentyl group, a tetracyclodecanyl group and a tricyclodecanyl group are preferred over the others.

Each of those alkyl groups and cycloalkyl groups may further have a substituent. Examples of such a substituent include an alkyl group (1-4C), a halogen atom, a hydroxyl group, an alkoxyl group (1-4C), a carboxyl group and an alkoxycarbonyl group (2-6C). Herein, the alkyl, alkoxy and alkoxycarbonyl groups each may further have a substituent, such as a hydroxyl group, a halogen atom or an alkoxyl group.

In the resins, the structures represented by the formulae (pI) to (pV) can be used for protection of alkali-soluble groups. Examples of such alkali-soluble groups include various groups known in this technical field.

More specifically, such a protected alkali-soluble group has a structure formed by substituting the structure represented by any of the formulae (pI) to (pV) for the hydrogen atom of a carboxylic acid group, a sulfonic acid group, a phenol group or a thiol group. Of these structures, structures formed by substituting the structures represented by formulae (pI) to (pV) for the hydrogen atoms of carboxylic acid groups or sulfonic acid groups are preferable to the others.

As repeating units containing alkali-soluble groups protected by the structures of formulae (pI) to (pV), repeating units represented by the following formula (pA) are suitable.

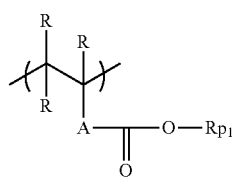
(pA)

In the formula (pA), each R represents a hydrogen atom, a halogen atom or a 1-4C straight-chain or branched alkyl group. Two or more Rs may be the same or different.

A represents a single bond, an alkylene group, an ether group, a thioether group, a carbonyl group, an ester group, an amido group, a sulfonamido group, a urethane group, a urea group, or a combination of two or more of the groups recited above, preferably a single bond.

$Rp_1$ represents any of the formulae (pI) to (pV).

The most suitable of repeating units represented by the formula (pA) is a repeating unit derived from 2-alkyl-2-adamantyl (meth)acrylate or dialkyl(1-adamantyl)methyl (meth)acrylate.

Examples of the repeating unit having an acid-decomposable group are illustrated below, but these examples should not be construed as limiting the scope of the invention.

(In the following formulae, Rx represents H, CH₃ or CH₂OH, and Rxa and Rxb each represent a 1-4C alkyl group.)
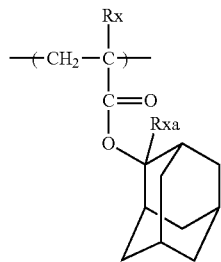
1
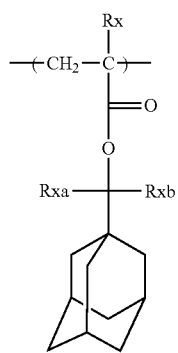
2
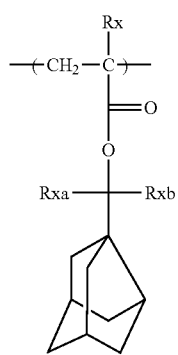
3
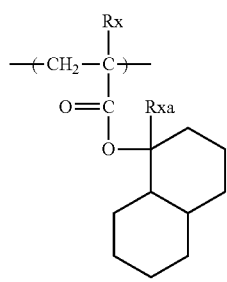
4
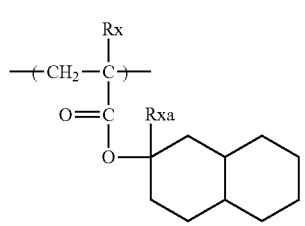
5
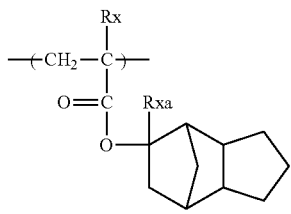
6
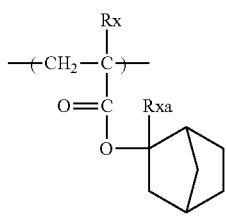
7
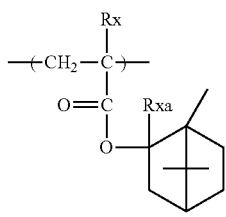
8
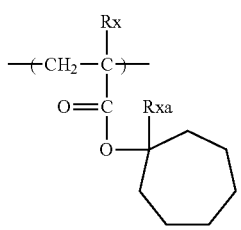
9
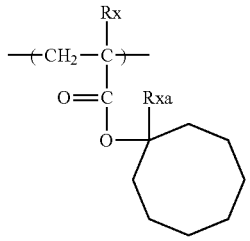
10
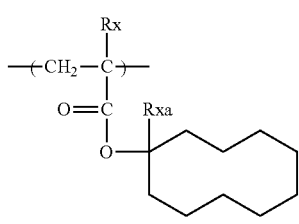
11
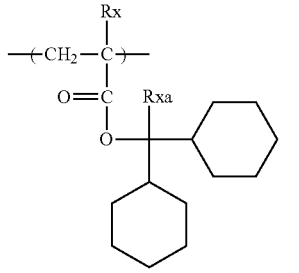
12

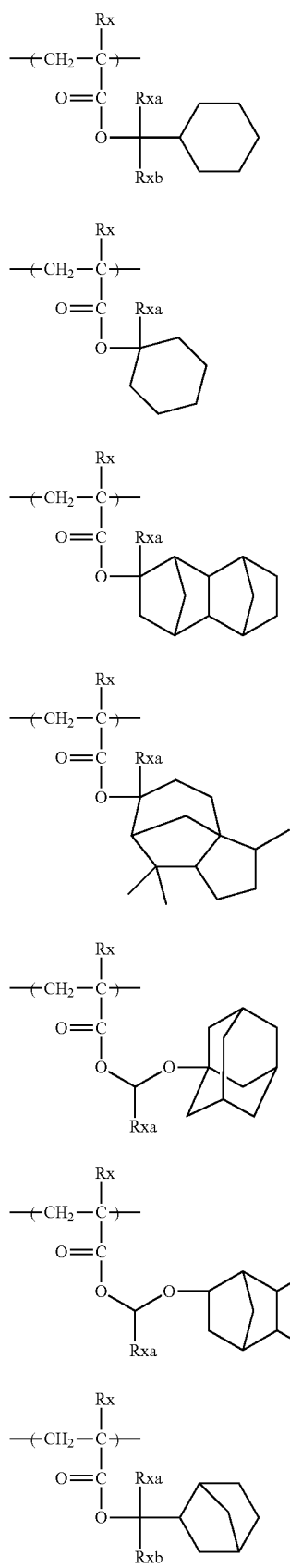
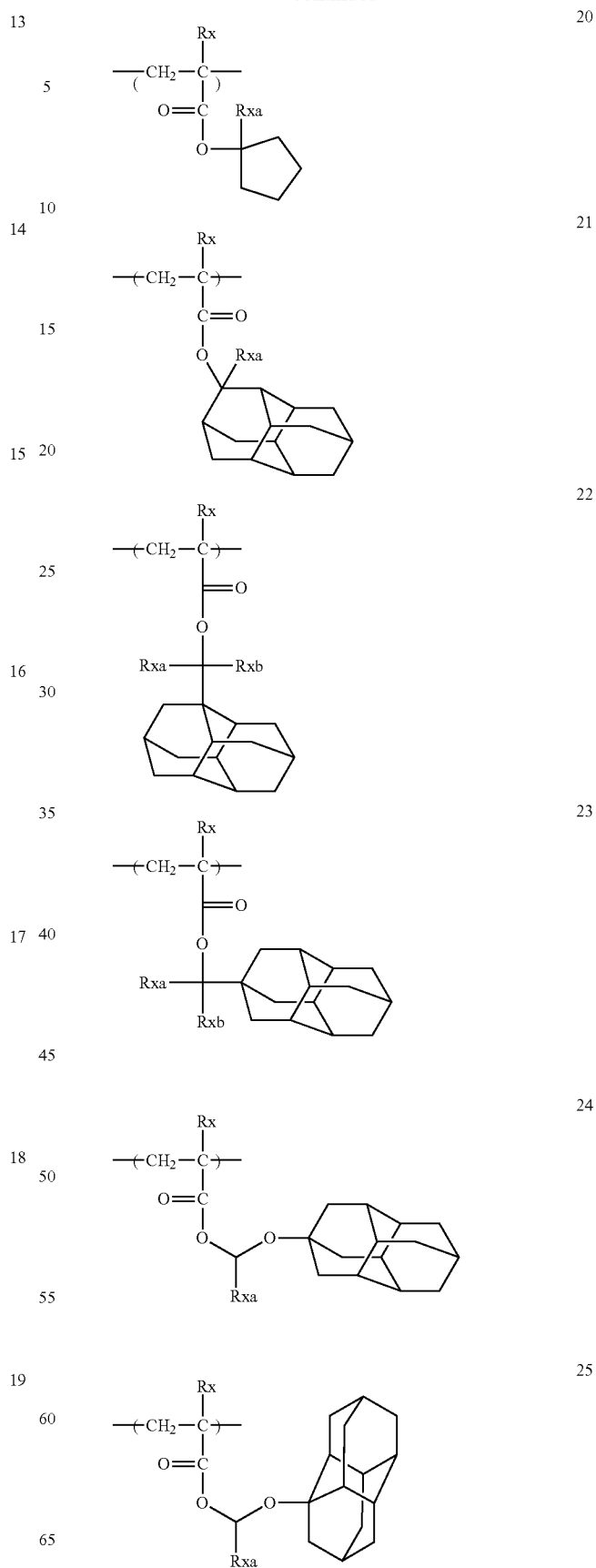

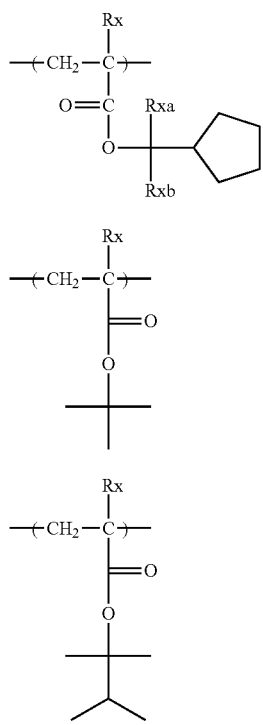

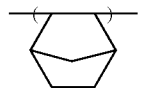
[II-1]

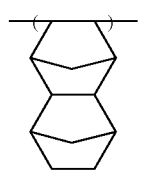
[II-2]

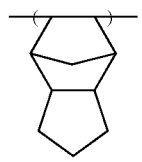
[II-3]

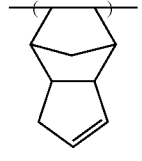
[II-4]

[II-5]

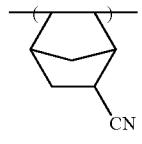
[II-6]

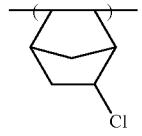
[II-7]

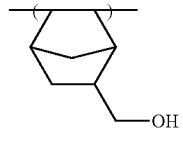
[II-8]

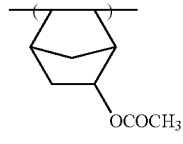
[II-9]

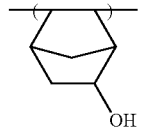
[II-10]

Examples of a halogen atom which $R_{11}'$ and $R_{12}'$ each can represent in the formula (II-AB) include a chlorine atom, a bromine atom, a fluorine atom and an iodine atom.

Examples of an alkyl group which $R_{11}'$ and $R_{12}'$ each can represent in the formula (II-AB) include 1-10C straight-chain or branched alkyl groups.

The atoms Z' for forming an alicyclic structure are atoms forming an unsubstituted or substituted alicyclic hydrocarbon as a repeating unit of the resin, particularly preferably atoms forming a bridged alicyclic hydrocarbon as a repeating unit.

Examples of a skeleton of the alicyclic hydrocarbon formed include the same skeletons as the alicyclic hydrocarbon groups represented by $R_{12}$ to $R_{25}$ in the formulae (pI) to (pV) have.

The skeleton of the alicyclic hydrocarbon may have a substituent. Examples of such a substituent include the groups represented by $R_{13}'$ to $R_{16}'$ in the formula (II-AB1) or (II-AB2).

In the alicyclic hydrocarbon-containing acid-decomposable resin relating to the invention, groups capable of decomposing by the action of an acid can be incorporated into at least one type of repeating units chosen from repeating units having aliphatic hydrocarbon-containing partial structures represented by any of the formulae (pI) to (pV), repeating units represented by the formula (II-AB) or repeating units of copolymerization components described hereinafter. However, it is preferable that the groups capable of decomposing by the action of an acid are incorporated into repeating units having alicyclic hydrocarbon-containing partial structures represented by any of the formulae (pI) to (pV).

Various kinds of substituents as $R_{13}'$ to $R_{16}'$ in the formula (II-AB1) or (II-AB2) may also become substituents of atoms Z' for forming an alicyclic hydrocarbon structure or a bridged alicyclic hydrocarbon structure in the formula (II-AB).

Examples of repeating units represented by the formula (II-AB 1) or (II-AB2) are illustrated below, but these examples should not be construed as limiting the scope of the invention.

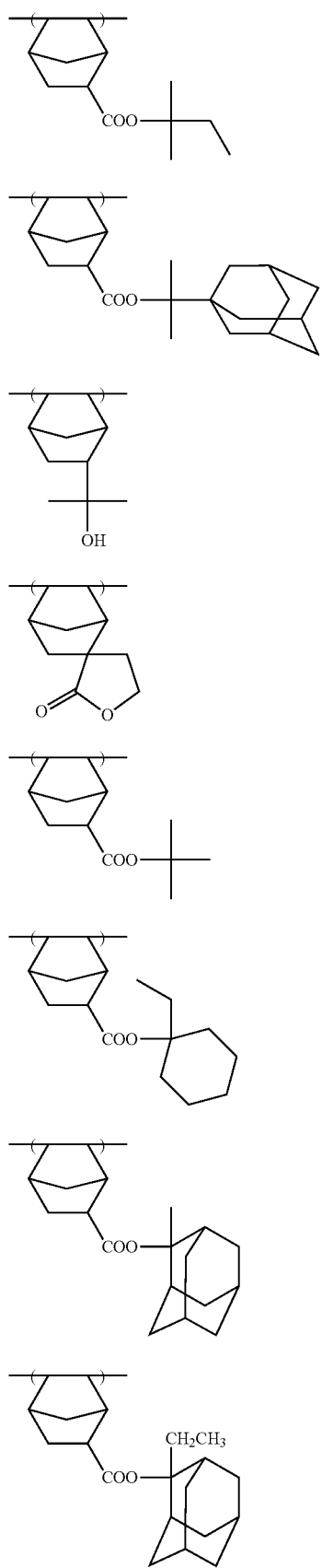
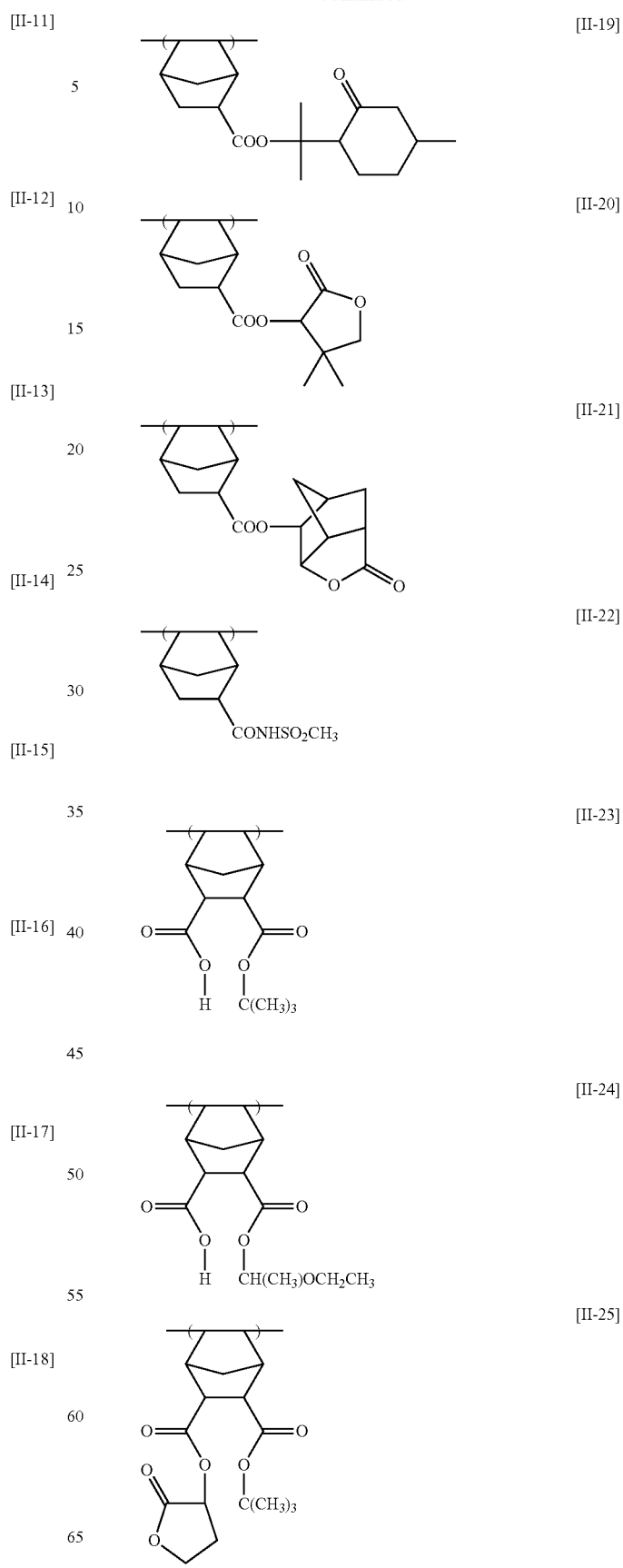

[II-26]
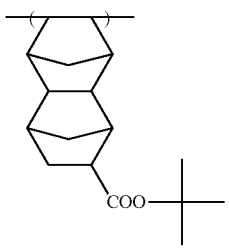

[II-27]
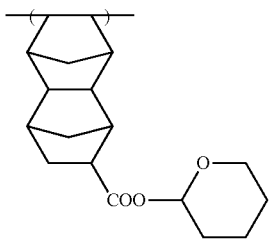

[II-28]
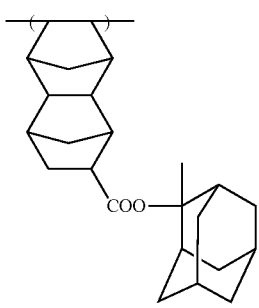

[II-29]
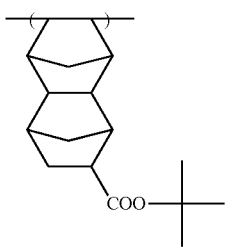

[II-30]
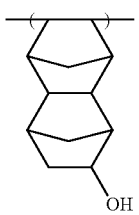

[II-31]
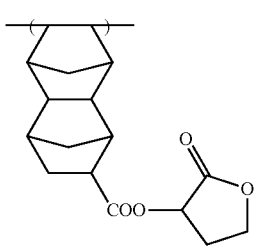

[II-32]
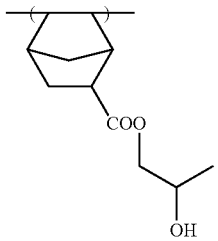

The alicyclic hydrocarbon-containing acid-decomposable resin for use in the invention preferably has lactone groups. As the lactone groups, any groups can be used as long as they have lactone structures. Suitable examples of a lactone group include groups having 5- to 7-membered ring lactone structures, preferably groups in a state that 5- to 7-membered ring lactone structures fuse with other ring structures to form bicyclo or spiro structures. It is preferable by far that the alicyclic hydrocarbon-containing acid-decomposable resin for use in the invention has repeating units containing the groups having lactone structures represented by any of the following formulae (LC1-1) to (LC1-16). Alternatively, the groups having lactone structures may be bonded directly to the main chain. The lactone structures used to advantage are groups represented by the formulae (LC1-1), (LC1-4), (LC1-5), (LC1-6), (LC1-13) and (LC1-14), and the use of specified lactone structures contributes to improvements in line edge roughness and development defects.

LC1-1
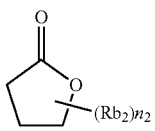

LC1-2
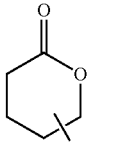

LC1-3
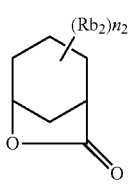

LC1-4
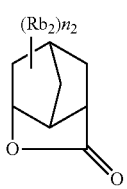

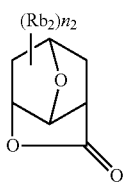 LC1-5

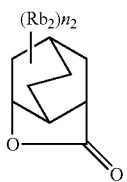 LC1-6

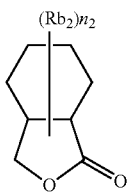 LC1-7

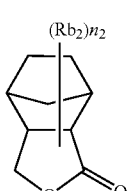 LC1-8

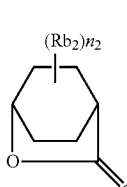 LC1-9

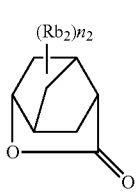 LC1-10

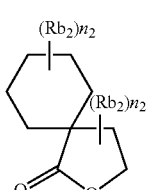 LC1-11

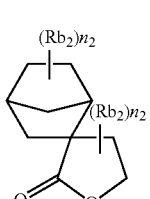 LC1-12

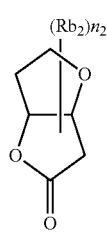 LC1-13

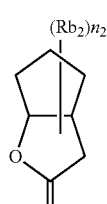 LC1-14

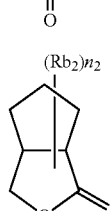 LC1-15

 LC1-16

The lactone structure moieties each may have a substituent ($Rb_2$) or needn't. Suitable examples of a substituent ($Rb_2$) include 1-8C alkyl groups, 4-7C cycloalkyl groups, 1-8C alkoxyl groups, 1-8C alkoxycarbonyl groups, a carboxyl group, halogen atoms, a hydroxyl group, a cyano group and acid-decomposable groups. $n_2$ represents an integer of 0 to 4. When $n_2$ is 2 or above, a plurality of $Rb_2$s may be the same or different, or they may combine with each other to form a ring.

Examples of a repeating unit containing a group having a lactone structure represented by any of the formulae (LC1-1) to (LC1-16) include the repeating units represented by the formula (II-AB1) or (II-AB2) wherein at least one of $R_{13}'$ to $R_{16}'$ is a group having the lactone structure represented by any of the formulae (LC1-1) to (LC1-16) (for instance, $R_5$ in —$COOR_5$ represents a group having the lactone structure represented by any of the formulae (LC1-1) to (LC1-16)), and repeating units represented by the following formula (AI).

(AI)

In the formula (AI), $Rb_0$ represents a hydrogen atom, a halogen atom or a 1-4C alkyl group. Examples of a suitable substituent the alkyl group of $Rb_0$ may have include a hydroxyl group and halogen atoms.

Examples of a halogen atom represented by $Rb_0$ include a fluorine atom, a chlorine atom, a bromine atom and an iodine atom.

Rb₀ is preferably a hydrogen atom, a methyl group, a hydroxymethyl group or a trifluoromethyl group, and more preferably a hydrogen atom or a methyl group.

Ab represents a single bond, an alkylene group, a divalent linkage group having a mononuclear or polynuclear alicyclic hydrocarbon structure, an ether linkage, an ester linkage, a carbonyl group, or a divalent group formed by combining two or more of the groups recited above. The preferred as Ab is a single bond or a linkage group represented by -Ab$_1$-CO$_2$—. Ab$_1$ is a straight-chain or branched alkylene group or a mononuclear or polynuclear cycloalkylene group, preferably a methylene group, an ethylene group, a cyclohexylene group, an adamantylene group or a norbornylene group.

V represents a group represented by any of the formulae (LC1-1) to (LC1-16).

A repeating unit having a lactone structure generally has optical isomers, and any of the optical isomers may be used. Further, one optical isomer may be used by itself, or two or more of optical isomers may be used as a mixture. When one optical isomer is mainly used, the optical purity (ee) thereof is preferably 90 or above, far preferably 95 or above.

Examples of a repeating unit containing a group having a lactone structure are illustrated below, but these examples should not be construed as limiting the scope of the invention.

(In each of the following formulae, Rx is H, CH$_3$, CH$_2$OH or CF$_3$)

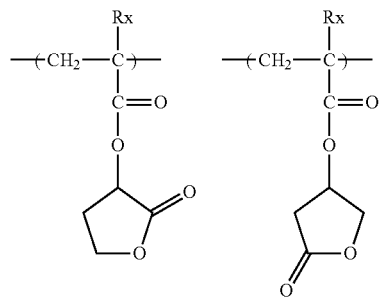

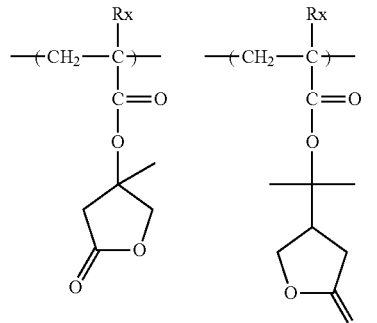

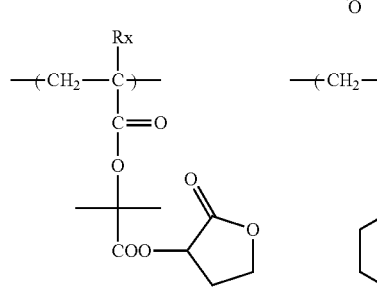

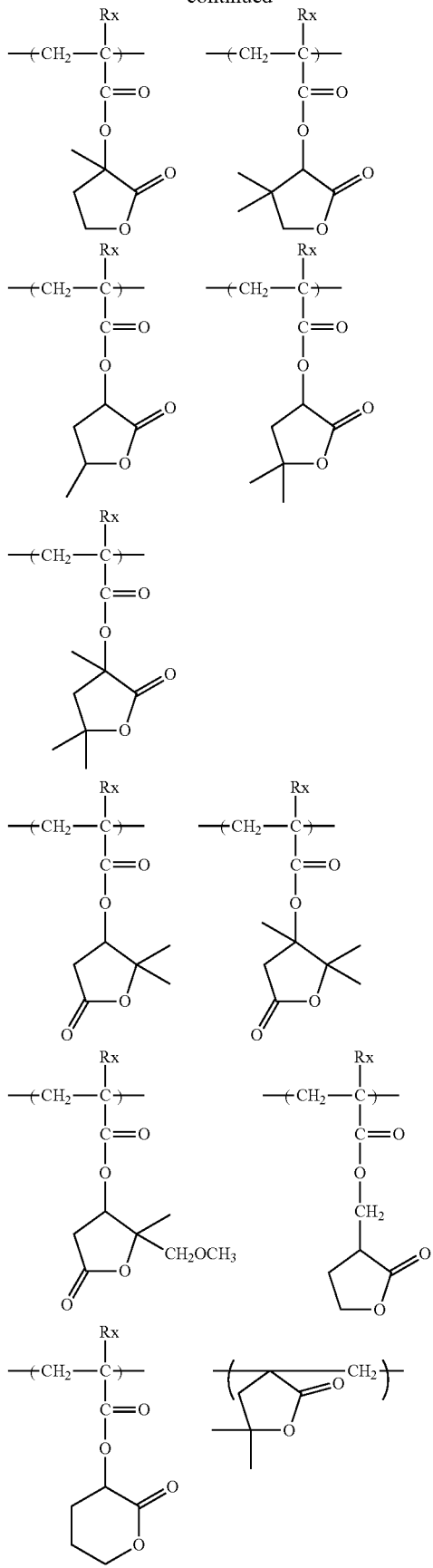

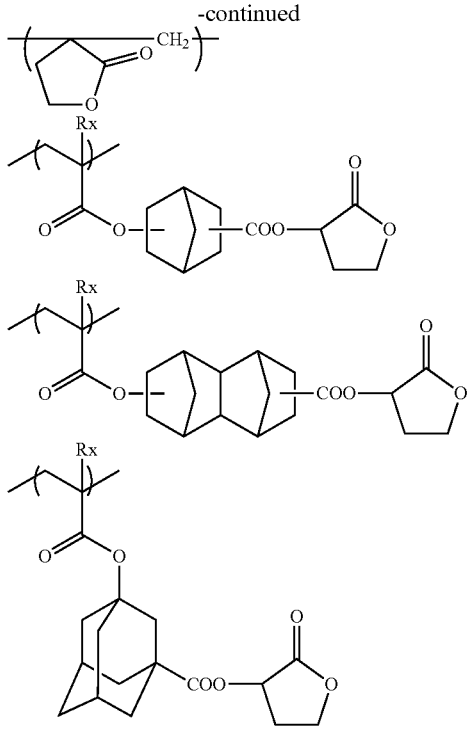
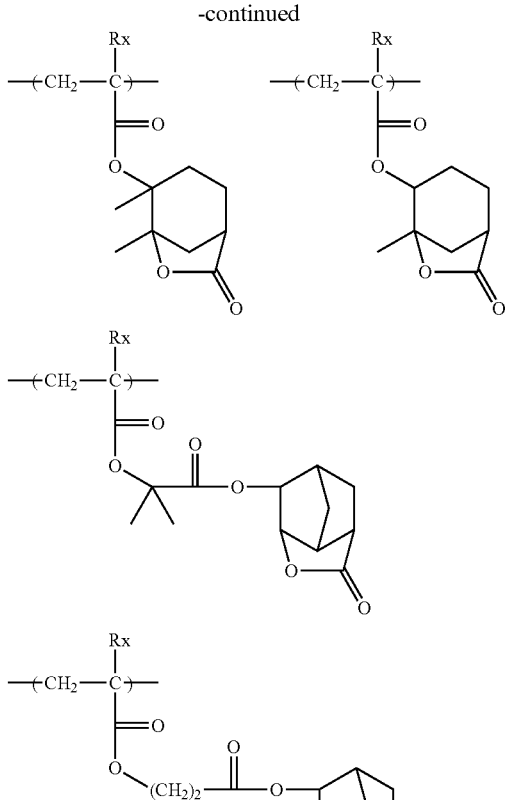
(In each of the following formulae, Rx is H, CH₃, CH₂OH or CF₃)
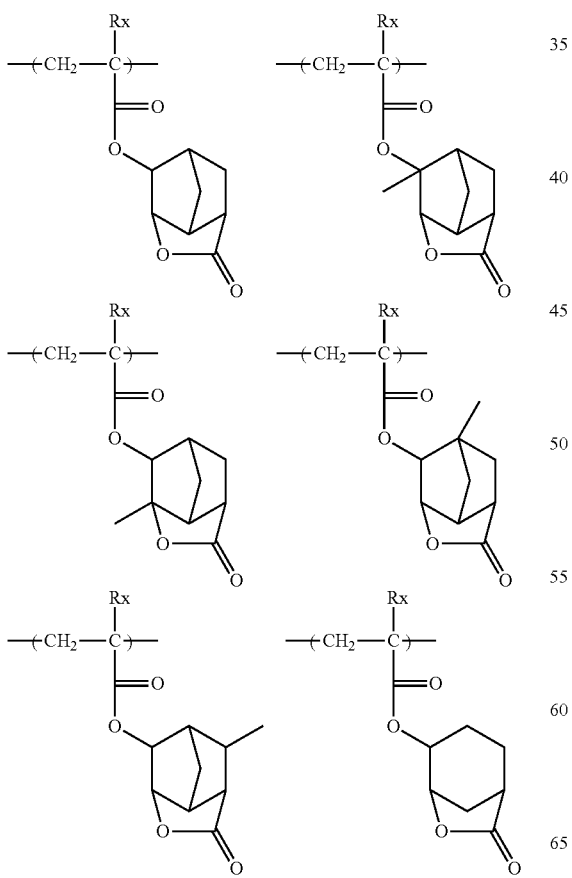

39
-continued
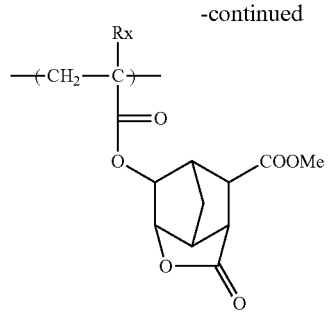
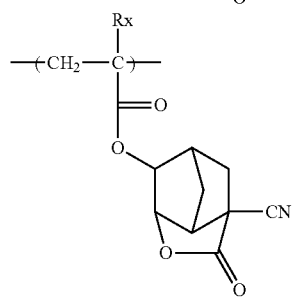
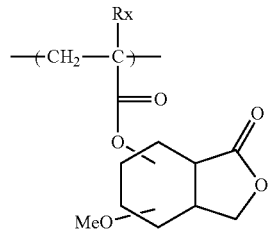
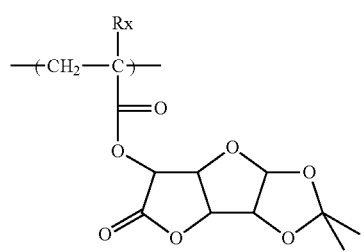
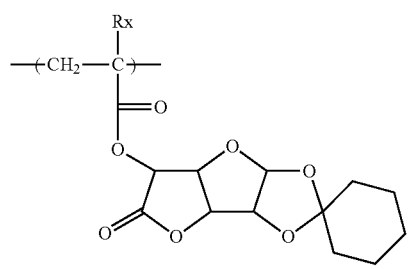
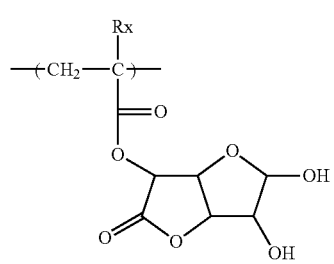
40
-continued
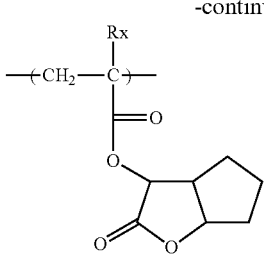
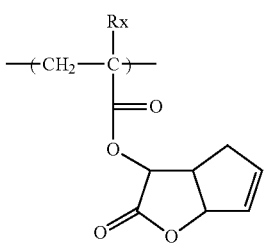
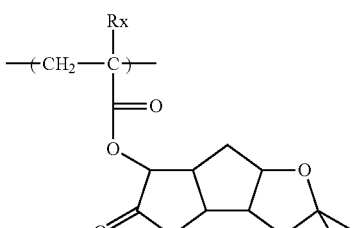
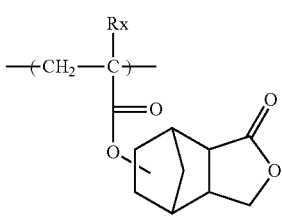
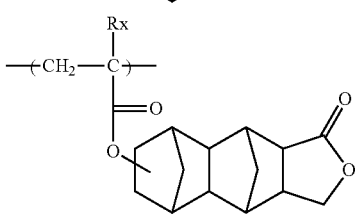
(In each of the following formulae, Rx is H, CH$_3$, CH$_2$OH or CF$_3$)
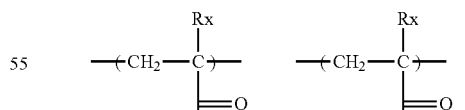
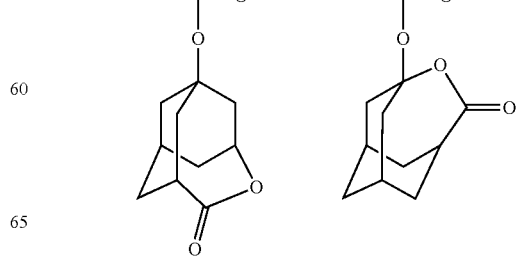

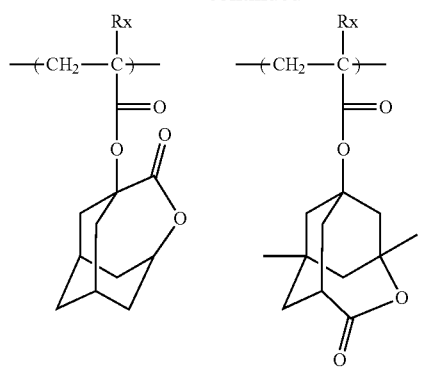
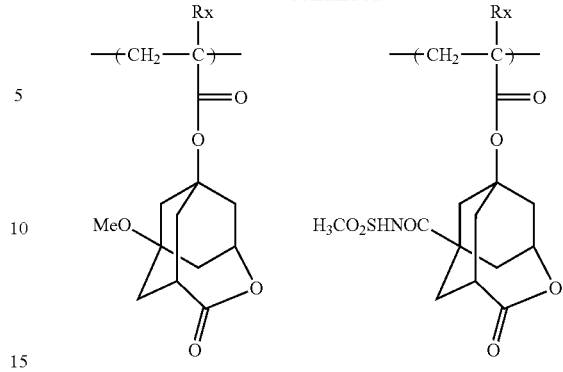

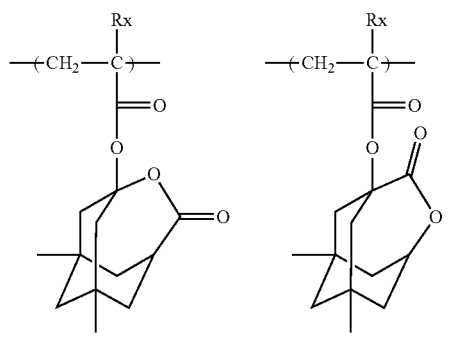

The alicyclic hydrocarbon-containing acid-decomposable resin for use in the invention preferably has repeating units containing organic groups having polar groups, especially repeating units having alicyclic hydrocarbon structures substituted with polar groups. By having such repeating units, the resin can contribute to enhancement of adhesiveness to a substrate and affinity for a developer. As the alicyclic hydrocarbon part of the alicyclic hydrocarbon structure substituted with a polar group, an adamantyl group, a diamantyl group or a norbornyl group is suitable. As the polar group in such a structure, a hydroxyl group or a cyano group is suitable. As the alicyclic hydrocarbon structures substituted with polar groups, partial structures represented by the following formulae (VIIa) to (VIId) are suitable.

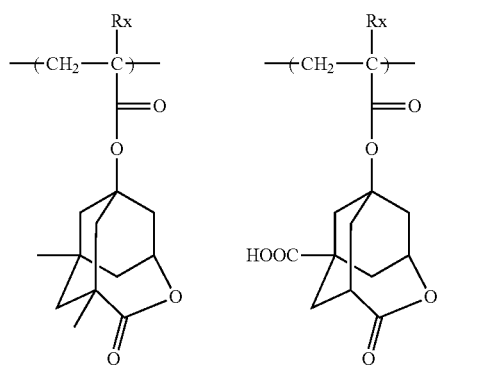

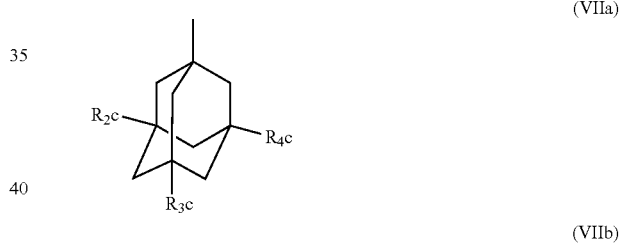

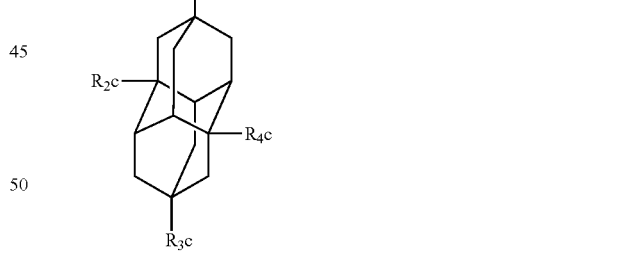

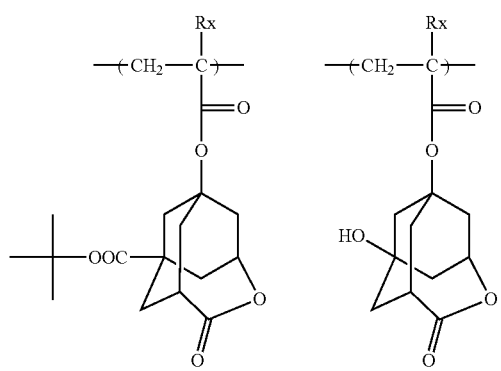

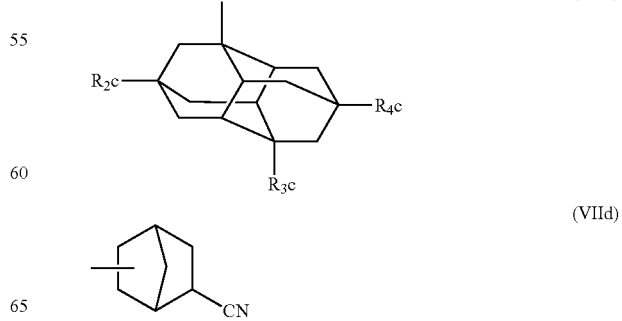

In the formulae (VIIa) to (VIIe), $R_{2C}$ to $R_{4C}$ each represent a hydrogen atom, a hydroxyl group or a cyano group independently, provided that at least one of them represents a hydroxyl group or a cyan group. In such partial structures, it is preferable that one of $R_{2C}$ to $R_{4C}$ is a hydroxyl group and the remainder are hydrogen atoms, and that two of $R_{2C}$ to $R_{4C}$ are hydroxyl groups and the remainder is a hydrogen atom.

In the partial structure of formula (VIIa), the case where two of $R_{2C}$ to $R_{4C}$ are hydroxyl groups and the remainder is a hydrogen atom is far preferred.

Examples of repeating units containing groups represented by the formulae (VIIa) to (VIId) include the repeating units represented by the formula (II-AB1) or (II-AB2) wherein at least one of $R_{13}'$ to $R_{16}'$ is a group represented by any of the formulae (VIIa) to (VIId) (for example, $R_5$ in —$COOR_5$ represents a group represented by any of the formulae (VIIa) to (VIId)), and repeating units represented by the following formulae (AIIa) to (AIId).

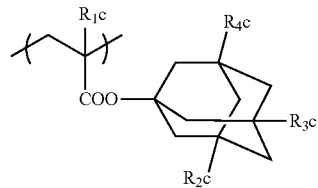

(AIIa)

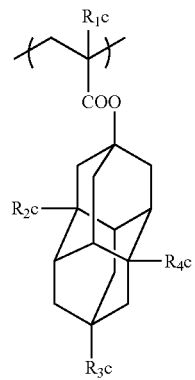

(AIIb)

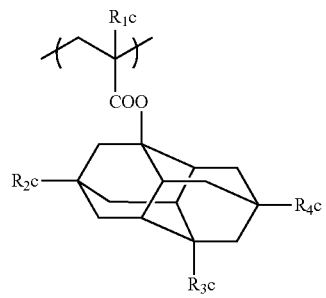

(AIIc)

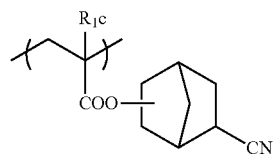

(AIId)

In the formula (AIIa) to (AIId), $R_1c$ represents a hydrogen atom, a methyl group, a trifluoromethyl group or a hydroxymethyl group, and $R_2c$ to $R_4c$ have the same meanings as in the formulae (VIIa) to (VIIc).

Examples of repeating units represented by the formulae (AIIa) to (AIId) are illustrated below, but these examples should not be construed as limiting the scope of the invention.

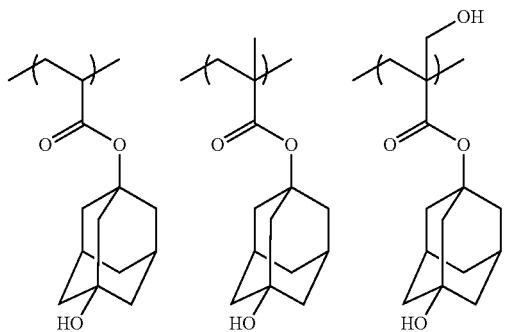

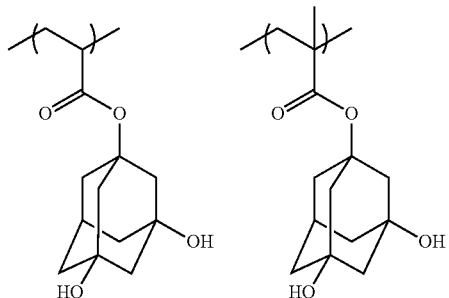

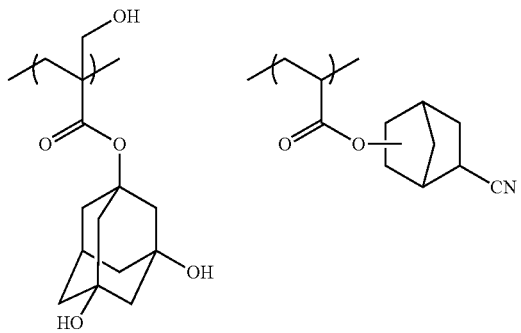

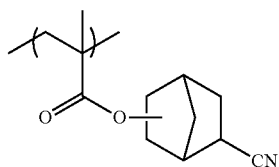

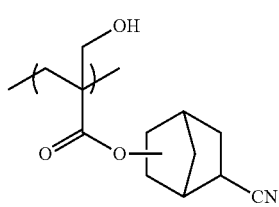

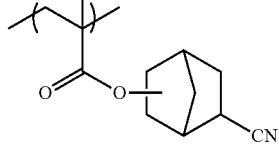

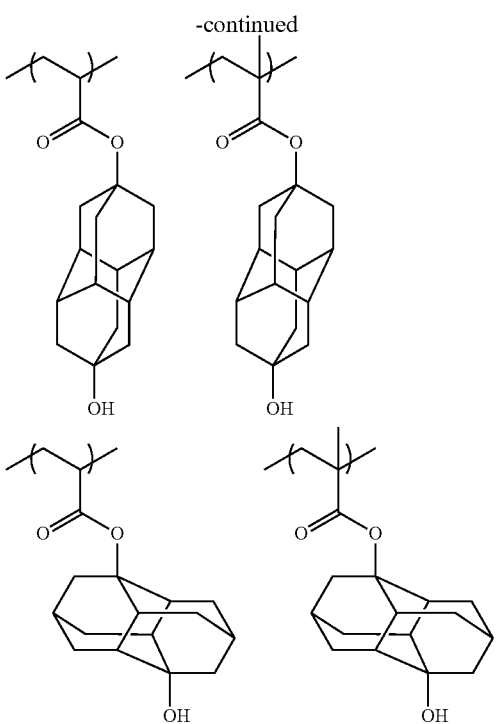

The alicyclic hydrocarbon-containing acid-decomposable resin for use in the invention may have repeating units represented by the following formula (VIII).

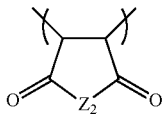

(VIII)

In the formula (VIII), $Z_2$ represents —O— or —N($R_{41}$)—. $R_{41}$ represents a hydrogen atom, a hydroxyl group, an alkyl group or —OSO$_2$-R$_{42}$. $R_{42}$ represents an alkyl group, a cycloalkyl group or a camphor residue. The alkyl groups of $R_{41}$ and $R_{42}$ may be substituted with halogen atoms (preferably fluorine atoms) or so on.

Examples of a repeating unit represented by the formula (VIII) are illustrated below, but these examples should not be construed as limiting the scope of the invention.

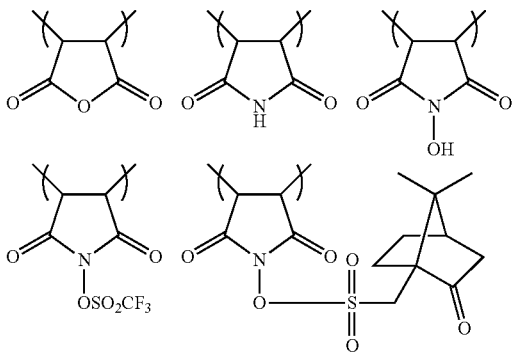

The alicyclic hydrocarbon-containing acid-decomposable resin for use in the invention preferably has repeating units containing alkali-soluble groups, and far preferably has repeating units containing carboxyl groups. The presence of such groups in the repeating units can enhance resolution in the use for contact hole. Suitable examples of a repeating unit containing a carboxyl group include a repeating unit containing the carboxyl group bonded directly to the main chain of resin, such as a repeating unit derived from acrylic acid or methacrylic acid, a repeating unit containing the carboxyl group attached to the main chain of resin via a linkage group, and a unit introduced as a polymer chain terminal by using a polymerization initiator or chain transfer agent having an alkali-soluble group at the time of polymerization. Therein, the linkage group may have a mononuclear or polynuclear cyclic hydrocarbon structure. Of these repeating units, those derived from acrylic acid and methacrylic acid in particular are preferred.

The alicyclic hydrocarbon-containing acid-decomposable resin for use in the invention may further have repeating units which each contain 1 to 3 groups represented by the following formula (F1). The presence of these groups contributes to improvement in line edge roughness quality.

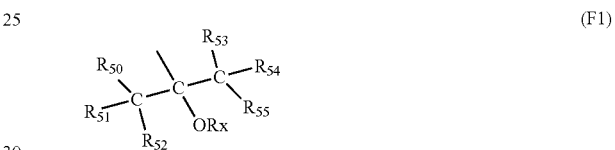

(F1)

In the formula (F1), $R_{50}$ to $R_{55}$ each represent a hydrogen atom, a fluorine atom or an alkyl group independently, provided that at least one of $R_{50}$ to $R_{55}$ is a fluorine atom or an alkyl group at least one hydrogen atom of which is substituted with a fluorine atom.

Rx represent a hydrogen atom or an organic group (preferably an acid-decomposable blocking group, an alkyl group, a cycloalkyl group, an acyl group or an alkoxycarbonyl group).

The alkyl group represented by $R_{50}$ to $R_{55}$ each may be substituted with a halogen atom such as a fluorine atom, a cyano group or so on, and suitable examples thereof include 1-3C alkyl groups, such as a methyl group and a trifluoromethyl group.

Nevertheless, it is preferable that all of $R_{50}$ to $R_{55}$ are fluorine atoms.

Suitable examples of an organic group represented by Rx include acid-decomposable blocking groups, and alkyl, cycloalkyl, acyl, alkylcarbonyl, alkoxycarbonyl, alkoxycarbonylmethyl, alkoxymethyl and 1-alkoxyethyl groups which each may have a substituent.

The repeating units containing groups represented by the formula (F1) are preferably repeating units represented by the following formula (F2).

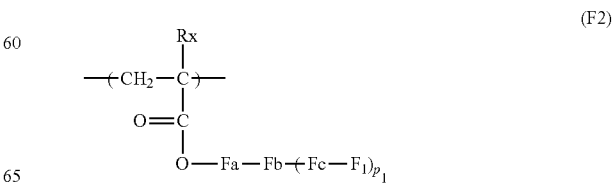

(F2)

In the formula (F2), Rx represents a hydrogen atom, a halogen atom, or a 1-4C alkyl group. The substituent the alkyl group of Rx may have is preferably a hydroxyl group or a halogen atom.

Fa represents a single bond, or a straight-chain or branched alkylene group (preferably a single bond).

Fb represents a mononuclear or polynuclear cyclic hydrocarbon group.

Fc represents a single bond, or a straight-chain or branched alkylene group (preferably a single bond or a methylene group).

F1 represents a group represented by the formula (F1).

P1 represents 1, 2 or 3.

The cyclic hydrocarbon group of Fb is preferably a cyclopentylene group, a cyclohexylene group or a norbornylene group.

Examples of the repeating unit having a group represented by the formula (F1) are illustrated below, but these examples should not be construed as limiting the scope of the invention.

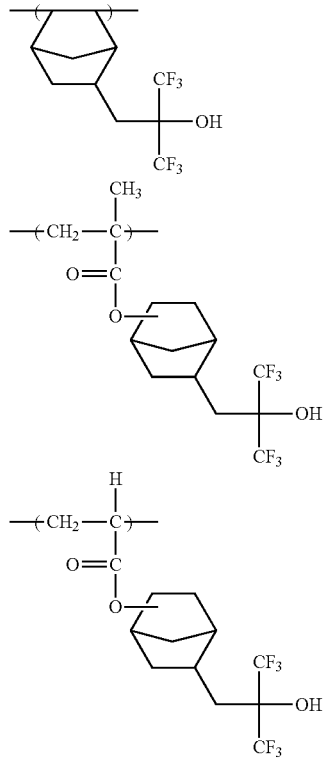

The alicyclic hydrocarbon-containing acid-decomposable resin for use in the invention may further contain repeating units having alicyclic hydrocarbon structures and not showing acid decomposability. By the presence of such repeating units, elution of low molecular components from a resist coating into an immersion liquid during the performance of immersion lithography can be reduced. Examples of such repeating units include those derived from 1-adamantyl (meth)acrylate, tricyclodecanyl (meth)acrylate and cyclohexayl (meth)acrylate.

Examples of the repeating units having alicyclic hydrocarbon structures and not showing acid decomposability include repeating units containing neither a hydroxy group nor a cyano group, and are preferably repeating units represented by the following formula (IX).

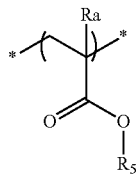

In the formula (IX), $R_5$ represents a hydrocarbon group having at least one cyclic structure and containing neither a hydroxyl group nor a cyano group.

Ra represents a hydrogen atom, an alkyl group or —$CH_2$—O—$Ra_2$. Herein, $Ra_2$ represents a hydrogen atom, an alkyl group or an acyl group. Ra is preferably a hydrogen atom, a methyl group, a hydroxymethyl group or a trifluoromethyl group, and more preferably a hydrogen atom or a methyl group.

The cyclic structure contained in $R_5$ may be a monocyclic hydrocarbon group or a polycyclic hydrocarbon group. Examples of the monocyclic hydrocarbon group include 3-12C cycloalkyl groups such as a cyclopentyl group, a cyclohexyl group, a cycloheptyl group and a cyclooctyl group, and 3-12C cycloalkenyl groups such as a cyclohexenyl group. Of these monocyclic hydrocarbon groups, 3-7C monocyclic hydrocarbon groups, especially a cyclopentyl group and a cyclohexyl group, are preferred over the others.

The polycyclic hydrocarbon group may be an assembled-ring hydrocarbon group or a bridged-ring hydrocarbon group. Examples of the assembled-ring hydrocarbon group include a bicyclohexyl group and a perhydronaphthalenyl group. Examples of the bridged hydrocarbon ring include bicyclic hydrocarbon rings such as a pinane ring, a bornane ring, a norpinane ring, a norbornane ring and bicyclooctane rings (e.g., a bicyclo[2.2.2]octane ring, a bicyclo[3.2.1]octane ring), tricyclic hydrocarbon rings such as a homobredane ring, an adamantane ring, a tricyclo[5.2.1.0$^{2,6}$]decane ring and a tricyclo[4.3.1.1$^{2,5}$]undecane ring, and tetracyclic hydrocarbon rings such as a tetracyclo[4.4.0.1$^{2,5}$.1$^{7,10}$]dodecane ring and a perhydro-1,4-methano-5,8-methanonaphthalene ring. And additional examples of the bridged hydrocarbon ring include condensed hydrocarbon rings formed by fusing together two or more of 5- to 8-membered cycloalkane rings such as perhydronaphthalene (decaline), perhydroanthracene, perhydrophenanthrene, perhydroacenaphthene, perhydrofluorene, perhydroindene and perhydrophenalene rings.

Examples of a bridged-ring hydrocarbon group suitable as the cyclic structure of $R_5$ include a norbornyl group, an adamantyl group, a bicyclooctanyl group and a tricyclo[5.2.1.0$^{2,6}$]decanyl group. Of these groups, a norbornyl group and an adamantyl group are preferred over the others.

Each of the alicyclic hydrocarbon groups recited above may have a substituent. Examples of a substituent suitable for those groups each include a halogen atom, an alkyl group, a hydroxyl group protected by a protective group, and an amino group protected by a protective group. Suitable examples of the halogen atom include bromine, chlorine and fluorine atoms. Suitable examples of the alkyl group include methyl, ethyl, butyl and t-butyl groups. These alkyl groups each may further have a substituent. Examples of the substituent include a halogen atom, an alkyl group, a hydroxyl group protected by a protective group and an amino group protected by a protective group.

Examples of such protective groups include an alkyl group, a cycloalkyl group, an aralkyl group, a substituted methyl group, a substituted ethyl group, an acyl group, an alkoxycarbonyl group and an aralkyloxycarbonyl group. Suitable examples of the alkyl group include 1-4C alkyl groups, those of the substituted methyl group include methoxymethyl, methoxythiomethyl, benzyloxymethyl, t-butoxymethyl and 2-methoxyethoxymethyl groups, those of the substituted ethyl group include 1-ethoxyethyl and 1-methyl-1-methoxyethyl groups, those of the acyl group include 1-6C aliphatic acyl groups such as formyl, acetyl, propionyl, butyryl, isobutyryl, valeryl and pivaloyl groups, and those of the alkoxycarbonyl group include 1-4C alkoxycarbonyl groups.

The proportion of repeating units represented by the formula (IX), which have neither a hydroxyl group nor a cyano group is preferably from 0 to 40 mole %, far preferably from 0 to 20 mole %, with respect to the total repeating units of the alicyclic hydrocarbon-containing acid-decomposable resin.

Examples of a repeating unit represented by the formula (IX) are illustrated below, but these examples should not be construed as limiting the scope of the invention.

In the following structural formulae, Ra represents H, $CH_3$, $CH_2OH$ or $CF_3$.

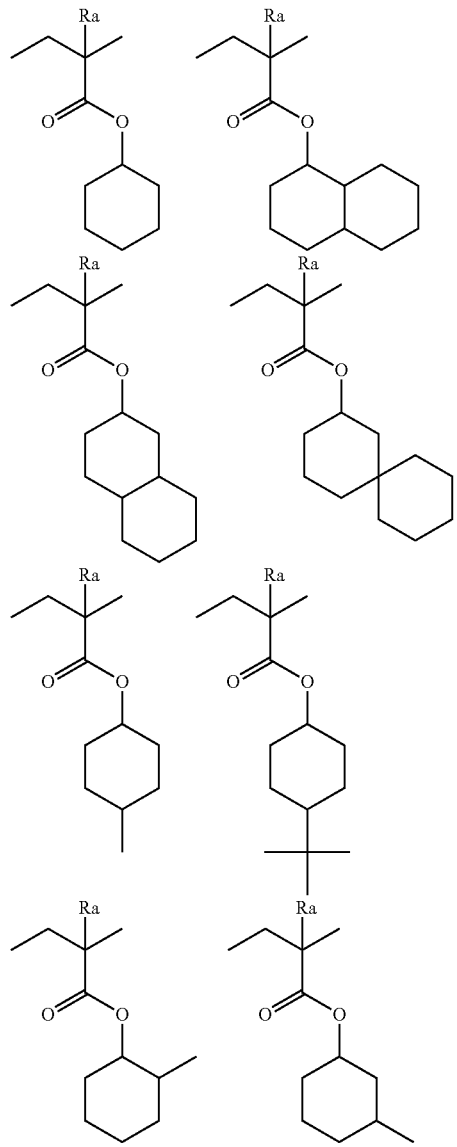

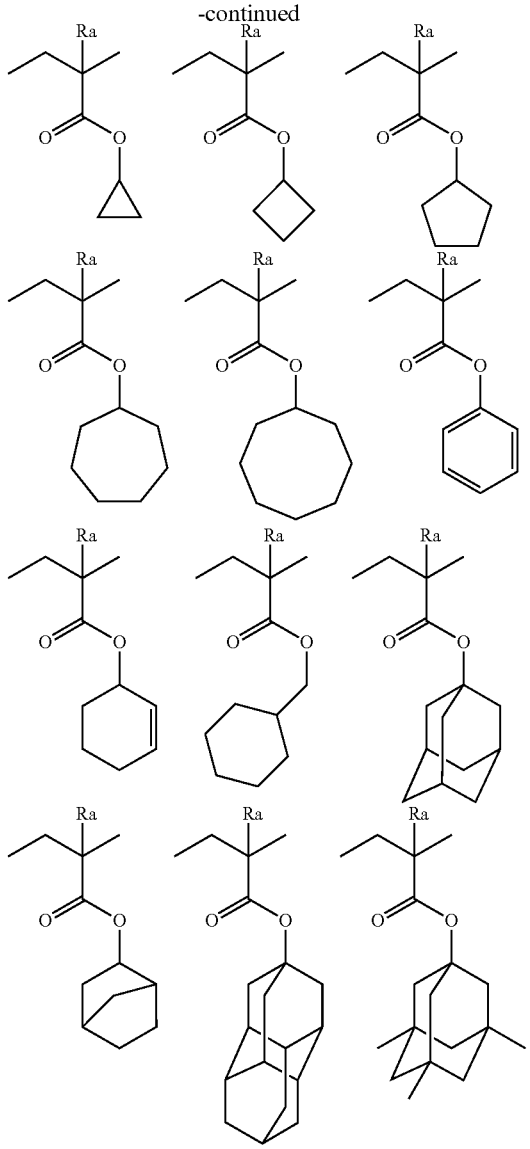

In addition to the repeating structural units recited above, the alicyclic hydrocarbon-containing acid-decomposable resin for use in the invention can contain a wide variety of repeating structural units for the purpose of controlling dry etching resistance, suitability for standard developers, adhesiveness to substrates, resist profile, and besides, characteristics generally required for resist, such as resolution, heat resistance and sensitivity.

Examples of such repeating structural units include repeating structural units corresponding to the monomers as recited below, but these examples should not be construed as limiting the scope of the invention.

By having those repeating units, it becomes possible to make fine adjustments to properties required for the alicyclic hydrocarbon-containing acid-decomposable resin, especially properties including:
(1) solubility in a coating solvent,
(2) film formability (glass transition temperature),
(3) solubility in a positive developer and solubility in a negative developer,
(4) thinning of film (hydrophilic-hydrophobic balance, alkali-soluble group selection), (5) adhesion of unexposed areas to a substrate, and
(6) dry etching resistance.

Examples of monomers suitable for the foregoing purposes include compounds which each have one addition-polymerizable unsaturated bond and are selected from acrylic acid esters, methacrylic acid esters, acrylamides, methacrylamides, allyl compounds, vinyl ethers, or vinyl esters.

In addition to those monomers, any other monomers may be copolymerized so long as they are addition-polymerizable unsaturated compounds capable of forming copolymers together with monomers corresponding to the various repeating structural units mentioned above.

The ratio between mole contents of repeating structural units in the alicyclic hydrocarbon-containing acid-decomposable resin can be chosen appropriately for adjusting dry etching resistance, standard developer suitability, adhesion to substrates, resist profile, and characteristics generally required for resist, such as resolution, heat resistance and sensitivity.

Examples of a preferred state of the alicyclic hydrocarbon-containing acid-decomposable resin for use in the invention include the following.

(1) A state of containing repeating units each having an alicyclic hydrocarbon-containing partial structure represented by any of the formulae (pI) to (pV) (side-chain type).

Herein, the repeating units contained are preferably (meth)acrylate repeating units each having a structure containing any of (pI) to (pV).

(2) A state of containing repeating units represented by the formula (II-AB) (main-chain type). However, the state (2) further includes the following.

(3) A state of having repeating units represented by the formula (II-AB), maleic anhydride derivative and (meth)acrylate structures (hybrid type).

The content of repeating units having acid-decomposable groups in the alicyclic hydrocarbon-containing acid-decomposable resin is preferably from 10 to 60 mole %, far preferably from 20 to 50 mole %, further preferably from 25 to 40 mole %, of the total repeating structural units.

The content of repeating units having acid-decomposable groups in an acid-decomposable resin is preferably from 10 to 60 mole %, far preferably from 20 to 50 mole %, further preferably from 25 to 40 mole %, of the total repeating structural units.

The content of repeating units having alicyclic hydrocarbon-containing partial structures represented by the formulae (pI) to (pV) in the alicyclic hydrocarbon-containing acid-decomposable resin is preferably from 20 to 70 mole %, far preferably from 20 to 50 mole %, further preferably from 25 to 40 mole %, of the total repeating structural units.

The content of repeating units represented by the formula (II-AB) in the alicyclic hydrocarbon-containing acid-decomposable resin is preferably from 10 to 60 mole %, far preferably from 15 to 55 mole %, further preferably from 20 to 50 mole %, of the total repeating structural units.

The content of repeating units having lactone rings in an acid-decomposable resin is preferably from 10 to 70 mole %, far preferably from 20 to 60 mole %, further preferably from 25 to 40 mole %, of the total repeating structural units.

The content of repeating units containing organic groups having polar groups in an acid-decomposable resin is preferably from 1 to 40 mole %, far preferably from 5 to 30 mole %, further preferably from 5 to 20 mole %, of the total repeating structural units.

In the resin for use in the invention, the content of repeating structural units based on monomers as additional copolymerizing components can also be chosen appropriately according to the intended resist performance. In general, the proportion of such repeating structural units is preferably 99 mole % or below, far preferably 90 mole % or below, further preferably 80 mole % or below, based on the total mole number of the repeating structural units having alicyclic hydrocarbon-containing partial structures represented by the formulae (pI) to (pV) and the repeating units represented by the formula (II-AB).

When the present resist composition for negative development is designed for ArF exposure use, it is advantageous for the resin used therein to have no aromatic group in point of transparency to ArF light.

As to the alicyclic hydrocarbon-containing acid-decomposable resin for use in the invention, it is preferable that (meth)acrylate repeating units constitute all the repeating units of the resin. Herein, all the repeating units may be either acrylate repeating units, or methacrylate repeating units, or mixed acrylate-and-methacrylate repeating units. However, it is preferable that the acrylate repeating units is at most 50 mole % of the total repeating units.

The alicyclic hydrocarbon-containing acid-decomposable resin is preferably a copolymer having (meth)acrylate repeating units of three types: a type of having at least a lactone ring, a type of having an organic group substituted with at least either hydroxyl or cyano group, and a type of having an acid-decomposable group.

The alicyclic hydrocarbon-containing acid-decomposable resin is far preferably a ternary copolymer containing 20-50 mole % of repeating units having alicyclic hydrocarbon-containing partial structures represented by any of the formulae (pI) to (pV), 20-50 mole % of repeating units having lactone structures and 5-30 mole % of repeating units having alicyclic hydrocarbon structures substituted with polar groups, or a quaternary copolymer further containing 0-20 mole % of other repeating units.

The resin preferred in particular is a ternary copolymer containing 20-50 mole % of repeating units containing acid-decomposable groups, which are represented by any of the following formulae (ARA-1) to (ARA-7), 20-50 mole % of repeating units containing lactone groups, which are represented by any of the following formulae (ARL-1) to (ARL-7), and 5-30 mole % of repeating units having alicyclic hydrocarbon structures substituted with polar groups, which are represented by any of the following formulae (ARH-1) to (ARH-3), or a quaternary copolymer further containing 5-20 mole % of repeating units having carboxyl groups or structures represented by the formula (F1), or repeating units having alicyclic hydrocarbon structures but not showing acid decomposability.

In the following formulae, $R_{xy1}$ represents a hydrogen atom or a methyl group, $R_{xa1}$ and $R_{xb1}$ each represent a methyl group or an ethyl group independently, and $R_{xc1}$ represents a hydrogen atom or a methyl group.

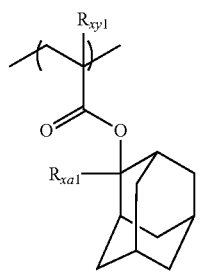

(ARA-1)

(ARA-2) 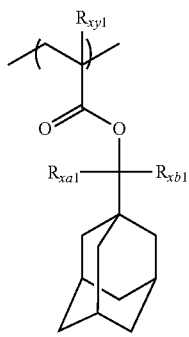
(ARA-3) 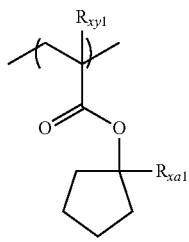
(ARA-4) 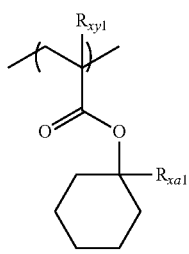
(ARA-5) 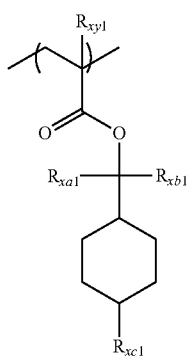
(ARA-6) 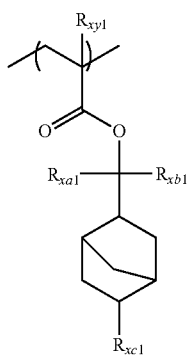
(ARA-7) 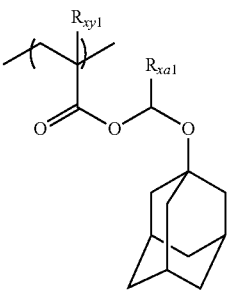
In the following formulae, $R_{xy1}$ represents a hydrogen atom or a methyl group, $R_{xd1}$ represents a hydrogen atom or a methyl group, and $R_{xe1}$ represents a trifluoromethyl group, a hydroxyl group or a cyano group.
(ARL-1) 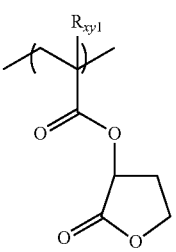
(ARL-2) 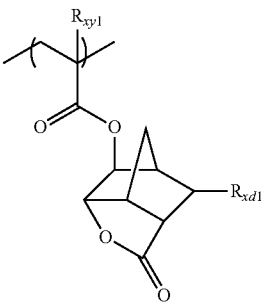
(ARL-3) 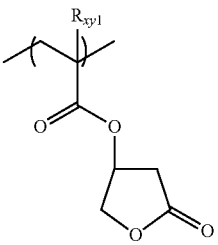
(ARL-4) 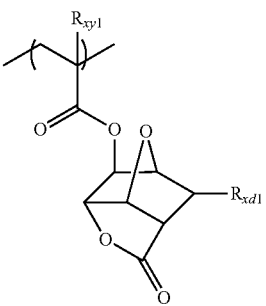

(ARL-5)
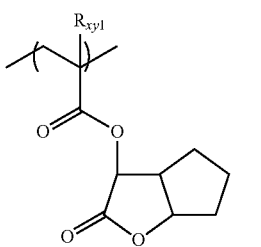

(ARL-6)
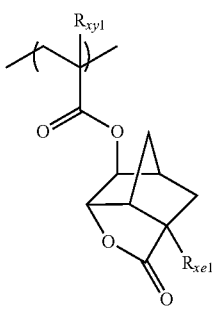

(ARL-7)
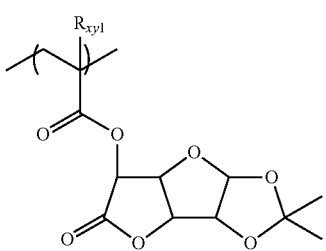

In the following formulae, $R_{xy1}$ represents a hydrogen atom or a methyl group.

ARH-1
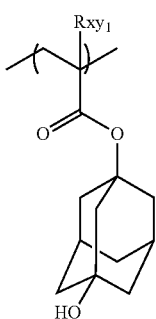

ARH-2
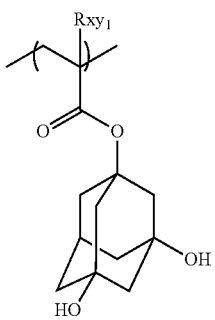

ARH-3
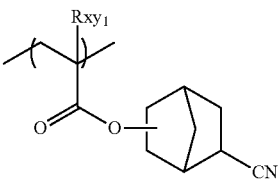

The alicyclic hydrocarbon-containing acid-decomposable resin for use in the invention can be synthesized according to general methods (e.g., radical polymerization). As examples of a general synthesis method, there are known a batch polymerization method in which polymerization is carried out by dissolving monomer species and an initiator in a solvent and heating them, and a drop polymerization method in which a solution containing monomer species and an initiator is added dropwise to a heated solvent over 1 to 10 hours. However, it is preferred that the drop polymerization method be used. Examples of a solvent usable in the polymerization reaction include ethers, such as tetrahydrofuran, 1,4-dioxane and diisopropyl ether; ketones, such as methyl ethyl ketone and methyl isobutyl ketone; ester solvents, such as ethyl acetate; amide solvents, such as dimethylformamide and dimethylacetamide; and solvents described hereafter which can dissolve the present composition, such as propylene glycol monomethyl ether acetate, propylene glycol monomethyl ether and cyclohexanone. It is preferable that the polymerization is carried out using the same solvent as used for the present resist composition. By doing so, it becomes possible to prevent particles from developing during storage.

The polymerization reaction is preferably carried out in an atmosphere of inert gas, such as nitrogen or argon. And the polymerization is initiated using a commercially available radical initiator (e.g., an azo-type initiator or peroxide) as polymerization initiator. The radical initiator is preferably an azo-type initiator, and more specifically, an azo-type initiator having an ester group, a cyano group or a carboxyl group. Examples of such a preferred azo-type initiator include azobisisobutyronitrile, azobisdimethylvaleronitrile and dimethyl 2,2'-azobis(2-methylpropionate). An addition of such an initiator may be made in the course of polymerization or such an initiator may be added in several portions, if desired. After the conclusion of the reaction, the reaction solution is poured into a solvent, and the intended polymer is collected as a powder or a solid. The concentration of reacting species is from 5 to 50 mass %, preferably from 10 to 30 mass %, and the reaction temperature is generally from 10° C. to 150° C., preferably from 30° C. to 120° C., far preferably from 60° C. to 100° C.

The polymer thus synthesized can be purified by the same method as applicable in the case of Resin (D) described hereinafter. For the purification, a usual method is applicable, and examples thereof include a liquid-liquid extraction method in which residual monomers and oligomeric components are eliminated by washing with water or by combined use of appropriate solvents, a method of performing purification in a solution state, such as an ultrafiltration method in which only components of molecular weight lower than a specific value are extracted and eliminated, a reprecipitation method in which a resin solution is dripped into a poor solvent to result in coagulation of the resin and elimination of residual monomers and so on, and a method of performing purification in a solid state, such as a method of washing filtered resin slurry with a poor solvent.

As to the resin relating to the invention, the weight average molecular weight thereof is preferably from 1,000 to 200,000, far preferably from 1,000 to 20,000, particularly preferably from 1,000 to 15,000, as measured by GPC and calculated in terms of polystyrene. By adjusting the weight average molecular weight to fall within the range of 1,000 to 200,000, declines in heat resistance and dry etching resistance can be prevented, and besides, degradation in developability and film formability deterioration from an increased viscosity can be prevented.

The polydispersity (molecular weight distribution) of the resin used is generally from 1 to 5, preferably from 1 to 3, far preferably from 1.2 to 3.0, particularly preferably from 1.2 to 2.0. When the polydispersity is smaller, the resist pattern formed is the more excellent in resolution and resist profile, and besides, it has the smoother side wall and the better roughness quality.

The total amount of resins relating to the invention, which are mixed in the present resist composition, is from 50 to 99.9 mass %, preferably from 60 to 99.0 mass %, of the total solids in the resist composition.

In the invention, one kind of resin may be used, or two or more kinds of resins may be used in combination.

When the resist composition for negative development according to the invention contains Resin (D) described hereinafter, it is preferable that the alicyclic hydrocarbon-containing acid-decomposable Resin (A) contains neither fluorine atom nor silicon atom in point of compatibility with the Resin (D).

(B) Compound that can Generate Acid Upon Irradiation with Actinic Ray or Radiation The resist composition according to the invention contains a compound capable of generating an acid upon exposure to an actinic ray or radiation (which is also referred to as "a photo-acid generator" or "Component (B)").

The compound usable as such a photo-acid generator can be selected appropriately from photo-initiators for cationic photopolymerization, photo-initiators for radical photopolymerization, photodecoloring agents for dyes, photodiscoloring agents, compounds used in microresists and known to generate acids upon exposure to an actinic ray or radiation, or mixtures of two or more thereof.

Examples of such compounds include diazonium salts, phosphonium salts, sulfonium salts, iodonium salts, imide sulfonate, oxime sulfonate, diazodisulfone, disulfone and o-nitrobenzylsulfonate.

In addition, polymeric compounds having such groups or compounds as to generate acids upon exposure to an actinic ray or radiation in a state of being introduced in their main or side chains can also be used. Examples of those polymeric compounds include the compounds as disclosed in U.S. Pat. No. 3,849,137, German Patent No. 3914407, JP-A-63-26653, JP-A-55-164824, JP-A-62-69263, JP-A-63-146038, JP-A-63-163452, JP-A-62-153853 and JP-A-63-146029.

Further, the compounds capable of generating acids by the action of light as disclosed in U.S. Pat. No. 3,779,778 and European Patent No. 126,712 can be used too.

Of the compounds capable of decomposing upon irradiation with an actinic ray or radiation to generate acids, compounds represented by the following formulae (ZI), (ZII) and (ZIII) respectively are preferable.

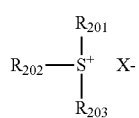
ZI

-continued

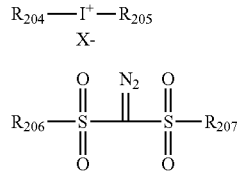
ZII

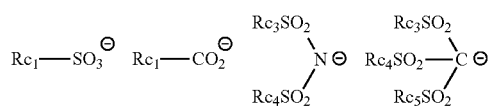
ZIII

In the formula (ZI), $R_{201}$, $R_{202}$ and $R_{203}$ each represent an organic group independently.

$X^-$ represents a non-nucleophilic anion, preferably a sulfonic acid anion, a carboxylic acid anion, a bis(alkylsulfonyl) amide anion, a tris(alkylsulfonyl)methide anion, $BF_4^-$, $PF_6^-$ or $SbF_6^-$, far preferably a carbon-containing organic anion.

Examples of an organic anion preferred as $X^-$ include organic anions represented by the following formulae.

$$Rc_1\!-\!\!SO_3^\ominus \quad Rc_1\!-\!\!CO_2^\ominus \quad \begin{matrix}Rc_3SO_2\\ \diagdown\\ \phantom{Rc_4SO_2}N\ominus\\ \diagup\\ Rc_4SO_2\end{matrix} \quad \begin{matrix}Rc_3SO_2\\ \diagdown\\ Rc_4SO_2\!-\!\!C\ominus\\ \diagup\\ Rc_5SO_2\end{matrix}$$

In the above formulae, $Rc_1$ represents an organic group.

Examples of the organic group as $Rc_1$ include groups containing 1 to 30 carbon atoms, preferably alkyl groups and aryl groups, which each may be substituted, and groups formed by connecting two or more of those groups via one or more of linkage groups, such as a single bond, —O—, —$CO_2$—, —S—, —$SO_3$— and —$SO_2N(Rd_1)$—. $Rd_1$ represents a hydrogen atom or an alkyl group.

$Rc_3$, $Rc_4$ and $Rc_5$ each represent an organic group independently. Examples of organic groups preferred as $Rc_3$, $Rc_4$ and $Rc_5$ include the same organic groups as the preferred of $Rc_1$, especially 1-4C perfluoroalkyl groups.

$Rc_3$ and $Rc_4$ may combine with each other to form a ring. The group formed by combining $Rc_3$ with $Rc_4$ is an alkylene group or an arylene group, preferably a 2-4C perfluoroalkylene group.

The organic groups particularly preferred as $Rc_1$, $Rc_3$, $Rc_4$ and $Rc_5$ each are alkyl groups substituted with fluorine atoms or fluoroalkyl groups at their respective 1-positions and phenyl groups substituted with fluorine atoms or fluoroalkyl groups. By containing a fluorine atom or a fluoroalkyl group, the acid generated by irradiation with light can have high acidity to result in enhancement of the sensitivity. Likewise, the ring formation by combination of $Rc_3$ and $Rc_4$ allows an acidity increase of the acid generated by irradiation with light to result in enhancement of the sensitivity.

The number of carbon atoms in the organic group as $R_{201}$, $R_{202}$ and $R_{203}$ each is generally from 1 to 30, preferably from 1 to 20.

Two of $R_{201}$ to $R_{203}$ may combine with each other to form a ring structure, and the ring formed may contain an oxygen atom, a sulfur atom, an ester linkage, an amide linkage or a carbonyl group. Examples of a group formed by combining two of $R_{201}$, $R_{202}$ and $R_{203}$ include alkylene groups (such as a butylene group and a pentylene group).

Examples of organic groups as $R_{201}$, $R_{202}$ and $R_{203}$ include their corresponding groups in compounds (ZI-1), (ZI-2) and (ZI-3) illustrated below.

Additionally, the photo-acid generator may be a compound having two or more of structures represented by formula (ZI). For instance, the photo-acid generator may be a compound having a structure that at least one of $R_{201}$, $R_{202}$ and $R_{203}$ in one compound represented by formula (ZI) is united with at least one of $R_{201}$, $R_{202}$ and $R_{203}$ in another compound represented by formula (ZI).

Far preferred examples of a compound (ZI) include compounds (ZI-1), (ZI-2) and (ZI-3) explained blow.

The compound (ZI-1) is an arylsulfonium compound represented by the formula (ZI) wherein at least one of $R_{201}$ to $R_{203}$ is an aryl group, namely a compound having an arylsulfonium as its cation.

In such an arylsulfonium compound, all of $R_{201}$ to $R_{203}$ may be aryl groups, or one or two of $R_{201}$ to $R_{203}$ may be aryl groups and the remainder may be an alkyl group or a cycloalkyl group.

Examples of such an arylsulfonium compound include a triarylsulfonium compound, a diarylalkylsulfonium compound, an aryldialkylsulfonium compound, a diarylcycloalkylsulfonium compound and an aryldicycloalkylsulfonium compound.

The aryl group in the arylsulfonium compound is preferably an aryl group, such as a phenyl group or a naphthyl group, or a hetroaryl group, such as an indole residue or a pyrrole residue, far preferably a phenyl group or an indole residue. When the arylsulfonium compound has two or more aryl groups, the two or more aryl groups may be the same or different.

One or two alkyl groups which the arylsulfonium compound has as required are preferably 1-15C straight-chain or branched alkyl groups, with examples including a methyl group, an ethyl group, a propyl group, an n-butyl group, a sec-butyl group and a t-butyl group.

One or two cycloalkyl groups which the arylsulfonium compound has as required are preferably 3-15C cycloalkyl groups, with examples including a cyclopropyl group, a cyclobutyl group and a cyclohexyl group.

The aryl group, the alkyl group or the cycloalkyl group represented by any of $R_{201}$ to $R_{203}$ may have as a substituent an alkyl group (containing, e.g., 1 to 15 carbon atoms), a cycloalkyl group (containing, e.g., 3 to 15 carbon atoms), an aryl group (containing, e.g., 6 to 14 carbon atoms), an alkoxyl group (containing, e.g., 1 to 15 carbon atoms), a halogen atom, a hydroxyl group or a phenylthio group. Suitable examples of such substituents include 1-12C straight-chain or branched alkyl groups, 3-12C cycloalkyl groups and 1-12C straight-chain, branched or cyclic alkoxyl groups. Of these substituents, 1-4C alkyl groups and 1-4C alkoxyl groups are preferred over the others. One of $R_{201}$ to $R_{203}$ may have such a substituent, or all of $R_{201}$ to $R_{203}$ may have such substituents. When $R_{201}$ to $R_{203}$ are aryl groups, it is preferable that such a substituent is situated in the p-position of each aryl group.

Then, the compound (ZI-2) is explained below.

The compound (ZI-2) is a compound represented by the formula (ZI) in which $R_{201}$ to $R_{203}$ each independently represent an organic group having no aromatic ring. The term "aromatic ring" as used herein is intended to also include aromatic rings containing hetero atoms.

The number of carbon atoms in an aromatic ring-free organic group as each of $R_{201}$ to $R_{203}$ is generally from 1 to 30, preferably from 1 to 20.

Each of $R_{201}$ to $R_{202}$ is preferably an alkyl group, a cycloalkyl group, an allyl group or a vinyl group, far preferably a straight-chain, branched or cyclic 2-oxoalkyl group, or an alkoxycarbonylmethyl group, particularly preferably a straight-chain or branched 2-oxoalkyl group.

The alkyl group as each of $R_{201}$ to $R_{203}$ may have either a straight-chain or branched form, and it is preferably a 1-10C straight-chain or branched group (e.g., a methyl group, an ethyl group, a propyl group, a butyl group, a pentyl group). The alkyl group as each of $R_{201}$ to $R_{203}$ is far preferably a straight-chain or branched 2-oxoalkyl group, or an alkoxycarbonylmethyl group.

The cycloalkyl group as each of $R_{201}$ to $R_{203}$ is preferably a 3-10C cycloalkyl group (e.g., a cyclopentyl group, a cyclohexyl group, a norbornyl group). The cycloalkyl group as each of $R_{201}$ to $R_{203}$ is far preferably a cyclic 2-oxoalkyl group.

Examples of a straight-chain, branched or cyclic 2-oxoalkyl group suitable as each of $R_{201}$ to $R_{203}$ include the groups having >C=O in the 2-positions of the alkyl or cycloalkyl groups recited above.

The alkoxy moiety in an alkoxycarbonylmethyl group as each of $R_{201}$ to $R_{203}$ is preferably a 1-5C alkoxyl group (such as a methoxy, ethoxy, propoxy, butoxy or pentoxy group).

Each of groups represented by $R_{201}$ to $R_{203}$ may further be substituted with a halogen atom, an alkoxyl group (containing, e.g., 1 to 5 carbon atoms), a hydroxyl group, a cyano group or a nitro group.

The compound (ZI-3) is a compound represented by the following formula (ZI-3), namely a compound having a phenacylsulfonium salt structure.

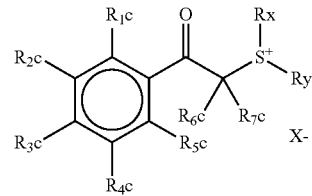

(ZI-3)

In the formula (ZI-3), $R_{1c}$ to $R_{5c}$ each represent a hydrogen atom, an alkyl group, a cycloalkyl group, an alkoxyl group or a halogen atom independently.

$R_{6c}$ and $R_{7c}$ each represent a hydrogen atom, an alkyl group or a cycloalkyl group independently.

$R_x$ and $R_y$ each represent an alkyl group, a cycloalkyl group, an allyl group or a vinyl group independently.

Any two or more of $R_{1c}$ to $R_{7c}$ may combine with one another to form a ring structure, and $R_x$ and $R_y$ may also combine with each other to form a ring structure. In such a ring structure, an oxygen atom, a sulfur atom, an ester linkage or an amide linkage may be contained. The group formed by combining any two or more of $R_{1c}$ to $R_{7c}$ or by combining $R_x$ and $R_y$ may be a butylene group or a pentylene group.

$X^-$ represents a non-nucleophilic anion, and examples thereof include the same non-nucleophilic anions as examples of $X^-$ in formula (ZI) include.

The alkyl group as each of $R_{1c}$ to $R_{7c}$ may have either a straight-chain form or a branched form, and suitable examples thereof include 1-20C straight-chain or branched alkyl groups, preferably 1-12C straight-chain or branched alkyl groups (e.g., a methyl group, an ethyl group, a straight-chain or branched propyl group, straight-chain or branched butyl groups, straight-chain or branched pentyl groups).

Suitable examples of the cycloalkyl group as each of $R_{1c}$ to $R_{7c}$ include 3-8C cycloalkyl groups (e.g., a cyclopentyl group, a cyclohexyl group).

The alkoxyl group as each of $R_{1c}$ to $R_{5c}$ may have either a straight-chain form, or a branched form, or a cyclic form, and examples thereof include 1-10C alkoxyl groups, preferably 1-5C straight-chain and branched alkoxyl groups (e.g., a methoxy group, an ethoxy group, a straight-chain or branched propoxy group, straight-chain or branched butoxy groups, straight-chain or branched pentoxy groups) and 3-8C cycloalkoxyl groups (e.g., a cyclopentyloxy group, a cyclohexyloxy group).

It is preferable that any of $R_{1c}$ to $R_{5c}$ is a straight-chain or branched alkyl group, a cycloalkyl group, or a straight-chain, branched or cyclic alkoxyl group, and it is far preferable that the number of total carbon atoms in $R_{1c}$ to $R_{5c}$ is from 2 to 15. By meeting these requirements, the solvent solubility can be enhanced, and development of particles during storage can be prevented.

Examples of the alkyl group as each of $R_x$ and $R_y$ include the same groups as examples of the alkyl group as each of $R_{1c}$ to $R_{7c}$ include, preferably straight-chain and branched 2-oxoakyl groups and alkoxycarbonylmethyl groups.

Examples of the cycloalkyl group as each of $R_x$ and $R_y$ include the same groups as examples of the cycloalkyl group as each of $R_{1c}$ to $R_{7c}$ include, preferably cyclic 2-oxoakyl groups.

Examples of the straight-chain, branched and cyclic 2-oxoalkyl groups include the groups having >C=O at the 2-positions of the alkyl or cycloalkyl groups as $R_{1c}$ to $R_{7c}$.

Examples of the alkoxy moiety in the alkoxycarbonylmethyl group includes the same alkoxyl groups as $R_{1c}$ to $R_5$ each may represent.

Each of $R_x$ and $R_y$ is preferably an alkyl group containing at least 4 carbon atoms, far preferably an alkyl group containing at least 6 carbon atoms, further preferably an alkyl group containing at least 8 carbon atoms.

In the formulae (ZII) and VIM, $R_{204}$ to $R_{207}$ each represent an aryl group, an alkyl group or a cycloalkyl group independently.

The aryl group as each of $R_{204}$ to $R_{207}$ is preferably a phenyl group or a naphthyl group, far preferably a phenyl group.

The alkyl group as each of $R_{204}$ to $R_{207}$ may have either a straight-chain form or a branched form, with suitable examples including 1-10C straight-chain and branched alkyl groups (e.g., a methyl group, an ethyl group, a propyl group, a butyl group, a pentyl group).

The cycloalkyl group as each of $R_{204}$ to $R_{207}$ is preferably a 3-10C cycloalkyl group (e.g., a cyclopentyl group, a cyclohexyl group, a norbornyl group).

The groups represented by $R_{204}$ to $R_{207}$ may have substituents. Examples of such substituents include alkyl groups (e.g., those containing 1 to 15 carbon atoms), cycloalkyl groups (e.g., those containing 3 to 15 carbon atoms), aryl groups (e.g., those containing 6 to 15 carbon atoms), alkoxyl groups (e.g., those containing 1 to 15 carbon atoms), halogen atoms, a hydroxyl group and a phenylthio group.

$X^-$ represents a non-nucleophilic anion, and examples thereof include the same non-nucleophilic anions as the $X^-$ in the formula (ZI) can represent.

Of the compounds capable of generating an acid upon irradiation with an actinic ray or radiation, compounds represented by the following formulae (ZIV), (ZV) and (ZVI) can be preferred examples.

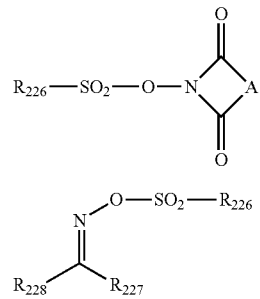

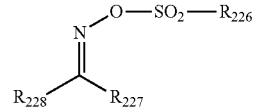

In the formulae (ZIV) to (ZVI), $Ar_3$ and $Ar_4$ each represent an aryl group independently.

$R_{226}$ represents an alkyl group, a cycloalkyl group or an aryl group.

$R_{227}$ and $R_{228}$ each represent an alkyl group, a cycloalkyl group, an aryl group or an electron-attracting group. $R_{227}$ is preferably an aryl group. $R_{228}$ is preferably an electron-attracting group, far preferably a cyano group or a fluoroalkyl group.

A represents an alkylene group, an alkenylene group or an arylene group.

Of the compounds capable of generating acids upon irradiation with an actinic ray or radiation, the compounds represented by (ZI) to (ZIII) are preferred to the others.

The Compound (B) is preferably a compound capable of generating an aliphatic sulfonic acid having a fluorine atom or atoms or a benzenesulfonic acid having a fluorine atom or atoms upon irradiation with an actinic ray or radiation.

It is preferable that the Compound (B) has a triphenylsulfonium structure.

It is far preferable that the Compound (B) is a triphenylsulfonium salt compound having in its cation part an alkyl or cycloalkyl group free of fluorine substituent.

Examples of particularly preferred ones among the compounds capable of generating acids upon irradiation with an actinic ray or radiation are illustrated below.

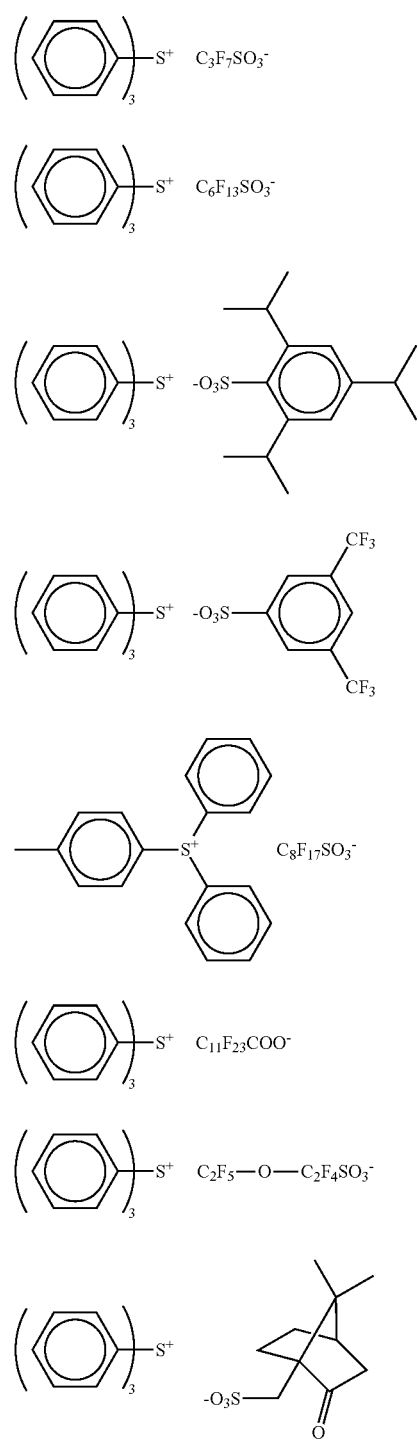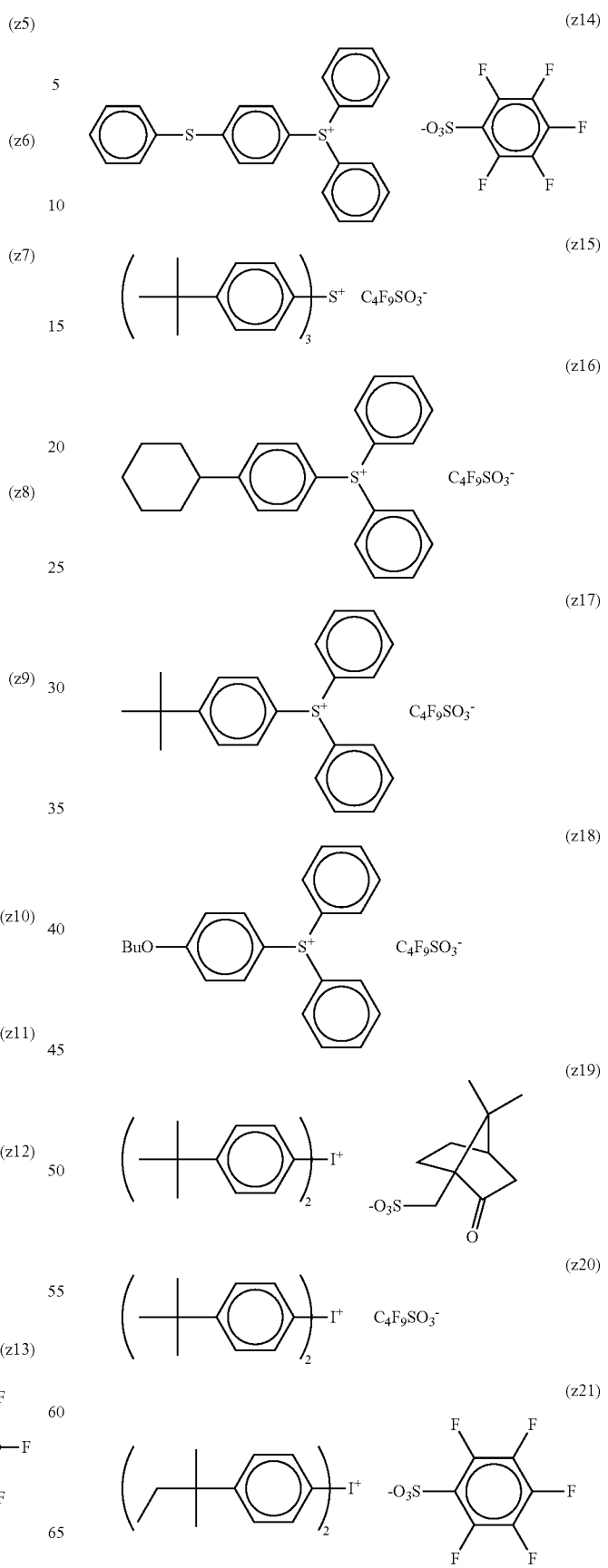

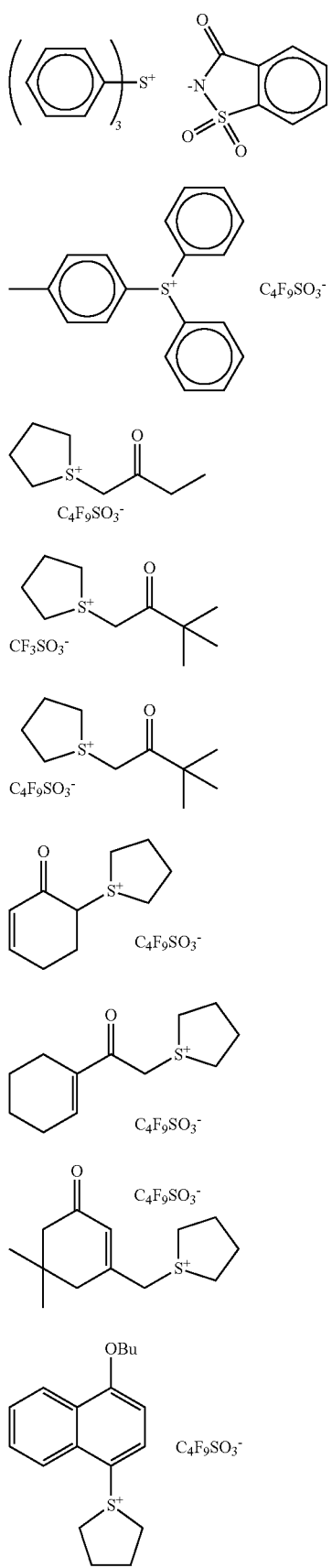
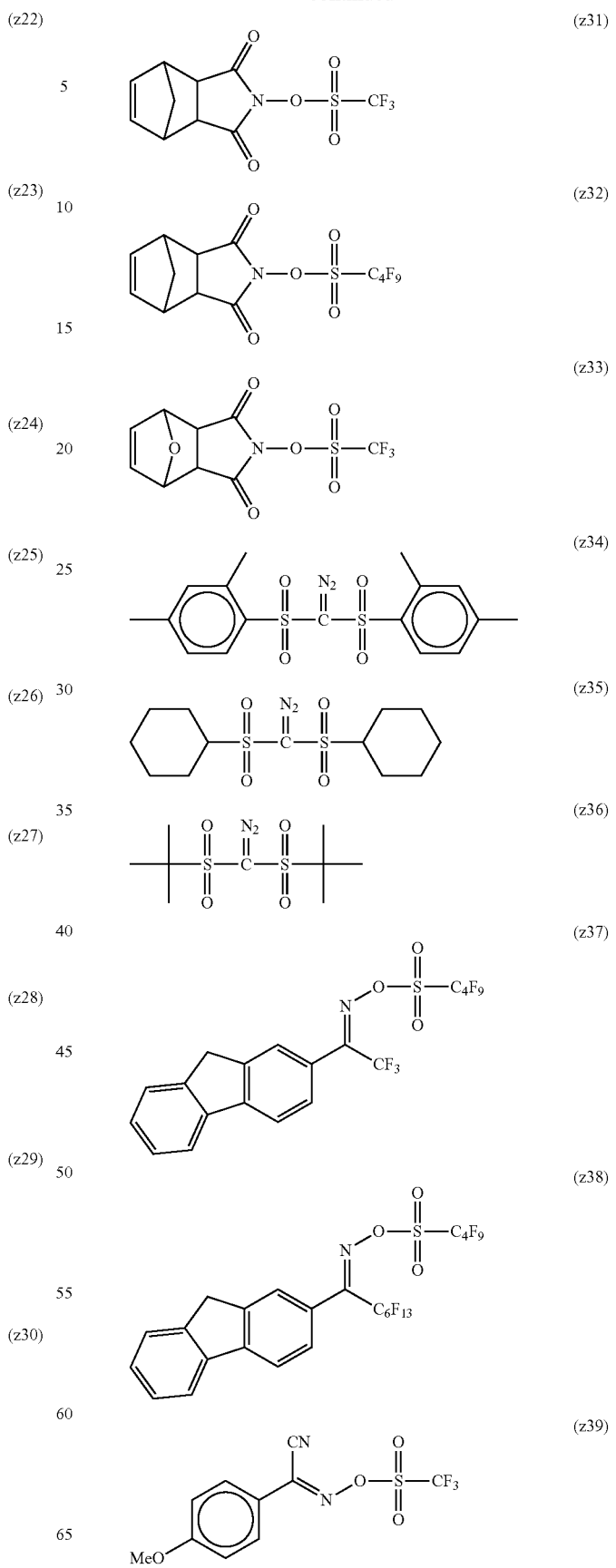

-continued
(z40)
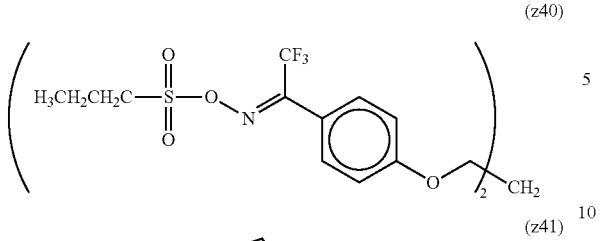
(z41)
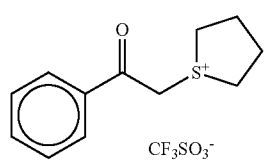
(z42)
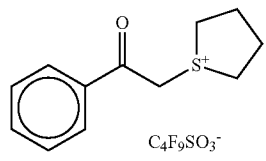
(z43)
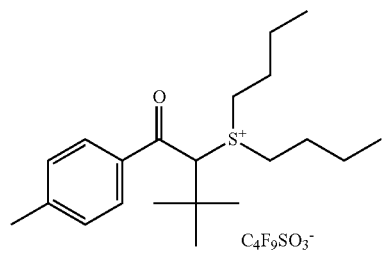
(z44)
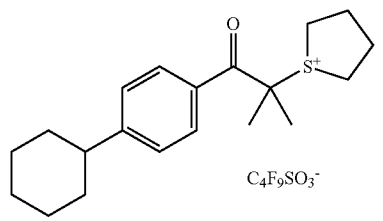
(z45)
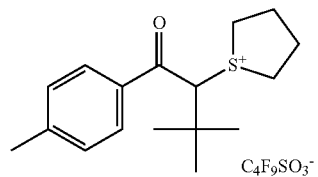
(z46)
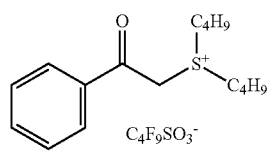
(z47)
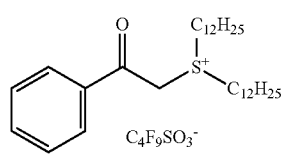
-continued
(z48)
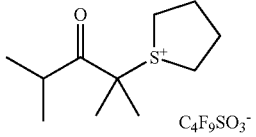
(z49)
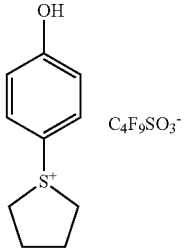
(z50)
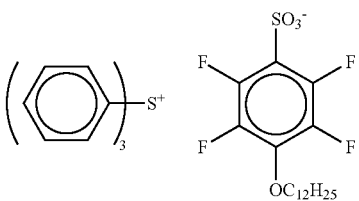
(z51)
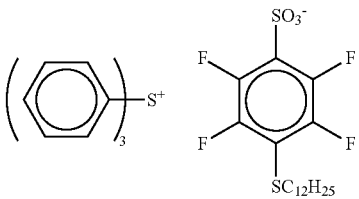
(z52)
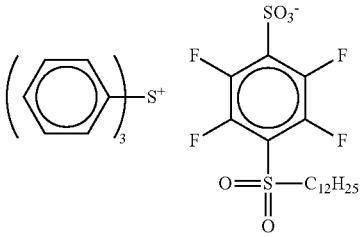
(z53)
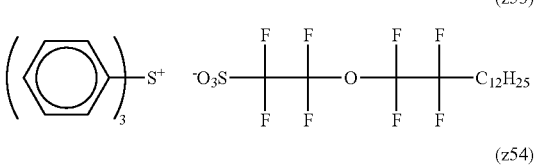
(z54)
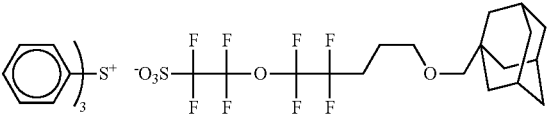
(z55)
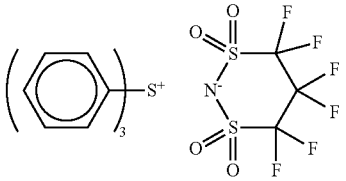

(z56) 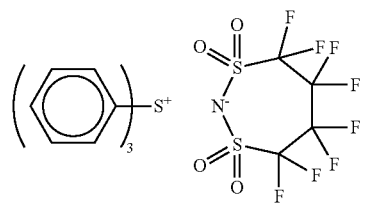
(z57) 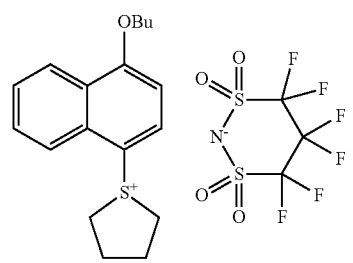
(z58) 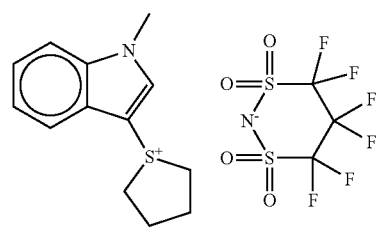
(z59) 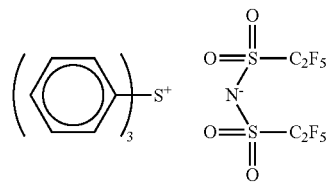
(z60) 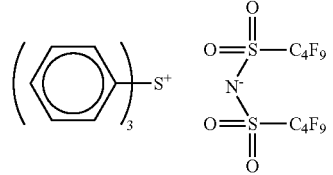
(z61) 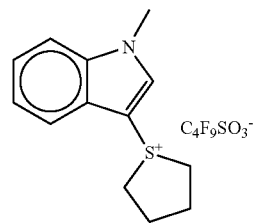
(z62) 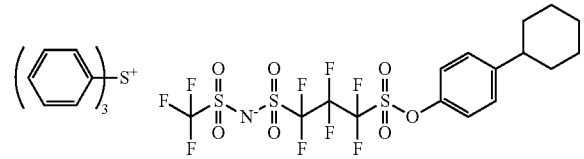
(z63) 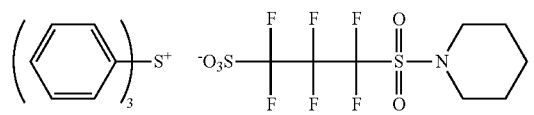
(z64) 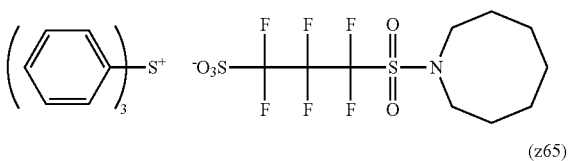
(z65) 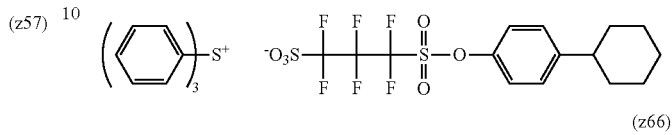
(z66) 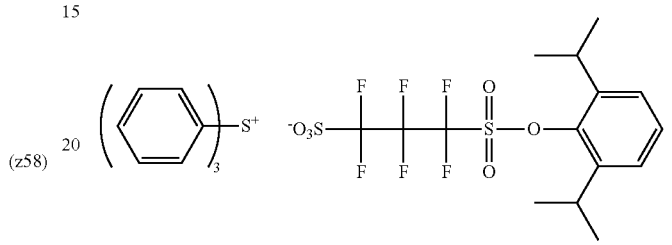
(z67) 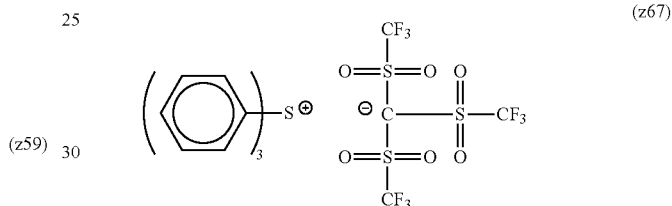
(z68) 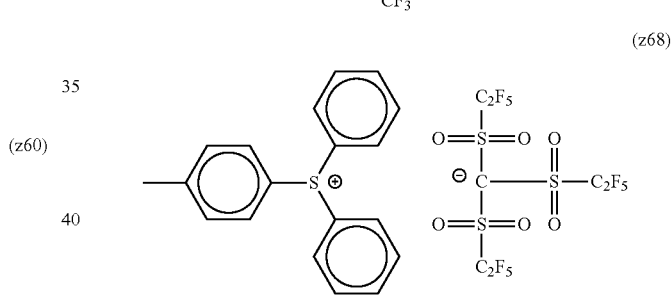
(z69) 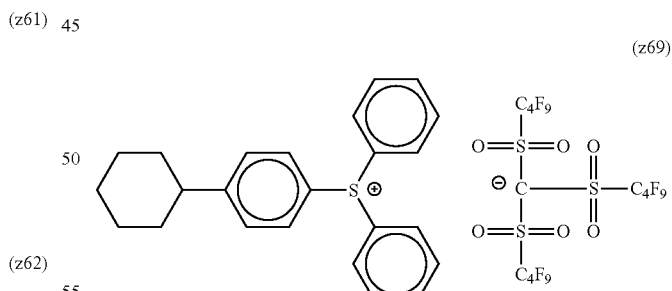
(z70) 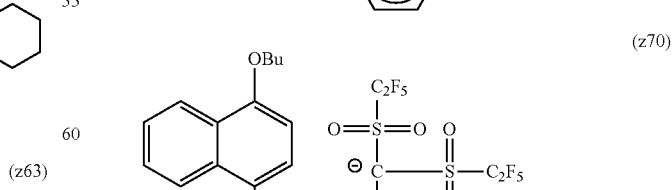
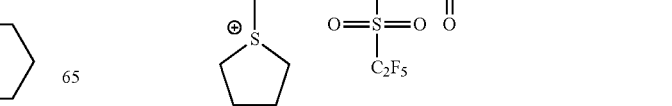

-continued (z71) 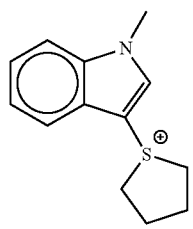 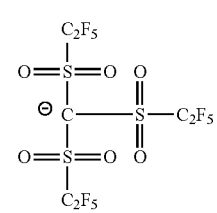

(z72) 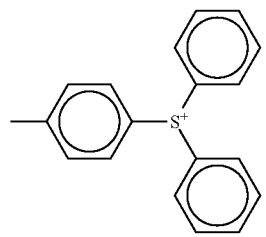 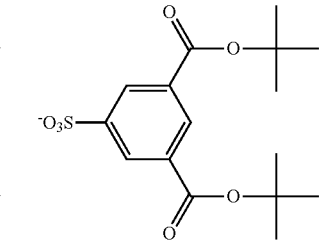

(z73) 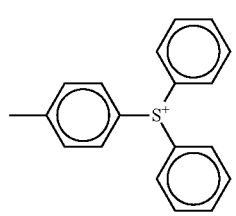 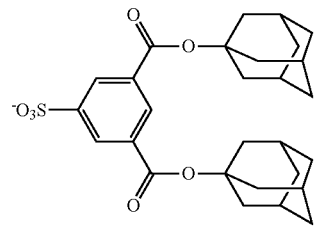

(z74) 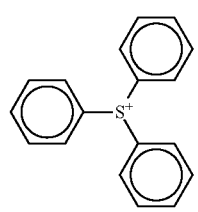 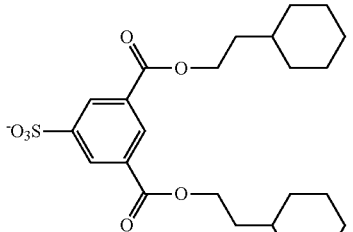

(z75) 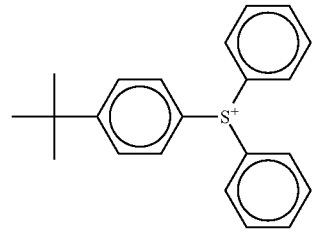 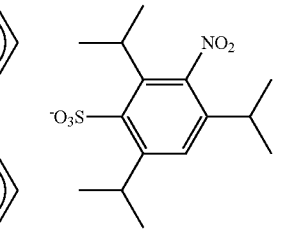

(z76) 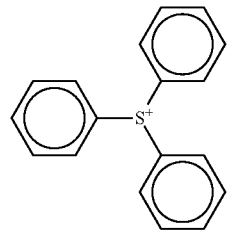 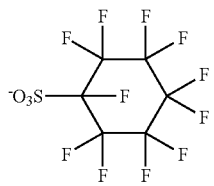

-continued (z77) 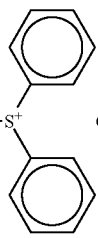

(z78) 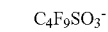

Photo-acid generators can be used alone or as combinations of two or more thereof. When two or more types of photo-acid generators are used in combination, it is preferable to combine compounds which can generate two types of organic acids differing by at least two in the total number of constituent atoms except hydrogen atoms.

The content of photo-acid generators is preferably from 0.1 to 20 mass %, far preferably from 0.5 to 10 mass %, further preferably from 1 to 7 mass %, based on the total solids in the resist composition. By adjusting the content of photo-acid generators to fall within the foregoing range, the exposure latitude at the time of resist pattern formation can be improved and the crosslinking reactivity with materials for forming a cross-linked layer can be increased.

(C) Solvent

Examples of a solvent which can be used in dissolving each of the ingredients to prepare a resist composition include organic solvents, such as an alkylene glycol monoalkyl ether carboxylate, an alkylene glycol monoalkyl ether, an alkyl lactate, an alkyl alkoxypropionate, a 4-10C cyclic lactone, a 4-10C monoketone compound which may contain a ring, an alkylene carbonate, an alkyl alkoxyacetate and an alkyl pyruvate.

Suitable examples of an alkylene glycol monoalkyl ether carbonate include propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate, and ethylene glycol monoethyl ether acetate.

Suitable examples of an alkylene glycol monoalkyl ether include propylene glycol monomethyl ether, propylene glycol monoethyl ether, propylene glycol monopropyl ether, propylene glycol monobutyl ether, ethylene glycol monomethyl ether, and ethylene glycol monoethyl ether.

Suitable examples of an alkyl lactate include methyl lactate, ethyl lactate, propyl lactate, and butyl lactate.

Suitable examples of an alkyl alkoxypropionate include ethyl 3-ethoxypropionate, methyl 3-methoxypropionate, methyl 3-ethoxypropionate, and ethyl 3-methoxypropionate.

Suitable examples of a 4-10C cyclic lactone include β-propiolactone, β-butyrolactone, γ-butyrolactone, α-methyl-γ-butyrolactone, β-methyl-γ-butyrolactone, γ-valerolactone, γ-caprolactone, γ-octanoic lactone, and α-hydroxy-γ-butyrolactone.

Suitable examples of a 4-10C monoketone compound which may contain a ring include 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexene-2-one, 3-pentene-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, and 3-methylcycloheptanone.

Suitable examples of an alkylene carbonate include propylene carbonate, vinylene carbonate, ethylene carbonate, and butylene carbonate.

Suitable examples of an alkyl alkoxyacetate include acetate-2-methoxyethyl, acetate-2-ethoxyethyl, acetate-2-(2-ethoxyethoxy)ethyl, acetate-3-methoxy-3-methylbutyl, and acetate-1-methoxy-2-propyl.

Suitable examples of an alkyl pyruvate include methyl pyruvate, ethyl pyruvate, and propyl pyruvate.

Examples of a solvent used to advantage include solvents having boiling points of 130° C. or above at ordinary temperatures and under normal atmospheric pressure. More specifically, such solvents include cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, acetate-2-ethoxyethyl, acetate-2-(2-ethoxyethoxy)ethyl and propylene carbonate.

In the invention, the solvents recited above may be used alone or as combinations of two or more thereof.

The solvent used in the invention may also be a mixture of a solvent having a hydroxyl group in its structure and a solvent having no hydroxyl group.

Examples of a solvent having a hydroxyl group include ethylene glycol, ethylene glycol monomethyl ether, ethylene glycol monoethyl ether, propylene glycol, propylene glycol monomethyl ether, propylene glycol monoethyl ether, and ethyl lactate. Of these solvents, propylene glycol monomethyl ether and ethyl lactate are especially preferred to the others.

Examples of a solvent having no hydroxyl group include propylene glycol monomethyl ether acetate, ethyl ethoxypropionate, 2-heptanone, γ-butyrolactone, cyclohexanone, butyl acetate, N-methylpyrrolidone, N,N-dimethylacetamide, and dimethyl sulfoxide. Of these solvents, propylene glycol monomethyl ether acetate, ethyl ethoxypropionate, 2-heptanone, γ-butyrolactone, cyclohexanone and butyl acetate are far preferred to the others, and propylene glycol monomethyl ether acetate, ethyl ethoxypropionate and 2-heptanone are used to particular advantage.

The mixing ratio (by mass) between the solvent containing a hydroxyl group and the solvent containing no hydroxyl group is from 1/99 to 99/1, preferably from 10/90 to 90/10, far preferably from 20/80 to 60/40. A mixed solvent containing a solvent having no hydroxyl group in a proportion of 50 weight % or above is particularly preferred from the viewpoint of coating evenness.

The solvent is preferably a solvent mixture of two or more kinds of solvents including propylene glycol monomethyl ether acetate.

The solids concentration in the present resist composition in a state of being dissolved in a solvent is generally from 1.0 to 10 mass %, preferably from 2.0 to 5.7 mass %, far preferably from 2.0 to 5.3 mass %. The term "solids concentration" as used in the invention refers to the percentage by mass of the total mass of all resist's ingredients except solvent to the gross mass of the resist composition.

By adjusting the solids concentration to the range specified above, the resist solution can be applied evenly to the surface of a substrate, and besides, it becomes possible to form resist patterns whose line edge roughness is in a standout condition. Reasons for producing such effects are not clear, but it is probably conceivable that aggregation of ingredients in the resist solution is inhibited by controlling solids concentration to 10 mass % or below, preferably 5.7 mass % or below; as a result, uniform resist film is formed.

(D) Resin Having at Least Either Fluorine or Silicon Atom

The resist composition for negative development according to the invention preferably contains (D) a resin having at least either a fluorine atom or a silicon atom (Resin (D)).

The fluorine atoms or silicon atoms in Resin (D) may be present in the resin's main chain, or they may constitute substituents in side chains.

The Resin (D) is preferably a resin having fluorinated alkyl groups, fluorinated cycloalkyl groups or fluorinated aryl groups as fluorine-containing partial structures.

The fluorinated alkyl group (preferably containing 1 to 10 carbon atoms, far preferably containing 1 to 4 carbon atoms) is a straight-chain or branched alkyl group at least one hydrogen of which is substituted with a fluorine atom, which may further have another substituent.

The fluorinated cycloalkyl group is a mononuclear or polynuclear cycloalkyl group at least one hydrogen of which is substituted with a fluorine atom, which may further have another substituent.

The fluorinated aryl group is an aryl group, such as a phenyl group or a naphthyl group, at least one hydrogen of which is substituted with a fluorine atom, which may further have another substituent.

Examples of a fluorinated alkyl group, a fluorinated cycloalkyl group and a fluorinated aryl group are illustrated below, but these examples should not be construed as limiting the scope of the invention.

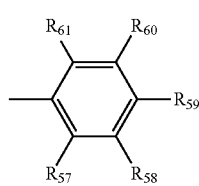

(f2)

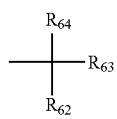

(f3)

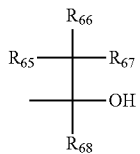

(f4)

In the formulae (f2) to (f4), $R_{57}$ to $R_{68}$, which are mutually independent, each represent a hydrogen atom, a fluorine atom or an alkyl group, provided that at least one of $R_{57}$ to $R_{61}$, at least one of $R_{62}$ to $R_{64}$, and at least one of $R_{65}$ to $R_{68}$ are each a fluorine atom or an alkyl group (preferably containing 1 to 4 carbon atoms) at least one hydrogen of which is substituted with a fluorine atom. Herein, it is preferable that all of $R_{57}$ to $R_{61}$ and all of $R_{65}$ to $R_{67}$ are fluorine atoms. Each of $R_{62}$, $R_{63}$ and $R_{68}$ is preferably an alkyl group (preferably containing 1 to 4 carbon atoms) at least one hydrogen of which is substituted with a fluorine atom, far preferably a perfluoroalkyl group containing 1 to 4 carbon atoms. $R_{62}$ and $R_{63}$ may combine with each other to form a ring.

The Resin (D) preferably has groups represented by the following formula (F3a) as its partial structures.

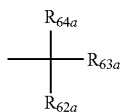

(F3a)

In the formula (F3a), $R_{62a}$ and $R_{63a}$, which are mutually independent, each represent an alkyl group at least one hydrogen of which is substituted with a fluorine atom. $R_{62a}$ and $R_{63a}$ may combine with each other to form a ring.

$R_{64a}$ represents a hydrogen atom, a fluorine atom or an alkyl group.

Examples of a group represented by the formula (f2) include a p-fluorophenyl group, a pentafluorophenyl group and a 3,5-di(trifluoromethyl)phenyl group.

Examples of a group represented by the formula (f3) include a trifluoroethyl group, a pentafluoropropyl group, a pentafluoroethyl group, a heptafluorobutyl group a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-t-butyl group, a perfluoroisopentyl group, a perfluorooctyl group, a perfluoro(trimethyl)hexyl group, a 2,2,3,3-tetrafluorocyclobutyl group and a perfluorocyclohexyl group. Of these groups, hexafluoroisopropyl, heptafluoroisopropyl, hexafluoro(2-methyl)isopropyl, octafluoroisobutyl, nonafluoro-t-butyl and perfluoroisopentyl groups are preferable to the others, and hexafluoroisopropyl and heptafluoroisopropyl groups are far preferred over the others.

Examples of a group represented by the formula (f4) include —C(CF$_3$)$_2$OH, —C(C$_2$F$_5$)$_2$OH, —C(CF$_3$)(CH$_3$)OH and —CH(CF$_3$)OH. Of these groups, —C(CF$_3$)$_2$OH is preferred over the others.

It is also preferable that the Resin (D) is a resin having as its silicon-containing partial structures alkylsilyl structures (preferably trialkylsilyl groups) or cyclic siloxane structures.

Examples of an alkylsilyl or a cyclic siloxane structure include groups represented by the following formulae (CS-1) to (CS-3).

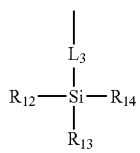

(CS-1)

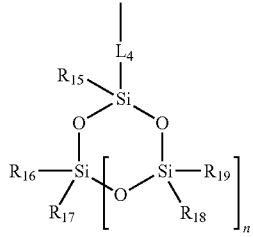

(CS-2)

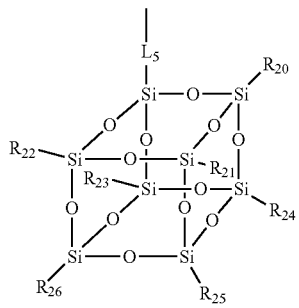

(CS-3)

In the formulae (CS-1) to (CS-3), $R_{12}$ to $R_{26}$, which are mutually independent, each represent a straight-chain alkyl group (preferably containing 1 to 20 carbon atoms), or a branched alkyl or cycloalkyl group (preferably containing 3 to 20 carbon atoms).

$L_3$ to $L_5$ each represent a single bond or a divalent linkage group. Examples of such a divalent linkage group include an alkylene group, a phenylene group, an ether group, a thioether group, a carbonyl group, an ester group, an amide group, an urethane group, an urea group, and combinations of two or more of the groups recited above.

n represents an integer of 1 to 5.

The Resin (D) is preferably a resin having repeating units of at least one kind selected from among those represented by the following formulae (C-I) to (C-IV).

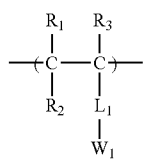

(C-I)

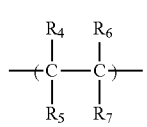

(C-II)

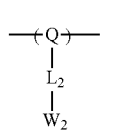

(C-III)

-continued

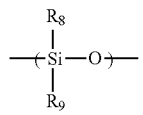
(C-IV)

In the formulae (C-I) to (C-IV), $R_1$ to $R_3$, which are mutually independent, each represent a hydrogen atom, a fluorine atom, a 1-4C straight-chain or branched alkyl group, or a 1-4C straight-chain or branched fluoroalkyl group.

$W_1$ and $W_2$ each represent an organic group having at least either a fluorine or silicon atom.

$R_4$ to $R_7$, which are mutually independent, each represent a hydrogen atom, a fluorine atom, a 1-4C straight-chain or branched alkyl group, or a 1-4C straight-chain or branched fluoroalkyl group; however at least one of the substituents $R_4$ to $R_7$ is required to be a fluorine atom. Alternatively, $R_4$ and $R_5$, or $R_6$ and $R_7$ may combine with each other to form a ring.

$R_8$ represents a hydrogen atom, or a 1-4C straight-chain or branched alkyl group.

$R_9$ represents a 1-4C straight-chain or branched alkyl group, or a 1-4C straight-chain or branched fluoroalkyl group.

$L_1$ and $L_2$ each represent a single bond or a divalent linkage group, which each have the same meaning as the foregoing $L_3$ to $L_5$ each have.

Q represents a mononuclear or polynuclear cyclic aliphatic group. More specifically, it represents atoms including two carbon atoms bonded together (C—C) and forming an alicyclic structure.

The formula (C-I) is far preferably any of the following formulae (C-Ia) to (C-Id).

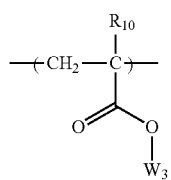
(C-Ia)

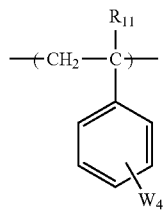
(C-Ib)

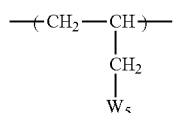
(C-Ic)

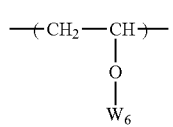
(C-Id)

In the formulae (C-Ia) to (C-Id), $R_{10}$ and $R_{11}$ each represent a hydrogen atom, a fluorine atom, a 1-4C straight-chain or branched alkyl group or a 1-4C straight-chain or branched fluoroalkyl group.

$W_3$ to $W_6$ each represent an organic group having at least either one or more fluorine atoms, or one or more silicon atoms.

When $W_1$ to $W_6$ are fluorine-containing organic groups, each organic group is preferably a 1-20C straight-chain, branched or cyclic fluorinated alkyl group or cyclo alkyl group, or a 1-20C straight-chain, branched or cyclic fluorinated alkyl ether group.

Examples of the fluorinated alkyl group of $W_1$ to $W_6$ each include a trifluoroethyl group, a pentafluoropropyl group, a hexafluoroisopropyl group, a hexafluoro(2-methyl)isopropyl group, a heptafluorobutyl group, a heptafluoroisopropyl group, an octafluoroisobutyl group, a nonafluorohexyl group, a nonafluoro-t-butyl group, a perfluoroisopentyl group, a perfluorooctyl group and a perfluoro(trimethyl)hexyl group.

When $W_1$ to $W_6$ are silicon-containing organic groups, each organic group preferably has an alkylsilyl or cyclic siloxane structure. Examples of such a group include groups represented by the formulae (CS-1), (CS-2) and (CS-3).

Examples of a repeating unit represented by the formula (C-I) are illustrated below. In the following structural formulae, X represents a hydrogen atom, —$CH_3$, —F or —$CF_3$.

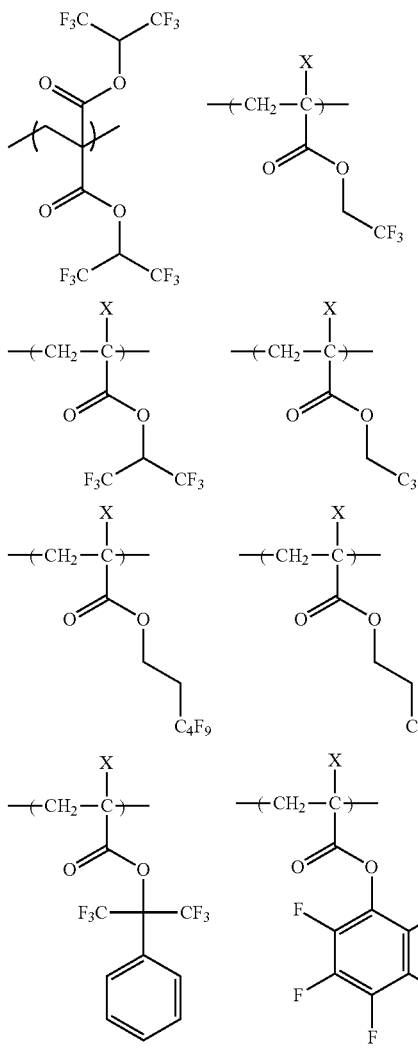

-continued
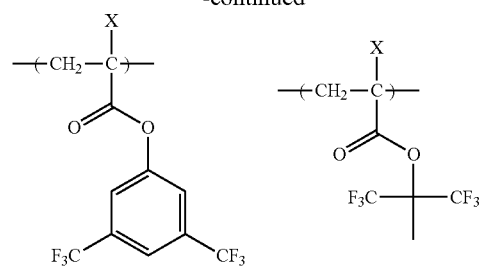
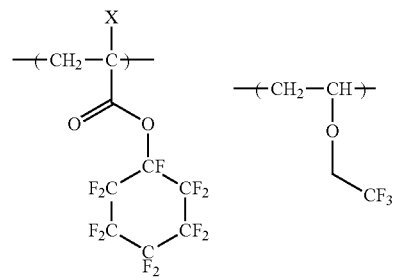
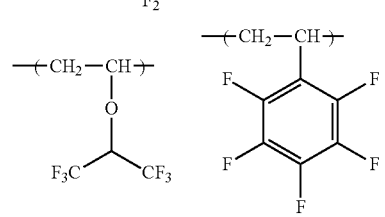
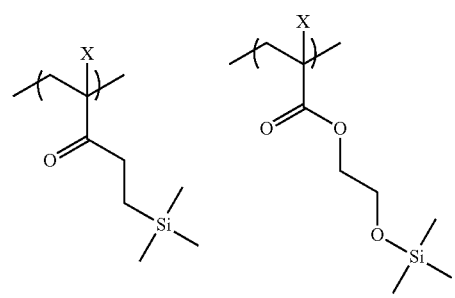
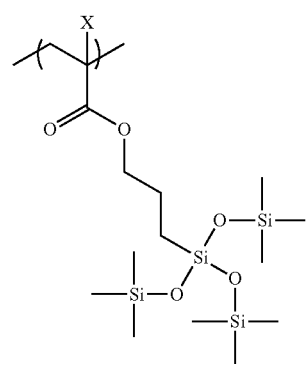
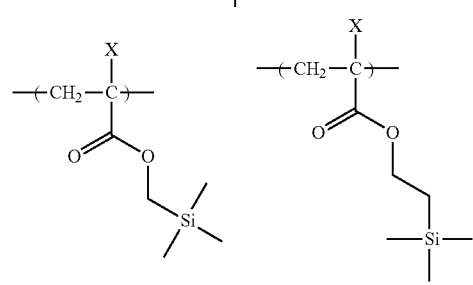
-continued
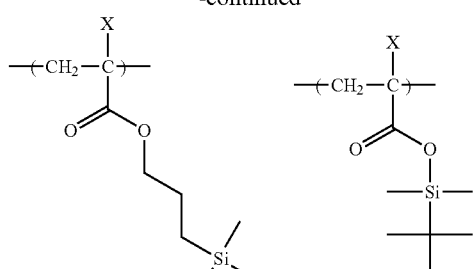
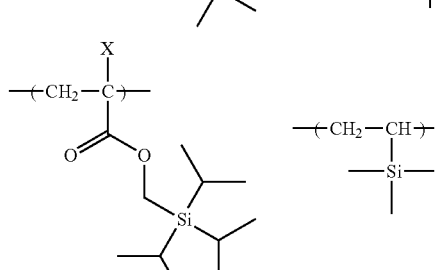
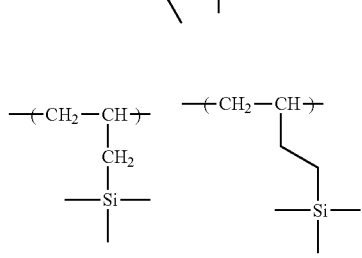
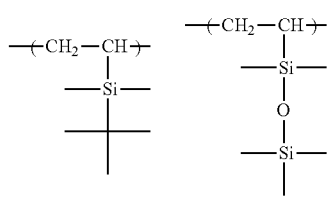
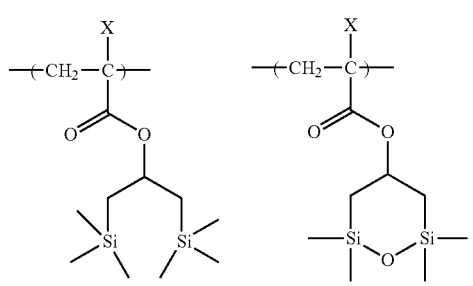
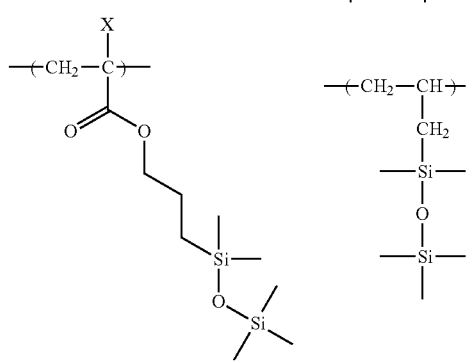

-continued

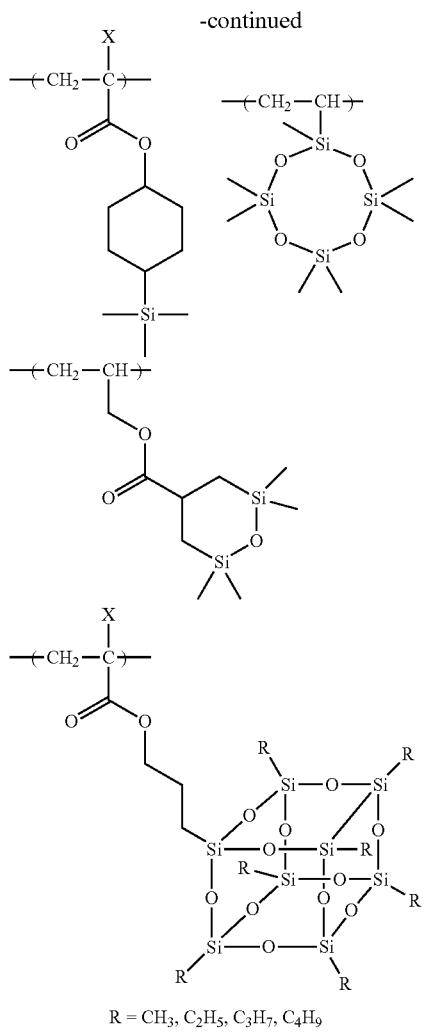

R = CH$_3$, C$_2$H$_5$, C$_3$H$_7$, C$_4$H$_9$

The Resin (D) is preferably a resin selected from the following resins (D-1) to (D-6).

(D-1): A resin that has (a) repeating units containing fluoroalkyl groups (preferably 1-4C fluoroalkyl groups), far preferably a resin having only the repeating units (a).

(D-2): A resin that has (b) repeating units containing trialkylsilyl groups or cyclic siloxane structures, far preferably a resin having only the repeating units (b), (D-3): A resin that has (a) repeating units containing fluoroalkyl groups (preferably 1-4C fluoroalkyl groups) and (c) repeating units containing branched alkyl groups (preferably 4-20C branched alkyl groups), cycloalkyl groups (preferably 4-20C cycloalkyl groups), branched alkenyl groups (preferably 4-20C branched alkenyl groups), cycloalkenyl groups (preferably 4-20C cycloalkyl groups) or aryl groups (preferably 4-20C aryl groups), far preferably a copolymer resin constituted of the repeating units (a) and the repeating units (c).

(D-4): A resin that has (b) repeating units containing trialkylsilyl groups or cyclic siloxane structures and (c) repeating units containing branched alkyl groups (preferably 4-20C branched alkyl groups), cycloalkyl groups (preferably 4-20C cycloalkyl groups), branched alkenyl groups (preferably 4-20C branched alkenyl groups), cycloalkenyl groups (preferably 4-20C cycloalkyl groups) or aryl groups (preferably 4-20C aryl groups), far preferably a copolymer resin constituted of the repeating units (b) and the repeating units (c).

(D-5) A resin that has (a) repeating units containing fluoroalkyl groups (preferably 1-4C fluoroalkyl groups) and (b) repeating units containing trialkylsilyl groups or cyclic siloxane structures, far preferably a copolymer resin constituted of the repeating units (a) and the repeating units (b).

(D-6): A resin that has (a) repeating units containing fluoroalkyl groups (preferably 1-4C fluoroalkyl groups), (b) repeating units containing trialkylsilyl groups or cyclic siloxane structures and (c) repeating units containing branched alkyl groups (preferably 4-20C branched alkyl groups), cycloalkyl groups (preferably 4-20C cycloalkyl groups), branched alkenyl groups (preferably 4-20C branched alkenyl groups), cycloalkenyl groups (preferably 4-20C cycloalkyl groups) or aryl groups (preferably 4-20C aryl groups), far preferably a copolymer resin constituted of the repeating units (a), the repeating units (b) and the repeating units (c).

Into the repeating units (c) which contain branched alkyl groups, cycloalkyl groups, branched alkenyl groups, cycloalkenyl groups or aryl groups and are constituents of each of the resins (D-3), (D-4) and (D-6), appropriate functional groups can be introduced with consideration given to a balance between hydrophilic and hydrophobic properties and mutual interactivity. However, it is preferred in point of receding contact angle that the functional groups introduced be polar group-free functional groups.

In the resins (D-3), (D-4) and (D-6), the proportion of fluoroalkyl-containing repeating units (a), or the proportion of trialkylsilyl- or cyclic siloxane-containing repeating units (b), or the total proportion of the repeating units (a) and the repeating units (b) is preferably from 20 to 99 mole %.

The Resin (D) is preferably a resin having repeating units represented by the following formula (Ia).

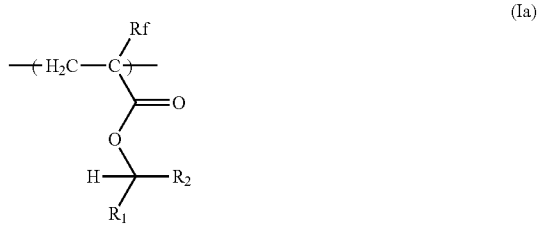

(Ia)

In the formula (Ia), Rf represents a hydrogen atom, a fluorine atom or an alkyl group at least one hydrogen atom of which is substituted with a fluorine atom.

R$_1$ represents an alkyl group.

R$_2$ represents a hydrogen atom or an alkyl group.

The alkyl group at least one hydrogen atom of which is substituted with a fluorine atom, which is represented by Rf in the formula (Ia), preferably contains 1 to 3 carbon atoms, and it is far preferably a trifluoromethyl group.

The alkyl group of R$_1$ in the formula (Ia) is preferably a 3-10C straight-chain or branched alkyl group, far preferably a 3-10C branched alkyl group.

The alkyl group of R$_2$ in the formula (Ia) is preferably a 1-10C straight-chain or branched alkyl group.

Examples of a repeating unit represented by the formula (Ia) are illustrated below, but these examples should not be construed as limiting the scope of the invention. X in the following structural formulae each represents a hydrogen atom, a fluorine atom or a trifluoromethyl group (—CF$_3$).

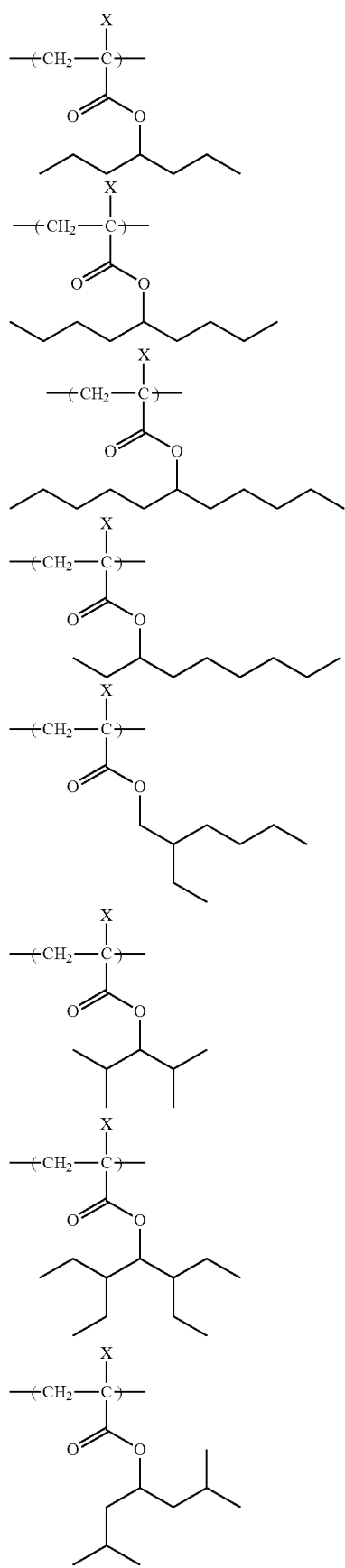
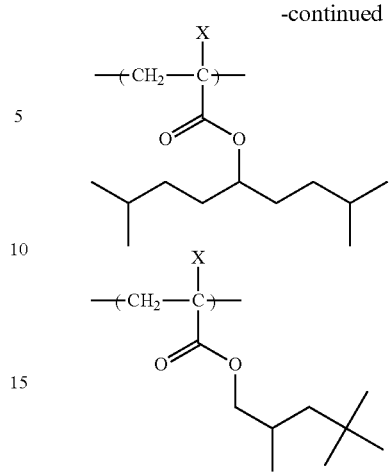

The repeating units represented by the formula (Ia) can be formed by polymerizing a compound represented by the following formula (I).

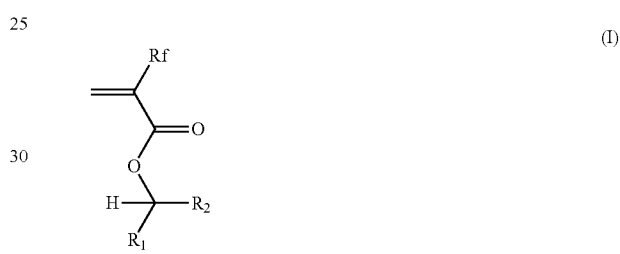

In the formula (I), Rf represents a hydrogen atom, a fluorine atom or an alkyl group at least one hydrogen atom of which is substituted with a fluorine atom.

$R_1$ represents an alkyl group.

$R_2$ represents a hydrogen atom or an alkyl group.

Rf, $R_1$ and $R_2$ in the formula (I) have the same meanings as Rf, $R_1$ and $R_2$ in the formula (Ia), respectively.

As to the compound represented by the formula (I), a commercially available product may be used, or a compound prepared by synthesis may be used. The synthesis can be achieved by converting 2-trifluoromethylmethacrylic acid into its acid chloride and then esterifying the acid chloride.

The Resin (D) is preferably a resin having repeating units represented by the following formula (II) and repeating units represented by the following formula (III).

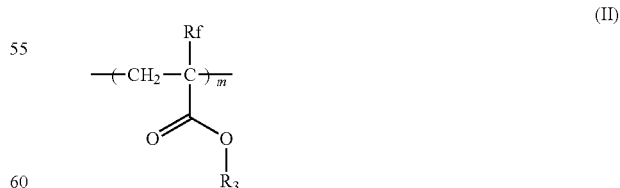

In the formulae (II) and (III), Rf represents a hydrogen atom, a fluorine atom or an alkyl group at least one hydrogen atom of which is substituted with a fluorine atom.

$R_3$ represents an alkyl group, a cycloalkyl group, an alkenyl group or a cycloalkenyl group.

$R_4$ represents an alkyl group, a cycloalkyl group, an alkenyl group, a cycloalkenyl group, a trialkylsilyl group or a group having a cyclic siloxane structure. $L_6$ represents a single bond or a linkage group.

0<m<100, and 0<n<100.

Rf in the formula (II) has the same meaning as Rf in the formula (Ia) has.

The alkyl group of $R_3$ is preferably a 3-20C straight-chain or branched alkyl group.

The cycloalkyl group of $R_3$ is preferably a 3-20C cycloalkyl group.

The alkenyl group of $R_3$ is preferably a 3-20C alkenyl group.

The cycloalkenyl group of $R_3$ is preferably a 3-20C cycloalkenyl group.

As to m and n, cases where m is from 30 to 70 and n is from 30 to 70 are preferred, and cases where m is from 40 to 60 and n is from 40 to 60 are far preferred.

The alkyl group of $R_4$ in the formula (III) is preferably a 3-20C straight-chain or branched alkyl group.

The cycloalkyl group of $R_4$ is preferably a 3-20C cycloalkyl group.

The alkenyl group of $R_4$ is preferably a 3-20C alkenyl group.

The cycloalkenyl group of $R_4$ is preferably a 3-20C cycloalkenyl group.

The trialkylsilyl group of $R_4$ is preferably a 3-20C trialkylsilyl group.

The group of $R_4$ which has a cyclic siloxane structure is preferably a group having a 3-20C cyclic siloxane structure.

The divalent linkage group of $L_6$ is preferably an alkylene group (far preferably a 1-5C alkylene group), or an oxy group (—O—).

Examples of Resin (D) having repeating units represented by the formula (Ia) are illustrated below, but these examples should not be construed as limiting the scope of the invention.

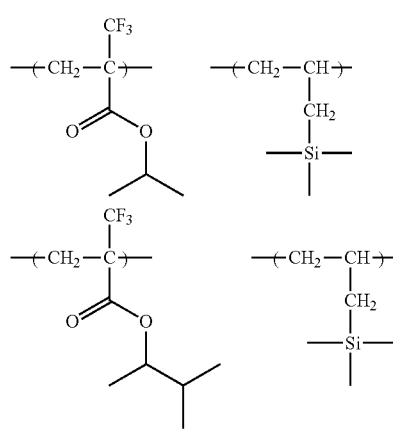

-continued

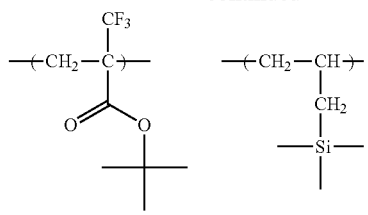

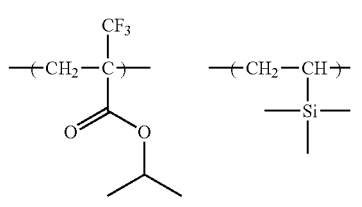

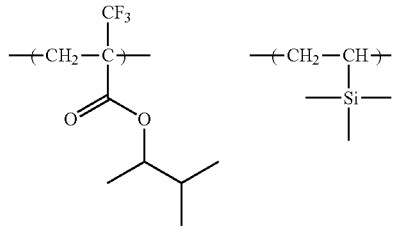

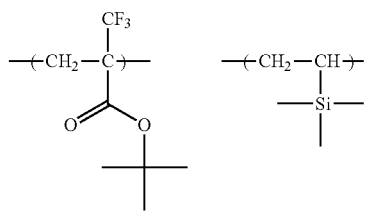

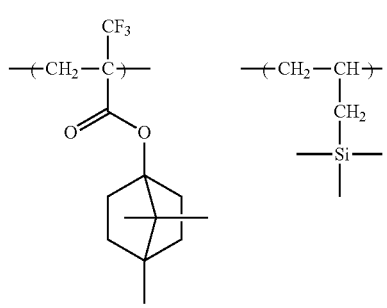

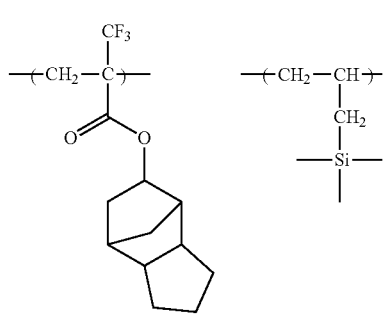

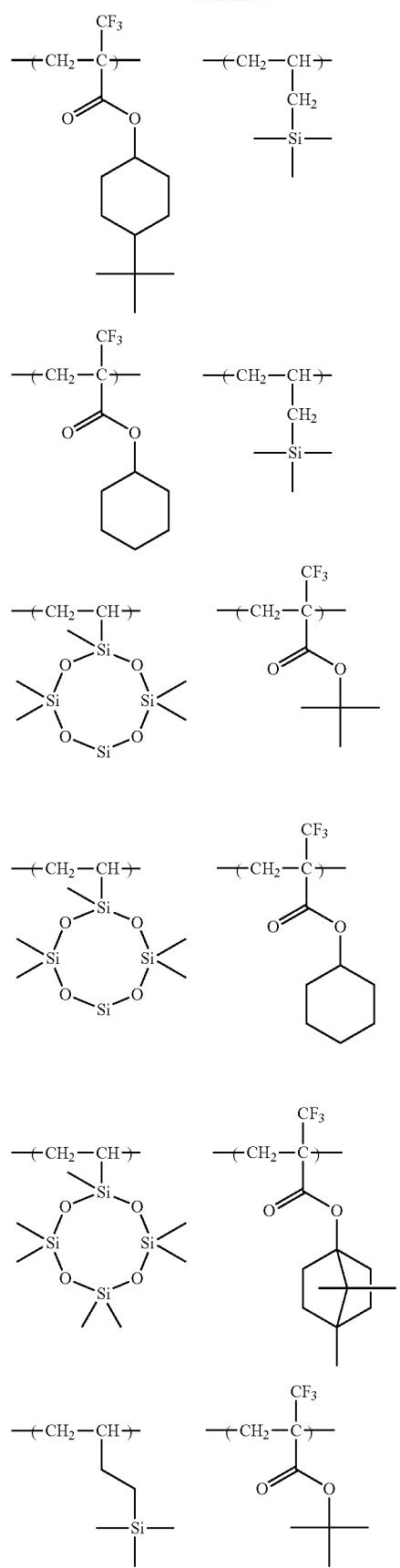
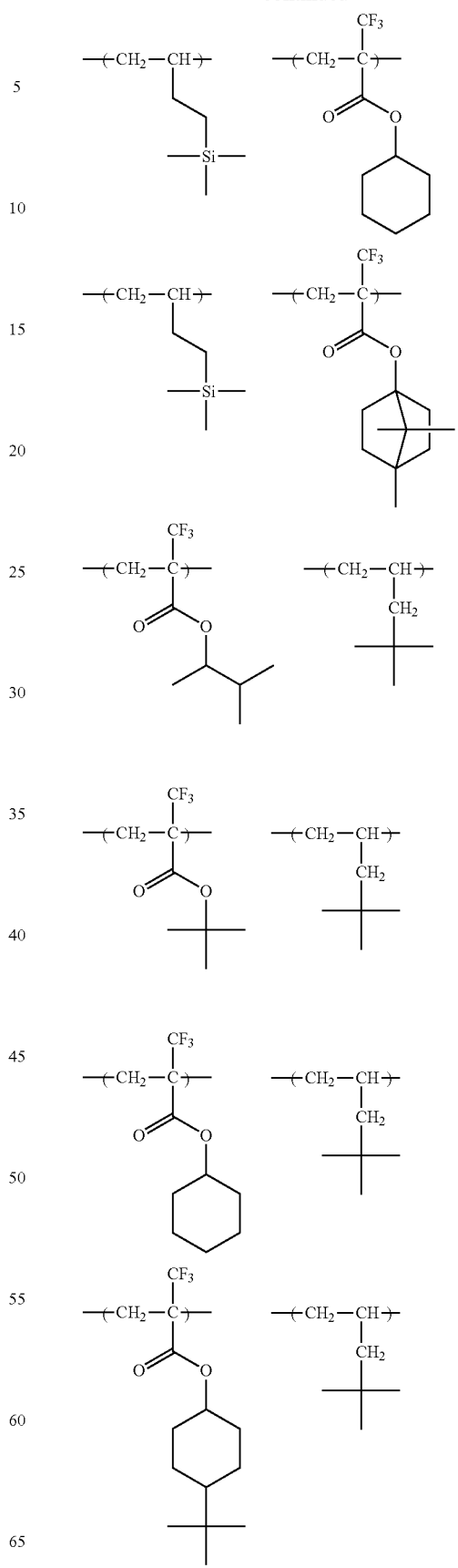

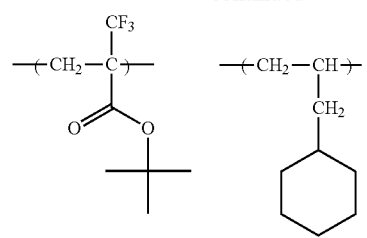
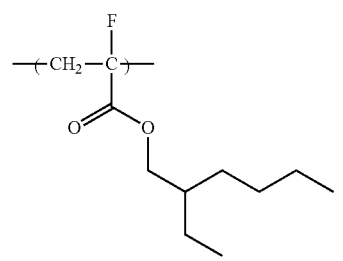
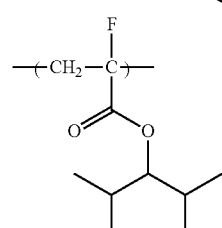
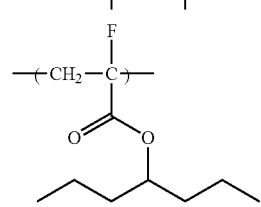
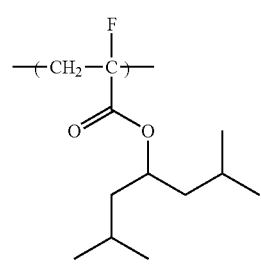
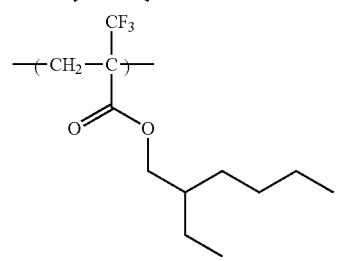
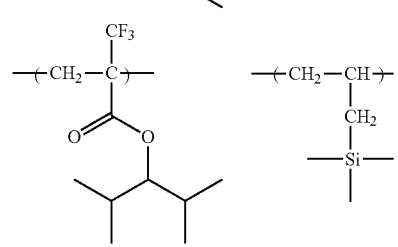
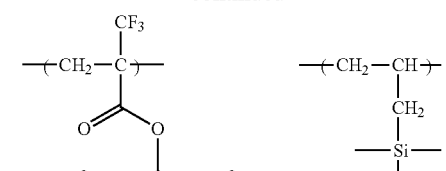
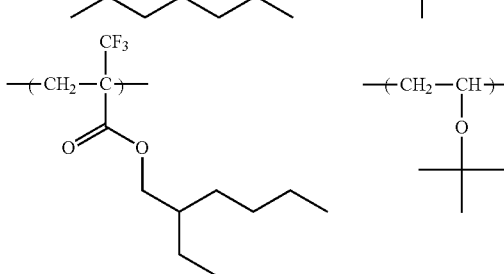
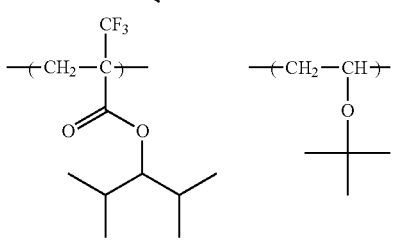
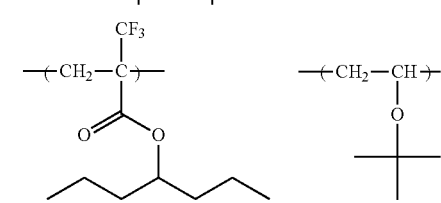
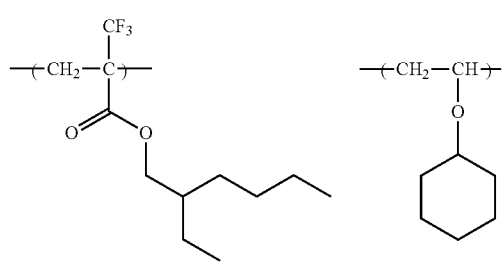
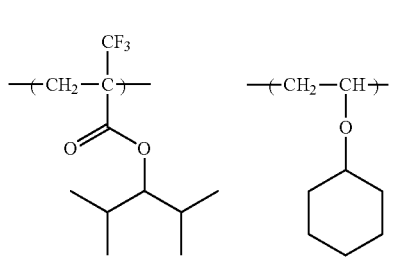
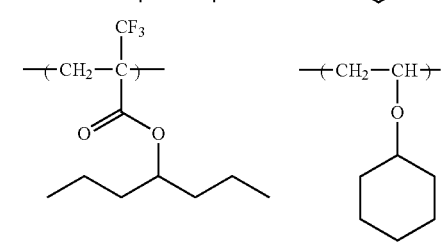

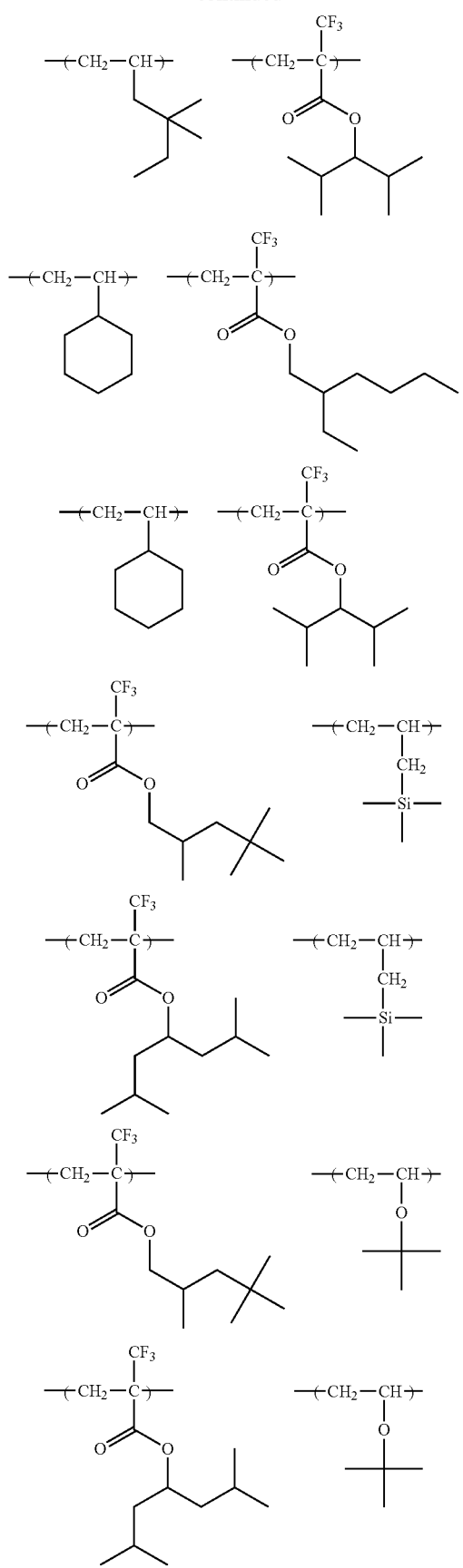
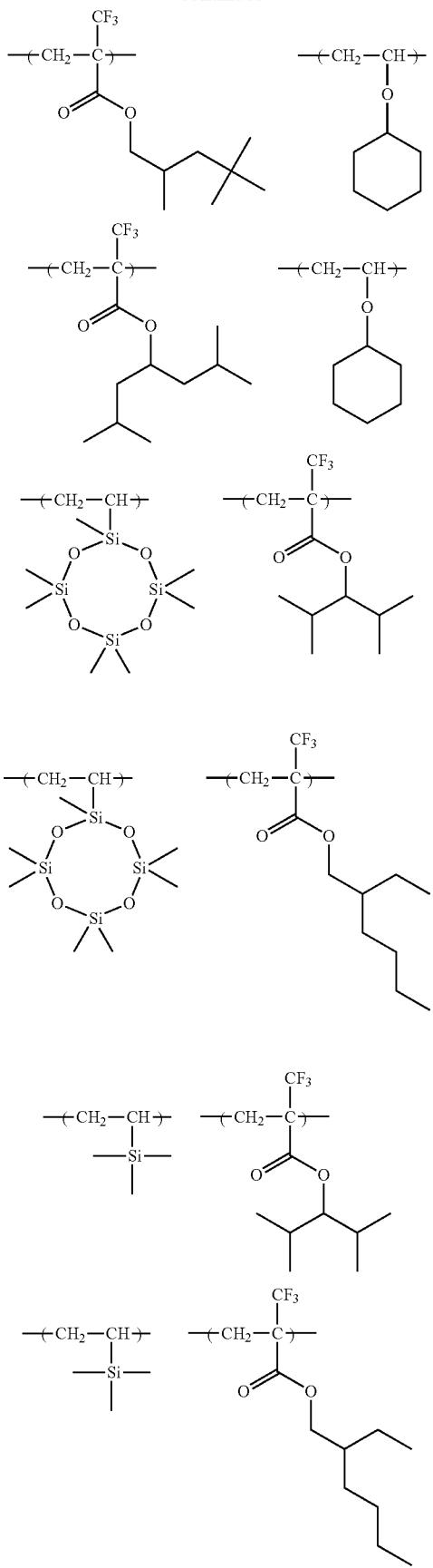

93
-continued

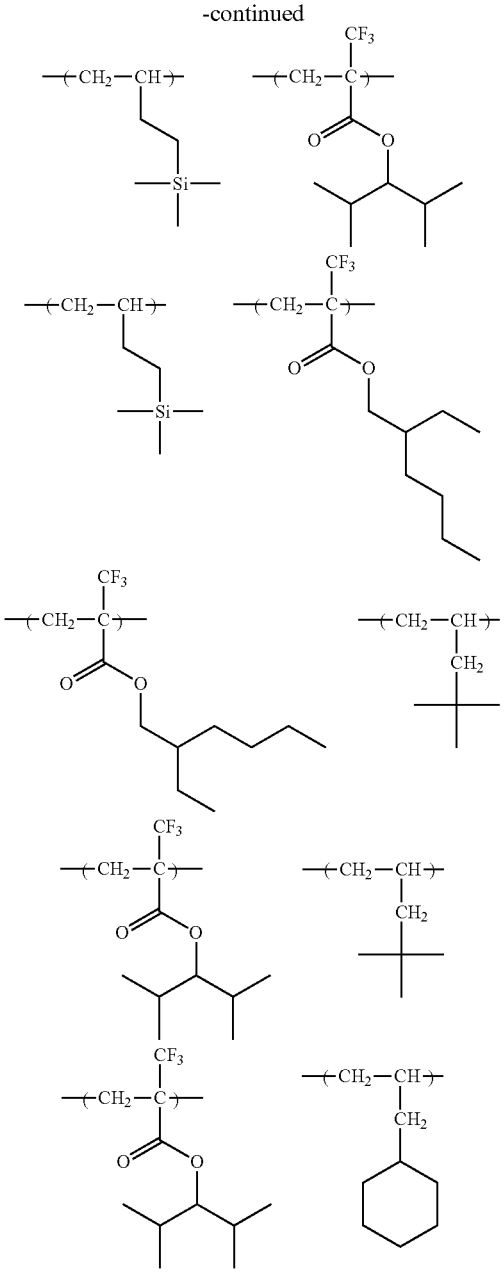

The Resin (D) may further have repeating units represented by the following formula (VIII).

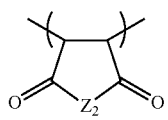
(VIII)

In the formula (VIII), $Z_2$ represents —O— or —N($R_{41}$)—. $R_{41}$ represents a hydrogen atom, an alkyl group or —OSO$_2$—$R_{42}$. R42 represents an alkyl group, a cycloalkyl group or a camphor residue. The alkyl groups of $R_{41}$ and $R_{42}$ may be substituted with halogen atoms (preferably fluorine atoms) or the like.

94

It is preferred that the Resin (D) be stable to an acid and insoluble in an alkali developer. In addition, the Resin (D) is preferably a resin soluble in a negative developer.

To be specific, in point of not only stability to an acid and insolubility in an alkali developer but also following capability of an immersion liquid, it is preferable that the Resin (D) has neither alkali-soluble groups nor groups capable of increasing its solubility in a developer by the action of an acid or an alkali.

In the Resin (D), it is appropriate that the sum total of repeating units having alkali-soluble groups and those having groups capable of increasing solubility in a developer by the action of an acid or an alkali make up no higher than 20 mole %, preferably from 0 to 10 mole %, far preferably from 0 to 5 mole %, of all repeating units of the Resin (D).

Furthermore, the presence of hydrophilic polar groups in the Resin (D) tends to degrade the following capability of an immersion liquid, so it is preferable that the Resin (D) is free of polar groups chosen from hydroxyl, alkylene glycol, ether or sulfone groups.

Examples of (x) an alkali-soluble group include a phenolic hydroxyl group, a carboxylic acid group, a fluorinated alcohol group, a sulfonic acid group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis (alkylsulfonyl)imido group, a tris(alkylcarbonyl)methylene group and a tris(alkylsulfonyl)methylene group.

Examples of (y) a group capable of decomposing by the action of an alkali (alkali developer) and increasing solubility in an alkali developer include a lactone group, an ester group, a sulfonamido group, an acid anhydride residue and an acid imido group.

Examples of (z) a group capable of decomposing by the action of an acid and increasing solubility in a developer include the same groups as the acid-decomposable groups recited in the description of the acid-decomposable Resin (A).

On the other hand, the repeating units represented by the following formula (pA-c) undergo no decomposition or extremely slight decomposition by the action of an acid, as compared with acid-decomposable groups in the Resin (A), so their decomposability is considered to be equal to substantially zero.

(pA-c)

In the formula (pA-c), Rp$_t$ represents a hydrocarbon group having a tertiary carbon atom attached to the oxygen atom in the formula.

When Resin (D) contains silicon atoms, the silicon content is preferably from 2 to 50 mass %, far preferably from 2 to 30 mass %, of the molecular weight of the Resin (D). And the proportion of repeating units containing silicon atoms is preferably from 10 to 100 mass %, far preferably from 20 to 100 mass %, with respect to all repeating units constituting the Resin (D).

When Resin (D) contains fluorine atoms, the fluorine content is preferably from 5 to 80 mass %, far preferably from 10 to 80 mass %, of the molecular weight of the Resin (D). And the proportion of repeating units containing fluorine atoms is preferably from 10 to 100 mass %, far preferably from 30 to 100 mass %, with respect to all repeating units constituting the Resin (D).

The weight average molecular weight of Resin(D) is preferably from 1,000 to 100,000, far preferably from 1,000 to 50,000, further preferably from 2,000 to 15,000, as calculated in terms of standard polystyrene.

The Resin (D) having polydispersity (molecular weight distribution) from 1 to 5 is generally used, and the polydispersity thereof is preferably from 1 to 3, far preferably from 1 to 2, particularly preferably from 1 to 1.7. The smaller the polydispersity value, the better the roughness quality.

The residual monomer content in Resin (D) is preferably from 0 to 10 mass %, far preferably from 0 to 5 mass %, further preferably from 0 to 1 mass %. From the viewpoints of resolution, resist profile and resist sidewall roughness, the molecular weight distribution (Mw/Mn, referred to as polydispersity too) of Resin (D) is preferably in a range of 1 to 5, far preferably in a range of 1 to 3, further preferably in a range of 1 to 1.5.

The amount of Resin (D) mixed in a resist composition for negative development is preferably from 0.1 to 5 mass %, far preferably from 0.2 to 3.0 mass %, further preferably from 0.3 to 2.0 mass %, based on the total solids in the resist composition.

It is only natural that Resin (D) is minimized in content of impurities, such as metal, in common with the acid-decomposable Resin (A), and besides, it is preferred that the total content of monomer residues and oligomer components in Resin (D) be reduced to a specified value, e.g., 0.1 mass % or below as measured by HPLC. By this reduction, the sensitivity, resolution, process consistency and pattern profile of resist can further be improved, and besides, the resist free of submerged extraneous matter, sensitivity deterioration with lapse of time and so on can be obtained.

Various commercial products can be utilized as Resin (D), while Resin (D) may be synthesized according to a general method (e.g., radical polymerization). As examples of a general synthesis method, there are known a batch polymerization method in which polymerization is carried out by dissolving monomer species and an initiator in a solvent and heating them, and a drop polymerization method in which a solution containing monomer species and an initiator is added dropwise to a heated solvent over 1 to 10 hours. However, the drop polymerization method is preferable to the batch polymerization method. Examples of a solvent usable in the polymerization reaction include ethers, such as tetrahydrofuran, 1,4-dioxane and diisopropyl ether; ketones, such as methyl ethyl ketone and methyl isobutyl ketone; ester solvents, such as ethyl acetate; amide solvents, such as dimethylformamide and dimethylacetamide; and solvents as described hereafter in which the present composition can be dissolved, such as propylene glycol monomethyl ether acetate, propylene glycol monomethyl ether and cyclohexanone. It is preferred that the polymerization be carried out using the same solvent as used in the resist composition according to the invention. By use of a common solvent, it becomes possible to prevent particles from developing during the storage.

The polymerization reaction is preferably carried out in an atmosphere of inert gas, such as nitrogen or argon. And the polymerization is initiated by use of a commercially available radical initiator (e.g., an azo-type initiator or peroxide) as polymerization initiator. The radical initiator is preferably an azo-type initiator, and more specifically, an azo-type initiator having an ester group, a cyano group or a carboxyl group. Examples of such a preferred azo-type initiator include azobisisobutyronitrile, azobisdimethylvaleronitrile and dimethyl 2,2'-azobis(2-methylpropionate). The concentration of reaction species is generally from 5 to 50 mass %, preferably from 30 to 50 mass %, and the reaction temperature is generally from 10° C. to 150° C., preferably from 30° C. to 120° C., far preferably from 60° C. to 100° C.

After the reaction is completed, the reaction product is allowed to stand and cooled to room temperature, and then subjected to purification. For the purification, a usual method is applicable, and examples thereof include a liquid-liquid extraction method in which residual monomers and oligomeric components are eliminated by washing with water or by combined use of appropriate solvents, a method of performing purification in a solution state, such as an ultrafiltration method in which only components of molecular weight lower than a specific value are extracted and eliminated, a reprecipitation method in which a resin solution is dripped into a poor solvent to result in coagulation of the resin and elimination of residual monomers and so on, and a method of performing purification in a solid state, such as a method of washing filtered resin slurry with a poor solvent. For instance, the reaction solution is brought into contact with an at most 10-fold, preferably 10- to 5-fold, volume of solvent (poor solvent) in which the resin is slightly soluble or insoluble, thereby precipitating the intended resin as a solid.

As the solvent used in the operation of precipitation or reprecipitation from a polymer solution (precipitation or reprecipitation solvent), any solvent can serve so long as it is a poor solvent of the polymer. And the solvent to be used in such an operation can be selected appropriately from the following poor solvents according to the kind of the polymer. Specifically, the poor solvents include hydrocarbons (such as aliphatic hydrocarbons including pentane, hexane, heptane and octane; alicyclic hydrocarbons including cyclohexane and methylcyclohexane; and aromatic hydrocarbons including benzene, toluene and xylene); halogenated hydrocarbons (such as aliphatic halogenated hydrocarbons including methylene chloride, chloroform and carbon tetrachloride; and aromatic halogenated hydrocarbons including chlorobenzene and dichlorobenzene); nitro compounds (such as nitromethane and nitroethane); nitriles (such as acetonitrile and benzonitrile); ethers (such as linear ethers including diethyl ether, diisopropyl ether and dimethoxyethane; and cyclic ethers including tetrahydrofuran and dioxane); ketones (such as acetone, methyl ethyl ketone and diisobutyl ketone); esters (such as ethyl acetate and butyl acetate); carbonates (such as dimethyl carbonate, diethyl carbonate, ethylene carbonate and propylene carbonate); alcohols (such as methanol, ethanol, propanol, isopropyl alcohol and butanol); carboxylic acids (such as acetic acid); water: and mixed solvents containing the solvents recited above. Of these solvents, solvents containing at least alcohol (especially methanol) or water are preferred as precipitation or reprecipitation solvents. In such a mixed solvent containing at least a hydrocarbon, the ratio of alcohol (especially methanol) to other solvents (e.g., esters such as ethyl acetate, ethers such as tetrahydrofuran), the alcohol/other solvents ratio, by volume at 25° C. is preferably of the order of 10/90 to 99/1, far preferably of the order of 30/70 to 98/2, further preferably of the order of 50/50 to 97/3.

The amount of a precipitation or reprecipitation solvent used can be chosen appropriately with consideration given to efficiency and yield, and it is generally from 100 to 10,000 parts by mass, preferably from 200 to 2,000 parts by mass, far preferably from 300 to 1,000 parts by mass, per 100 parts by mass of polymer solution.

The bore of a nozzle used for feeding a polymer solution into a precipitation or reprecipitation solvent (poor solvent) is preferably 4 mmϕ or below (e.g., 0.2 to 4 mmϕ). And the linear speed at which a polymer solution is fed (dripped) into a poor solvent is, e.g., from 0.1 to 10 msec, preferably of the order of 0.3 to 5 msec.

The precipitation or reprecipitation is preferably carried out with stirring. Examples of stirring blades usable for stirring include a desk turbine, a fan turbine (including paddles), a curved-blade turbine, a feather turbine, blades of Phaudler type, blades of Bullmargin type, an angle-blade fan turbine, propellers, multistage-type blades, anchor-type (horseshoe-type) blades, gate-type blades, double ribbon-type blades and screws. It is preferable that the stirring is continued for additional 10 minutes or above, especially 20 minutes or above, after the polymer solution feed is completed. When the stirring time is insufficient, there occurs a case where the monomer content in polymer particles cannot be reduced properly. Instead of using stirring blades, a polymer solution and a poor solvent may be mixed together by using a line mixer.

The precipitation or reprecipitation temperature can be chosen appropriately with consideration given to efficiency and operational ease, and it is usually from 0° C. to 50° C., preferably in the vicinity of room temperature (e.g., from, 20° C. to 35° C.). In order to perform the precipitation or reprecipitation operation, a commonly-used mixing vessel, such as a stirred tank, and a hitherto known process, such as a batch process or a continuous process, can be utilized.

The polymer particles precipitated or reprecipitated are generally subjected to solid-liquid separation, such as filtration or centrifugation, and then dried. Thus, the polymer particles are made available for use. The filtration is carried out using a solvent-resistant filtering material, preferably under a pressurized condition. The drying is performed at a temperature of the order of 30° C. to 100° C., preferably of the order of 30° C. to 50° C., under a normal pressure or a reduced pressure, preferably under a reduced pressure.

Additionally, resin once precipitated and separated out of its solution may be dissolved in a solvent again and brought into contact with a solvent in which the resin is slightly soluble or insoluble.

More specifically, it is acceptable to adopt a method which includes bringing a reaction solution after finishing radical polymerization reaction into contact with a solvent in which the polymer produced is slightly soluble or insoluble, thereby precipitating the polymer as resin (process step a), separating the resin from the solution (process step b), preparing a resin solution A by dissolving the resin in a solvent again (process step c), bringing the resin solution A into contact with a solvent, in which the resin is slightly soluble or insoluble, the volume of which is lower than 10 times, preferably no higher than 5 times, the volume of the resin solution A, thereby precipitating the resin as a solid (process step d), and separating the precipitated resin out of the resultant solution (process step e).

The solvent used when the resin solution A is prepared may be a solvent similar to the solvent used in dissolving monomer (s) for polymerization reaction, and it may be one and the same as or different from the solvent used in the polymerization reaction.

Examples of Resin (D) are illustrated below, but these examples should not be construed as limiting the scope of the invention.

(D-1)

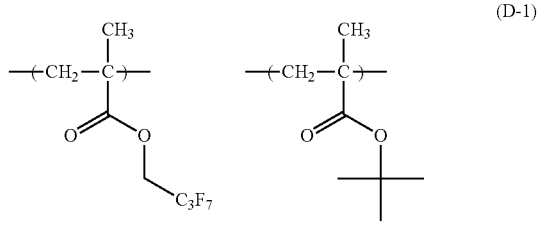
(D-2)

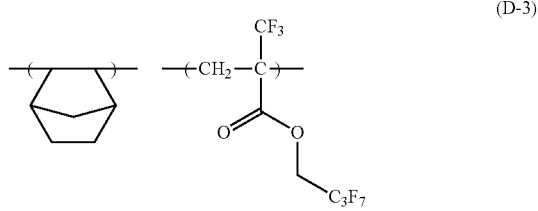
(D-3)

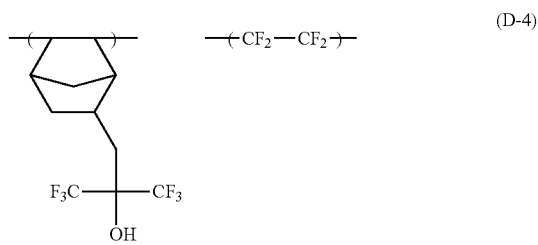
(D-4)

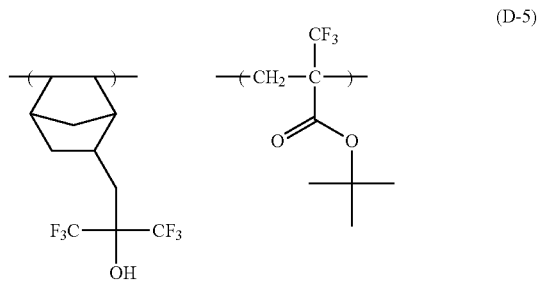
(D-5)

(D-6)

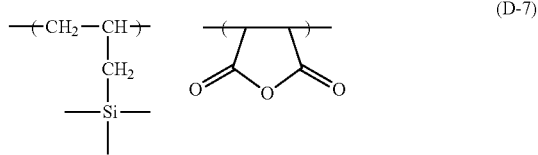
(D-7)

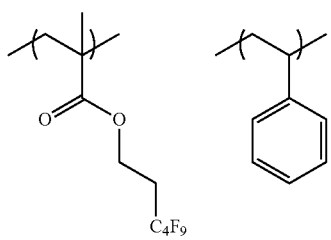 (D-19)
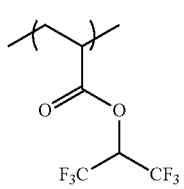 (D-20)
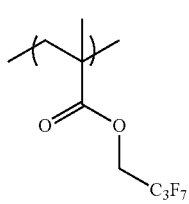 (D-21)
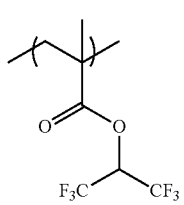 (D-22)
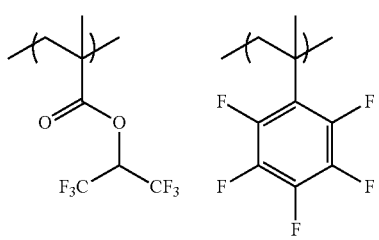 (D-23)
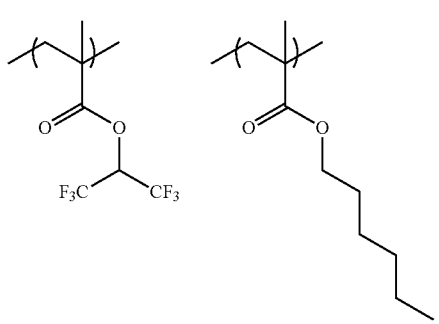 (D-24)
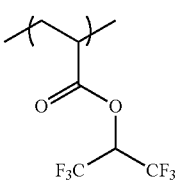 (D-25)
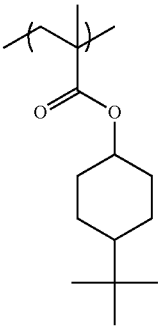
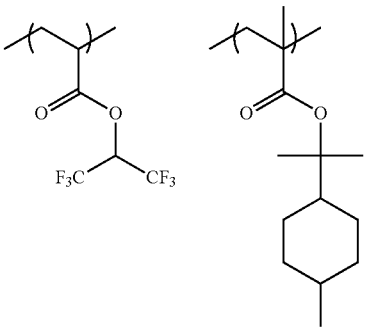 (D-26)
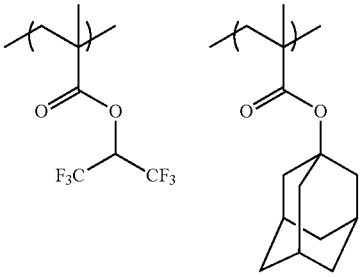 (D-27)
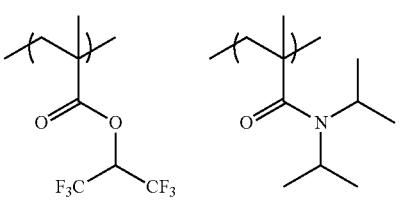 (D-28)
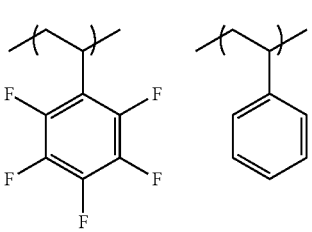 (D-29)
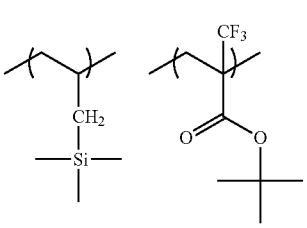 (D-30)

(D-31) 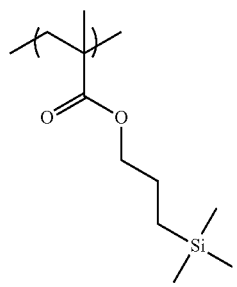 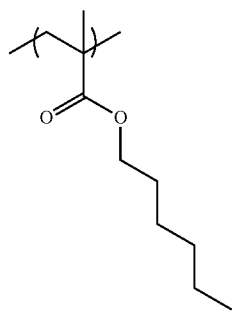
(D-32) 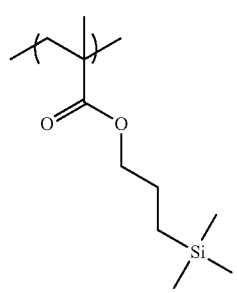
(D-33) 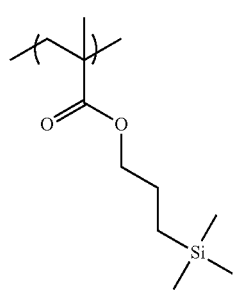 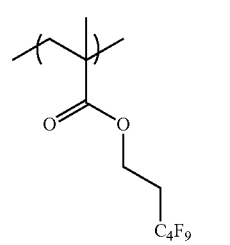
(D-34) 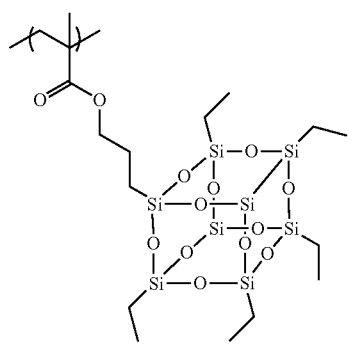 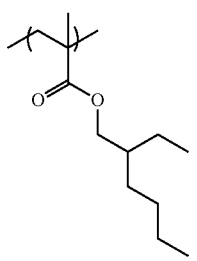
(D-35) 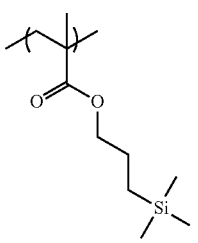 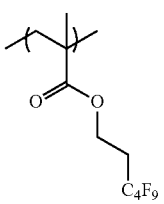 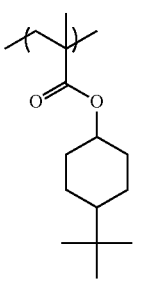
(D-36) 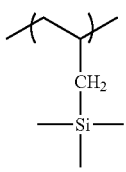 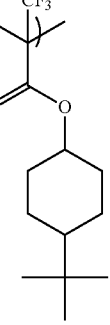
(D-37) 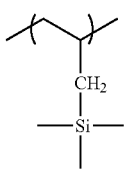 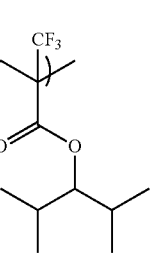
(D-38) 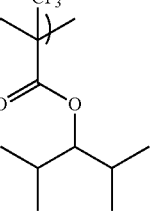
(D-39) 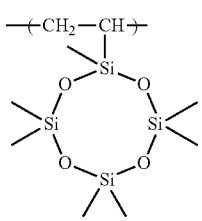 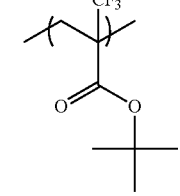
(D-40) 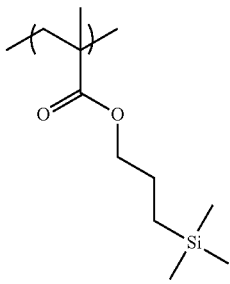
(D-41) 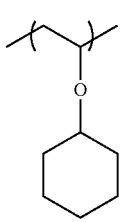 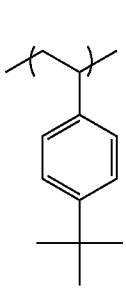

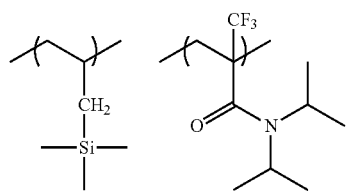
(D-42)
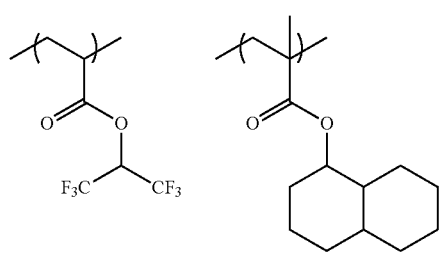
(D-43)
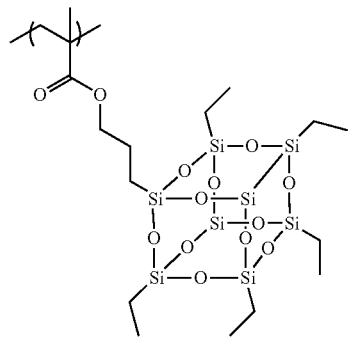
(D-44)
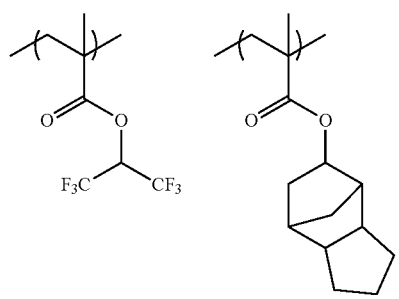
(D-45)
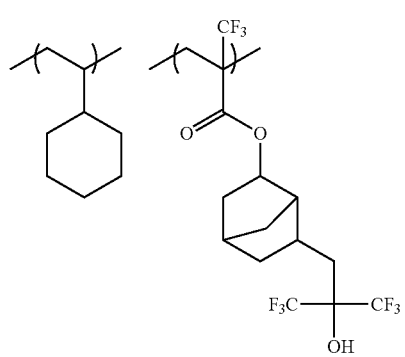
(D-46)
(D-47)
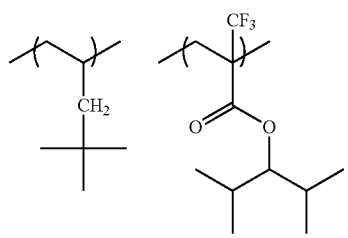
(D-48)
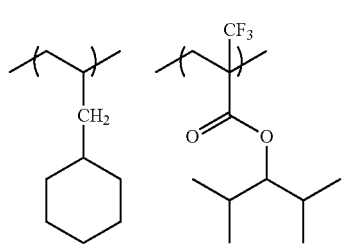
(D-49)
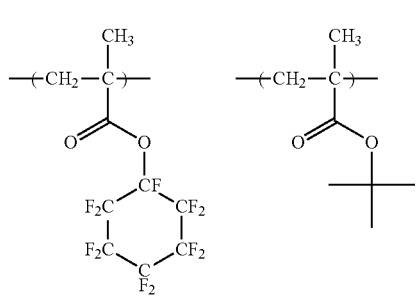
(D-50)
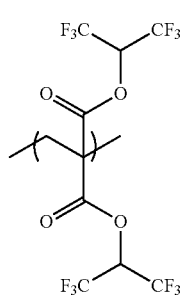
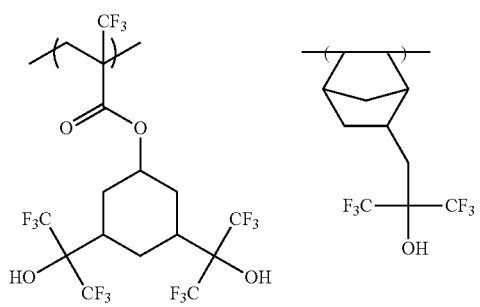
(D-51)

(D-52) (D-53) (D-54) (D-55) (D-56) (D-57) (D-58) (D-59) (D-60) (D-61) (D-62)

-continued
(D-63)
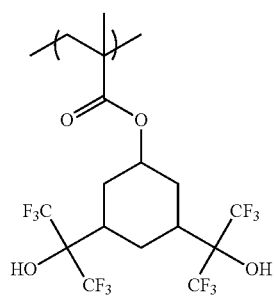
(D-64)
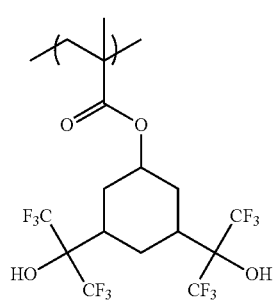 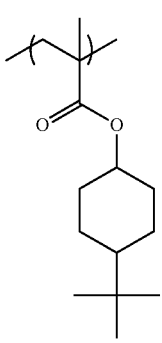
(D-65)
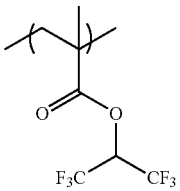 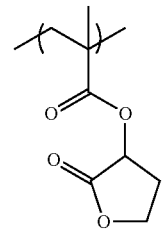 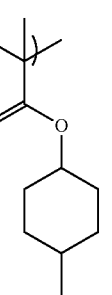
(D-66)
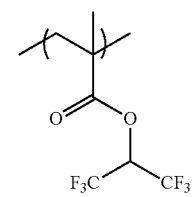 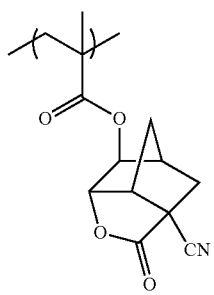
(D-67)
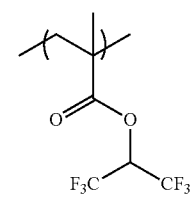 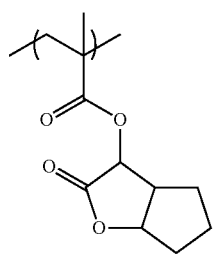
-continued
(D-68)
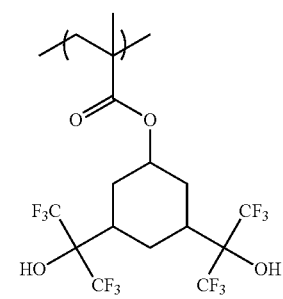 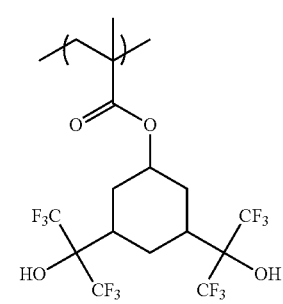
(D-69)
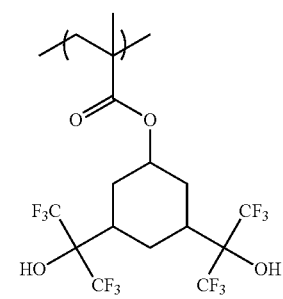 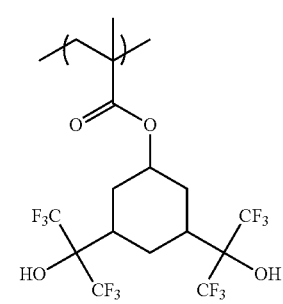
(D-70)
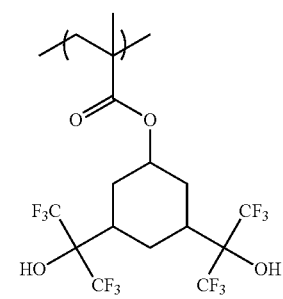 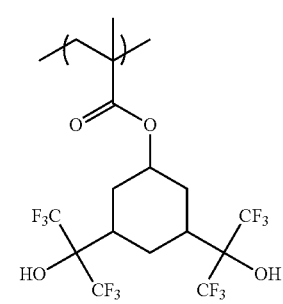 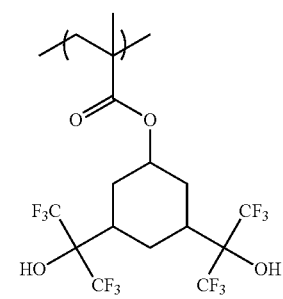
(D-71)
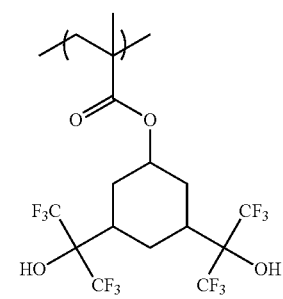 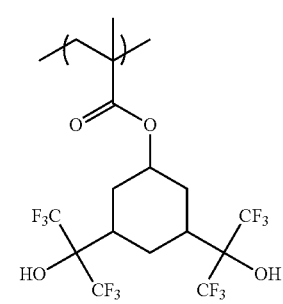 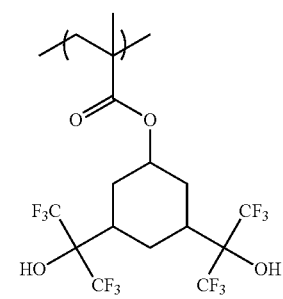
(D-72)
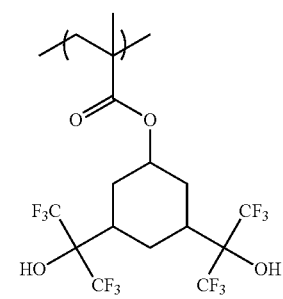 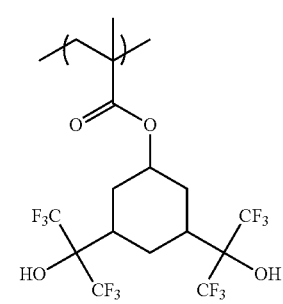 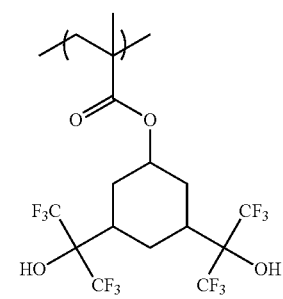

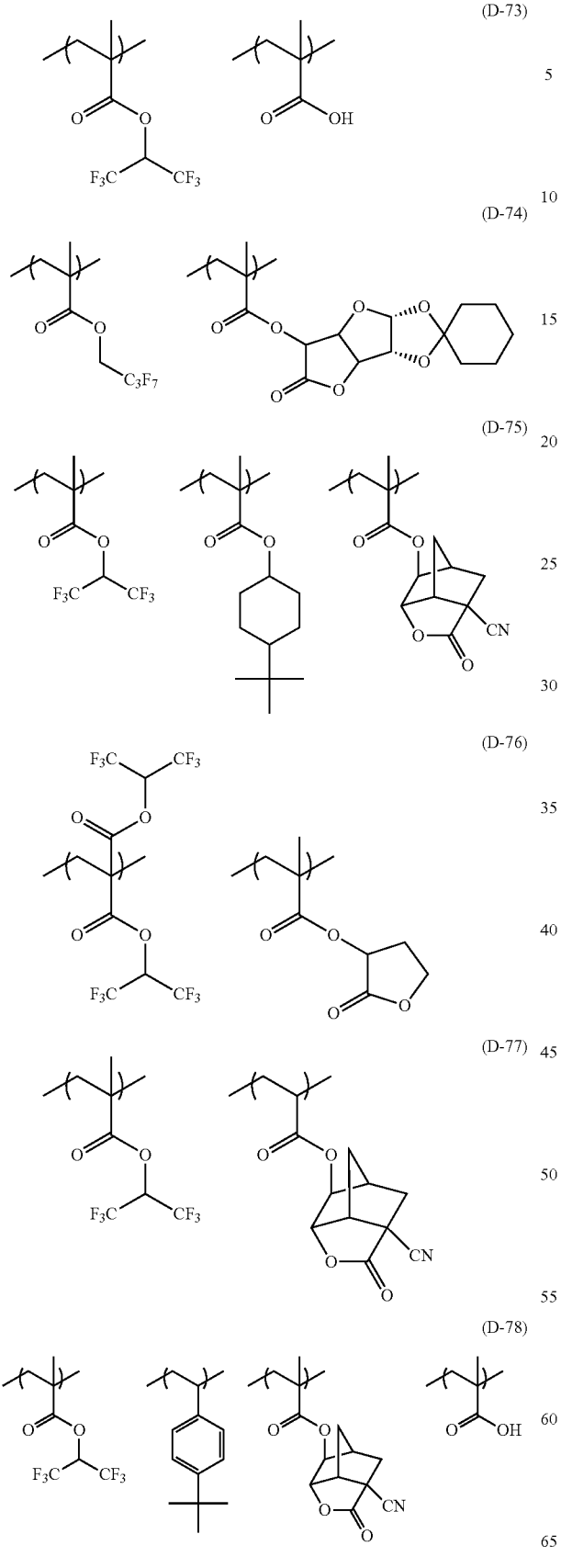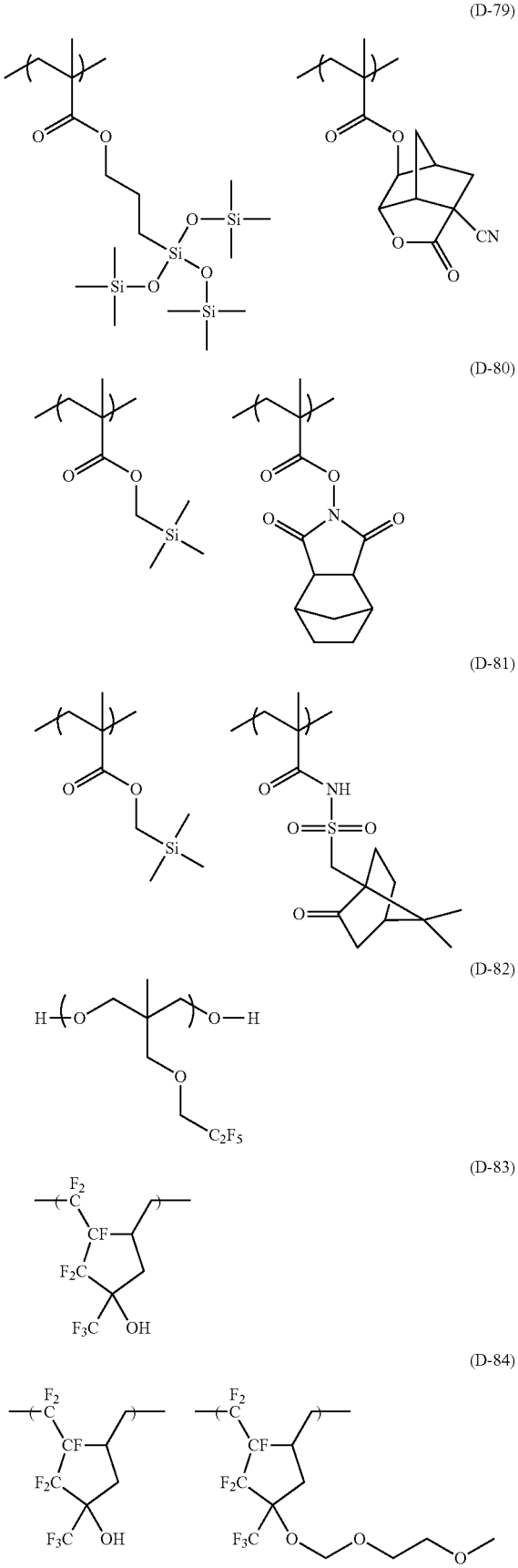

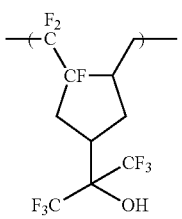
(D-85)

(E) Basic Compound

For reduction of performance changes occurring with the passage of time from exposure to heating, it is appropriate that the resist composition for use in the invention contain (E) a basic compound.

Examples of a compound suitable as the basic compound include compounds having structures represented by the following (A) to (E).

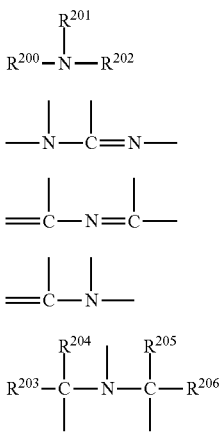

In the formulae (A) and (E), $R^{200}$, $R^{201}$ and $R^{202}$ may be the same or different, and each of them represents a hydrogen atom, an alkyl group (preferably a 1-20C alkyl group), a cycloalkyl group (preferably a 3-20C cycloalkyl group) or an aryl group (containing 6 to 20 carbon atoms). Herein, $R^{201}$ and $R^{202}$ may combine with each other to form a ring.

When the foregoing alkyl group has a substituent, a 1-20C aminoalkyl group, a 1-20C hydroxyalkyl group or a 1-20C cyanoalkyl group is suitable as the substituted alkyl group.

In the formula (E), $R^{203}$, $R^{204}$, $R^{205}$ and $R^{206}$ may be the same or different, and each of them represents a 1-20C alkyl group.

The alkyl groups in the formulae (A) to (E) are preferably unsubstituted alkyl groups.

Examples of preferred basic compounds include guanidine, aminopyrrolidine, pyrazole, pyrazoline, piperazine, aminomorpholine, aminoalkylmorpholine and piperidine. Examples of far preferred compounds include compounds having an imidazole structure, a diazabicyclo structure, an onium hydroxide structure, an onium carboxylate structure, a trialkylamine structure, an aniline structure and a pyridine structure, respectively; an alkylamine derivative having a hydroxyl group and/or an ether linkage; and an aniline derivative having a hydroxyl group and/or an ether linkage.

Examples of the compound having an imidazole structure include imidazole, 2,4,5-triphenylimidazole and benzimidazole. Examples of the compound having a diazabicyclo structure include 1,4-diazabicyclo[2.2.2]octane, 1,5-diazabicyclo[4.3.0]nona-5-ene and 1,8-diazabicyclo[5.4.0]undeca-7-ene. Examples of the compound having an onium hydroxide structure include triarylsulfonium hydroxides, phenacylsulfonium hydroxides and sulfonium hydroxides having 2-oxoalkyl groups, and more specifically, they include triphenylsulfonium hydroxide, tris(t-butylphenyl)sulfonium hydroxide, bis(t-butylphenyl)iodonium hydroxide, phenacylthiophenium hydroxide and 2-oxopropylthiophenium hydroxide. The compound having an onium carboxylate structure is a compound having the structure corresponding to the substitution of carboxylate for the anion moiety of the compound having an onium hydroxide structure, with examples including acetate, adamantane-1-carboxylate and perfluoroalkylcarboxylates. Examples of the compound having a trialkylamine structure include tri(n-butyl)amine and tri(n-octyl)amine. Examples of the aniline compound include 2,6-diisopropylaniline, N,N-dimethylaniline, N,N-dibutylaniline and N,N-dihexylaniline. Examples of the alkylamine derivative having a hydroxyl group and/or an ether linkage include ethanolamine, diethanolamine, triethanolamine and tris(methoxyethoxyethyl)amine. An example of the aniline derivative having a hydroxyl group and/or an ether linkage is N,N-bis(hydroxyethyl)aniline.

These basic compounds are used alone or as combinations of two or more thereof.

The amount of basic compounds used is generally from 0.001 to 10 mass %, preferably 0.01 to 5 mass %, based on the total solids in the resist composition.

The ratio between the amount of acid generator(s) used and the amount of basic compound(s) used in the composition, the acid generator/basic compound ratio (by mole), is preferably from 2.5 to 300. More specifically, it is appropriate that the ratio by mole be adjusted to at least 2.5 in point of sensitivity and resolution, and that it be adjusted to at most 300 from the viewpoint of preventing degradation in resolution by thickening of resist patterns with the passage of time from the end of exposure to heating treatment. The acid generator/basic compound ratio (by mole) is preferably from 5.0 to 200, far preferably from 7.0 to 150.

(F) Surfactant

It is preferable that the resist composition for use in the invention further contains (F) a surfactant, specifically a surfactant containing at least one fluorine atom and/or at least one silicon atom (either a fluorine-containing surfactant, or a silicon-containing surfactant, or a surfactant containing both fluorine and silicon atoms), or a combination of at least two of these surfactants.

Incorporation of such a surfactant in the resist composition for use in the invention allows production of resist patterns having strong adhesion and reduced development defect while ensuring the composition both satisfactory sensitivity and high resolution in the case of using an exposure light source of 250 nm or below, especially 220 nm or below.

Examples of a surfactant containing at least one fluorine atom and/or at least one silicon atom include the surfactants disclosed in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862, and U.S. Pat. Nos. 5,405,720, 5,360,692, 5,529,881, 5,296,330, 5,436,098, 5,576,143, 5,294,511 and 5,824,451. In addition, the following commercially available surfactants can also be used as they are.

Examples of commercial surfactants which can be used include fluorine- or silicon-containing surfactants, such as EFTOP EF301 and EF303 (produced by Shin-Akita Kasei K.K.), Florad FC430, 431 and 4430 (produced by Sumitomo 3M, Inc.), Megafac F171, F173, F176, F189, F113, F110, F177, F120 and R$^{08}$ (produced by Dainippon Ink & Chemicals, Inc.), Surflon S-382, SC101, 102, 103, 104, 105 and 106 (produced by Asahi Glass Co., Ltd.), Troysol S-366 (produced by Troy Chemical Industries, Inc.), GF-300 and GF-150 (produced by Toagosei Co., Ltd.), Surflon S-393 (produced by Seimi Chemical Co., Ltd.), EFTOP EF121, EF122A, EF122B, RF122C, EF125M, EF135M, EF351, EF352, EF801, EF802 and EF601 (produced by JEMCO Inc.), PF636, PF656, PF6320 and PF6520 (produced by OMNOVA Solutions Inc.), and FTX-204D, 208G, 218G, 230G, 204D, 208D, 212D, 218D and 222D (produced by NEOS). Moreover, organosiloxane polymer KP-341 (produced by Shin-Etsu Chemical Co., Ltd.) can be used as a silicon-containing surfactant.

In addition to the heretofore known surfactants as recited above, surfactants utilizing polymers having fluorinated aliphatic groups derived from fluorinated aliphatic compounds synthesized by a telomerization method (also referred to as a telomer method) or an oligomerization method (also referred to as an oligomer method) can be used. These fluorinated aliphatic compounds can be synthesized according to the methods disclosed in JP-A-2002-90991.

The polymers having fluorinated aliphatic groups are preferably copolymers of fluorinated aliphatic group-containing monomers and (poly(oxyalkylene)) acrylates and/or (poly(oxyalkylene)) methacrylates, wherein the fluorinated aliphatic group-containing units may be distributed randomly or in blocks. Examples of such a poly(oxyalkylene) group include a poly(oxyethylene) group, a poly(oxypropylene) group and a poly(oxybutylene) group. In addition, the poly(oxyalkylene) group may be a unit containing alkylene groups of different chain lengths in its oxyalkylene chain, such as poly(oxyethylene block/oxypropylene block/oxyethylene block combination) and poly(oxyethylene block/oxypropylene block combination). Further, the copolymers of fluorinated aliphatic group-containing monomers and (poly(oxyalkylene)) acrylates (or methacrylates) may be not only binary copolymers but also ternary or higher copolymers prepared using in each individual copolymerization at least two different kinds of fluorinated aliphatic group-containing monomers or/and at least two different kinds of (poly(oxyalkylene)) acrylates (or methacrylates) at the same time.

Examples of commercially available surfactants of such types include Megafac F178, F-470, F-473, F-475, F-476 and F-472 (produced by Dainippon Ink & Chemicals, Inc.). Additional examples of surfactants of such types include a copolymer of $C_6F_{13}$ group-containing acrylate (or methacrylate) and poly(oxyalkylene) acrylate (or methacrylate), and a copolymer of $C_3F_7$ group-containing acrylate (or methacrylate), poly(oxyethylene) acrylate (or methacrylate) and poly(oxypropylene) acrylate (or methacrylate).

Alternatively, it is also possible to use surfactants other than surfactants containing fluorine and/or silicon atoms. Examples of such surfactants include nonionic surfactants, such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkyl aryl ethers (e.g., polyoxyethylene octyl phenol ether, polyoxyethylene nonyl phenol ether), polyoxyethylene-polyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate), and polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate).

These surfactants may be used alone or as combinations of two or more thereof.

The amount of a surfactant (F) used is preferably from 0.01 to 10 mass %, preferably 0.1 to 5 mass %, based on the total ingredients (exclusive of a solvent) in the resist composition.

(G) Onium Salt of Carboxylic Acid

The resist composition for use in the invention may further contain (G) an onium salt of carboxylic acid. Examples of such an onium salt of carboxylic acid (G) include sulfonium carboxylates, iodonium carboxylates and ammonium carboxylates. Of these onium salts, iodonium salts and sulfonium salts are especially preferred. In addition, it is preferable that neither aromatic group nor carbon-carbon double bond is present in the carboxylate residue of an onium carboxylate (G) used in the invention. As the anion part of (G), 1-30C straight-chain and branched alkyl carboxylate anions and mononuclear or polynuclear cycloalkyl carboxylate anions are especially suitable. Of these anions, the carboxylate anions whose alkyl groups are partially or entirely substituted with fluorine atoms are preferred over the others. In addition, those alkyl chains may contain oxygen atoms. Incorporation of an onium salt having such a carboxylate anion into a resist composition can ensure the resist composition transparency to light with wavelengths of 220 nm or below, and allows increases in sensitivity and resolution, and improvements in iso/dense bias and exposure margin.

Examples of a fluorinated carboxylate anion include a fluoroacetate anion, a difluoroacetate anion, a trifluoroacetate anion, a pentafluoropropionate anion, a heptafluorobutyrate anion, a nonafluoropentanate anion, a perfluorododecanate anion, a perfluorotridecanate anion, a perfluorocyclohexanecarboxylate anion and a 2,2-bistrifluoromethylpropionate anion.

The onium carboxylate (G) as recited above can be synthesized by allowing an onium hydroxide, such as sulfonium hydroxide, iodonium hydroxide or ammonium hydroxide, and a carboxylic acid to react with silver oxide in an appropriate solvent.

The suitable content of an onium salt of carboxylic acid (G) in a composition is generally from 0.1 to 20 mass %, preferably from 0.5 to 10 mass %, far preferably from 1 to 7 mass %, based on the total solids in the composition.

(H) Other Additives

The resist composition for use in the invention can further contain, on an as needed basis, dyes, plasticizers, photosensitizers, light absorbents, alkali-soluble resins, dissolution inhibitors and compounds which can promote dissolution in developers (e.g., phenol compounds having molecular weights of 1,000 or below, alicyclic or aliphatic compounds having carboxyl groups).

The phenol compounds which are 1,000 or below in molecular weight can be easily synthesized by persons skilled in the art when they refer to the methods as disclosed in JP-A-4-122938, JP-A-2-28531, U.S. Pat. No. 4,916,210 and European Patent No. 219,294.

Examples of alicyclic or aliphatic compounds having carboxyl groups include carboxylic acid derivatives having steroid structures, such as cholic acid, deoxycholic acid and lithocholic acid, adamantanecarboxylic acid derivatives, adamantanedicarboxylic acid, cyclohexanecarboxylic acid and cyclohexanedicarboxylic acid, but they are not limited to the compounds recited above.

EXAMPLES

The invention is illustrated below in more detail by reference to the following examples, but these examples should not be construed as limiting the scope of the invention in any way.

Synthesis Example 1

Synthesis of Resin (D20)

In propylene glycol monomethyl ether acetate, 47.2 g of hexafluoroisopropyl acrylate (a product of Wako Pure Chemical Industries, Ltd.) is dissolved, thereby preparing 170 g of a solution having a solid concentration of 20%. To this solution, 8 mole % (3.68 g) of a polymerization initiator V-601 (a product of Wako Pure Chemical Industries, Ltd.) is added. In an atmosphere of nitrogen, the resultant solution is added dropwise over 4 hours to 20.0 g of propylene glycol monomethyl ether acetate heated to 80° C. After the conclusion of dropwise addition, the reaction solution is stirred for 2 hours, thereby obtaining a Reaction Solution (1). After the completion of the reaction, the Reaction Solution (1) is cooled to room temperature, and then added dropwise to a twenty-times greater amount of 8:1 methanol-water solvent mixture. An oily compound thus separated is collected by decantation to yield 24.1 g of the intended Resin (D20).

The weight average molecular weight of Resin (D20) measured by GPC and calculated in terms of standard polystyrene is 7,600, and the polydispersity (Mw/Mn) of Resin (D20) is 1.6.

Other resins of Component (D) used in Examples are synthesized in similar manners to the above. The structures of resins synthesized herein as Component (D) are the same as those hereinbefore shown as the examples of Resin (D). The ratio (by mole) between structural units, weight average molecular weight and polydispersity of Resin (D) used in each Example are summarized in Table 1.

TABLE 1

| Compound Code | Mw | Mw/Mn | Ratio between Structural Units (by mole) |
|---|---|---|---|
| D-8 | 5,500 | 1.5 | 50/50 |
| D-11 | 7,500 | 1.62 | 60/40 |
| D-14 | 11,000 | 2 | 80/20 |
| D-15 | 9,000 | 1.65 | 30/70 |
| D-20 | 7,600 | 1.6 | 100 |
| D-25 | 15,000 | 1.8 | 50/50 |
| D-30 | 8,000 | 1.9 | 50/50 |
| D-60 | 12,000 | 1.95 | 50/10/40 |
| D-74 | 8,000 | 1.75 | 40/60 |

Synthesis Example 2

Synthesis of Resin (A1)

In a stream of nitrogen, 20 g of 6:4 (by mass) solvent mixture of propylene glycol mnomethyl ether acetate and propylene glycol monomethyl ether is put in a three-necked flask and heated up to 80° C. (Solvent 1). A monomer mixture composed of γ-butyrolactone methacrylate, hydroxyadamantane methacrylate and 2-methyl-2-adamantyl methacrylate in proportions of 40:25:35 by mole is added to a 6:4 (by mass) solvent mixture of propylene glycol monomethyl ether acetate and propylene glycol monomethyl ether, thereby preparing a 22 mass % monomer solution (200 g). Further, an initiator V-601 (a product of Wako Pure Chemical Industries, Ltd.) is added to and dissolved in the monomer solution in an amount of 8 mole % based on the total monomers. The resultant solution is added dropwise to the Solvent 1 over 6 hours. After the conclusion of dropwise addition, reaction is made to continue at 80° C. for additional 2 hours. The reaction solution obtained is allowed to stand for cooling. Then, the reaction solution is poured into a mixture of 1,800 ml of hexane and 200 ml of ethyl acetate, and powdery matter thus precipitated is filtered off and dried, thereby yielding 37 g of Resin (A1). The weight average molecular weight of Resin (A1) thus obtained is 5,500 as calculated in terms of standard polystyrene, and the polydispersity (Mw/Mn) of Resin (A1) is 1.65.

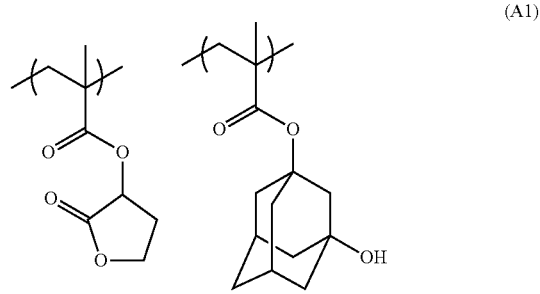

In the manners similar to the above, Resins (A2) to (A8) are synthesized.

Structural formulae of Resins (A2) to (A8) are illustrated below. And the ratio (by mole) between structural units, weight average molecular weight and polydispersity of each resin are summarized in Table 2.

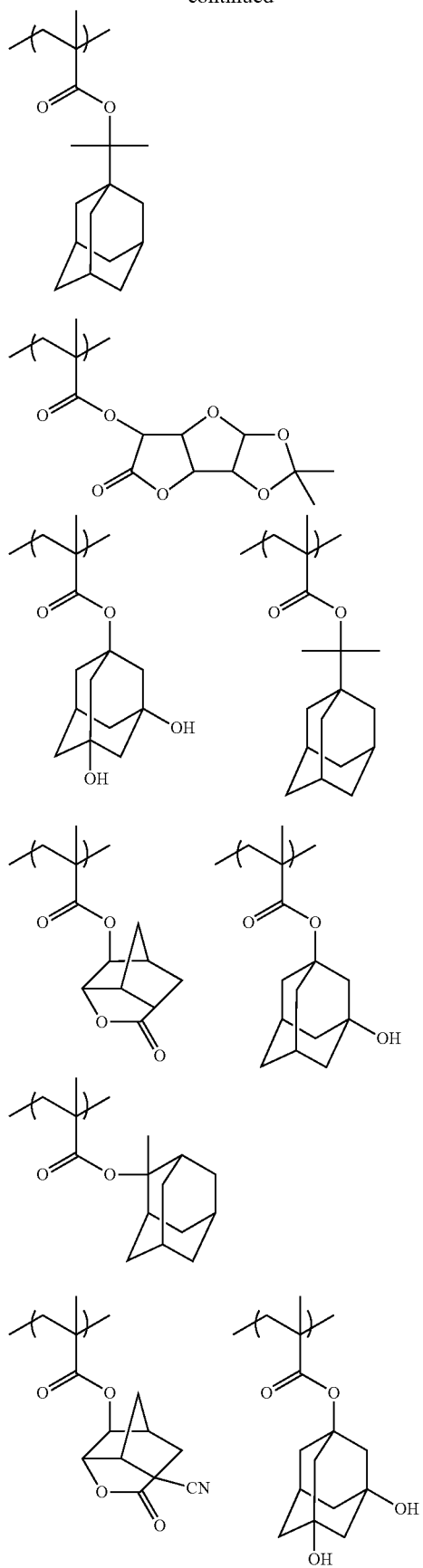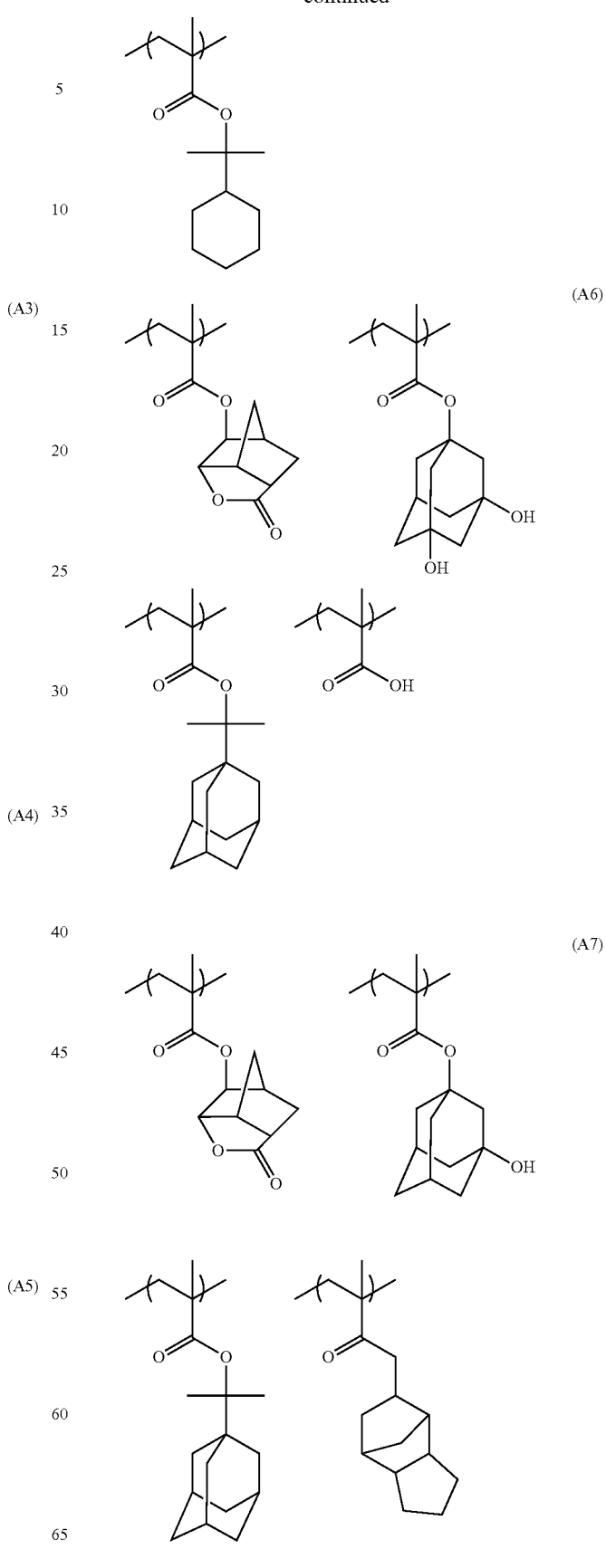

-continued

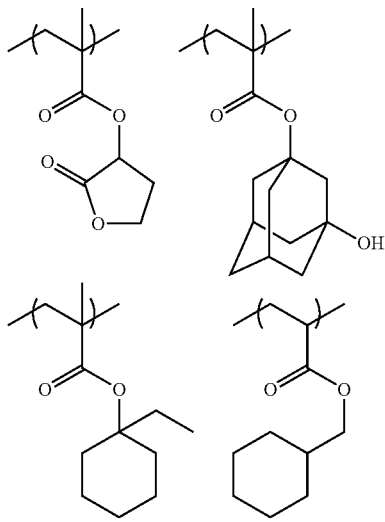

(A8)

TABLE 2

| | Resin (A) | | |
|---|---|---|---|
| Compound Code | Mw | Mw/Mn | Ratio between Structural Units (by mole) |
| A1 | 5,500 | 1.65 | 40/25/35 |
| A2 | 9,500 | 1.65 | 45/55 |
| A3 | 5,500 | 1.65 | 55/5/40 |
| A4 | 8,200 | 1.68 | 55/5/40 |
| A5 | 4,000 | 1.71 | 35/20/45 |
| A6 | 8,500 | 1.85 | 40/20/30/10 |
| A7 | 13,500 | 1.75 | 40/5/45/10 |
| A8 | 5,500 | 1.65 | 40/10/40/10 |

<Preparation of Resist Composition>

Resist compositions Ra1 to Ra10, Ra1', Ra6' and Rb1 are prepared by dissolving their respective combinations of ingredients in their respective solvents as shown in the following Table 3, and passing each of the resultant solutions through a polyethylene filter having a pore size of 0.05 μm.

TABLE 3

| Resist Composition | Acid Generator (parts by mass) | Resin (A) (parts by mass) | Resin (D) (parts by mass) | Basic Compound (parts by mass) | Surfactant (100 ppm) | Solvent (ratio by weight) | Solids Concentration (mass %) |
|---|---|---|---|---|---|---|---|
| Ra1 | z62 (5) | A1 (93.10) | D-8 (1.40) | N-1 (0.50) | W-4 | SL-1/SL-2 (70/30) | 5.3 |
| Ra2 | z57 (5) | A2 (94.45) | not mixed | N-1 (0.55) | W-4 | SL-1/SL-2 (70/30) | 5.3 |
| Ra3 | z59 (3.2) | A3 (90.20) | D-11 (4.30) | N-1 (0.50) | W-4 | SL-1/SL-2 (70/30) | 5.3 |
| Ra4 | z74 (4.5) | A4 (93.30) | D-14 (3.00) | N-2 (0.50) | W-3 | SL-1/SL-2 (60/40) | 7.5 |
| Ra5 | z76 (6.5) | A5 (93.35) | D-15 (1.70) | N-2 (0.45) | W-2 | SL-1/SL-2 (90/10) | 5.3 |
| Ra6 | z16 (5.0) | A6 (91.00) | D-20 (2.00) | N-1 (0.50) | W-1 | SL-1/SL-2 (80/20) | 5.3 |
| Ra7 | z17 (4.5) | A1 (89.65) | D-25 (5.00) | N-3 (0.35) | W-3 | SL-1 (100) | 5.3 |
| Ra8 | z53 (4.0) | A7 (94.42) | D-30 (0.80) | N-2 (0.28) | W-2 | SL-2 (100) | 5.7 |
| Ra9 | z8/z46 (6.3/0.8) | A7 (94.50) | D-60 (0.30) | N-3 (0.40) | W-4 | SL-1/SL-2 (50/50) | 5.7 |
| Ra10 | z63 (4.8) | A8 (92.70) | D-74 (0.50) | N-1 (0.50) | W-4 | SL-1/SL-2 (70/30) | 3.7 |
| Ra1' | z62 (5) | A1 (93.10) | D-8 (1.40) | N-1 (0.50) | W-4 | SL-1/SL-2 (70/30) | 7.5 |
| Ra6' | z16 (5.0) | A6 (91.00) | D-20 (2.00) | N-1 (0.50) | W-1 | SL-1/SL-2 (80/20) | 7.5 |
| Rb1 | z20 (5.0) | A6 (91.50) | not mixed | N-1 (0.50) | W-1 | SL-1/SL-2 (80/20) | 7.5 |

The symbols in Table 3 stand for the following compounds, respectively.

N-1: N,N-Diphenylaniline
N-2: Diazabicyclo[4.3.0]nonene
N-3: 4-Dimethylaminopyridine
W-1: Megafac F176 (a fluorinated surfactant, produced by Dainippon Ink & Chemicals, Inc.)
W-2: Megafac R08 (a surfactant containing both fluorine and silicon atoms, produced by Dainippon Ink & Chemicals, Inc.)
W-3: Polysiloxane polymer KP-341 (a silicon surfactant, produced by Shin-Etsu Chemical Co., Ltd.)
W-4: PF6320 (a fluorinated surfactant, produced by OMNOVA Solutions Inc.)
SL-1: Propylene glycol monomethyl ether acetate
SL-2: Propylene glycol monomethyl ether In accordance with the methods mentioned hereinafter, evaluations are made using the thus prepared resist compositions.

Example 1

Negative Development

An organic antireflective film ARC29A (a product of Nissan Chemical Industries, Ltd.) is applied to a silicon wafer surface, and baked at 205° C. for 60 seconds, thereby forming a 78 nm-thick antireflective film. On this film, the resist composition Ra1 is spin-coated, and baked at 120° C. for 60 seconds, thereby forming a 150 nm-thick resist film. The thus obtained wafer is subjected to immersion exposure via a mask for pattern formation, wherein purified water is used as the immersion liquid and PAS5500/1250i equipped with a lens of NA=0.85 (made by ASML) is used as an ArF excimer laser scanner. After the exposure, the wafer is spun at revs of 2,000 rpm, and thereby the water remaining on the wafer is removed. Then, the wafer is subjected successively to 60 seconds' heating at 120° C., 60 seconds' development (negative development) with butyl acetate (negative developer), rinse with 1-hexanol, and 30 seconds' spinning at revs of 4,000 rpm. Thus, 80-nm (1:1) line-and-space resist patterns are formed.

Examples 2 to 10 and Comparative Example 1

Negative Development and Change in Resist Composition 80-nm (1:1) Line-and-space patterns are formed in the same manner as in Example 1, except that the resist composition is changed to Ra2 to Ra10 and Rb1, respectively. In Example 10, however, the resist film thickness is 100 nm.

Comparative Example 2

Positive Development Alone

An organic antireflective film ARC29A (a product of Nissan Chemical Industries, Ltd.) is applied to a silicon wafer surface, and baked at 205° C. for 60 seconds, thereby forming a 78 nm-thick antireflective film. On this film, the resist composition Ra1 is spin-coated, and baked at 120° C. for 60 seconds, thereby forming a 150 nm-thick resist film. The thus obtained wafer is subjected to immersion exposure via a mask for pattern formation, wherein purified water is used as an immersion liquid and PAS5500/1250i equipped with a lens of NA=0.85 (made by ASML) is used as an ArF excimer laser scanner. After the exposure, the wafer is spun at revs of 2,000 rpm, and thereby the water remaining on the wafer is removed. Then, the wafer is subjected successively to 60 seconds' heating at 120° C., 60 seconds' development (positive development) with a 2.38 mass % aqueous solution of tetramethylammonium hydroxide (positive developer), rinse with purified water, and 30 seconds' spinning at revs of 4,000 rpm. Thus, 80-nm (1:1) line-and-space resist patterns are formed.

Example 11

Combined Use of Negative Development and Positive Development

An organic antireflective film ARC29A (a product of Nissan Chemical Industries, Ltd.) is applied to a silicon wafer surface, and baked at 205° C. for 60 seconds, thereby forming a 78 nm-thick antireflective film. On this film, the resist composition Ra1 is spin-coated, and baked at 120° C. for 60 seconds, thereby forming a 150 nm-thick resist film. The thus obtained wafer is subjected to immersion exposure via a mask for pattern formation, wherein purified water is used as an immersion liquid and PAS5500/1250i equipped with a lens of NA=0.85 (made by ASML) is used as an ArF excimer laser scanner. After the exposure, the wafer is spun at revs of 2,000 rpm, thereby undergoing removal of the water remaining thereon, and further heated at 120° C. for 60 seconds. Then, the wafer is subjected to 60 seconds' development (positive development) with a 2.38 mass % aqueous solution of tetramethylammonium hydroxide (positive developer), and further to rinse with purified water. Thus, patterns with a pitch of 320 nm and a line width of 240 nm are formed. Next, the resultant wafer is subjected to 60 seconds' development (negative development) with butyl acetate (negative developer), further to rinse with 1-hexanol, and then to 30 seconds' spinning at revs of 4,000 rpm. Thus, 80-nm (1:1) line-and-space resist patterns are obtained.

Example 12

Combined Use of Negative Development and Positive Development

An organic antireflective film ARC29A (a product of Nissan Chemical Industries, Ltd.) is applied to a silicon wafer surface, and baked at 205° C. for 60 seconds, thereby forming a 78 nm-thick antireflective film. On this film, the resist composition Ra1 is spin-coated, and baked at 120° C. for 60 seconds, thereby forming a 150 nm-thick resist film. The thus obtained wafer is subjected to immersion exposure via a mask for pattern formation, wherein purified water is used as an immersion liquid and PAS5500/1250i equipped with a lens of NA=0.85 (made by ASML) is used as an ArF excimer laser scanner. After the exposure, the wafer is spun at revs of 2,000 rpm, thereby undergoing removal of the water remaining thereon, and further heated at 120° C. for 60 seconds. Then, the wafer is subjected to 60 seconds' development (negative development) with butyl acetate (negative developer), further to rinse with 1-hexanol, and then to 30 seconds' spinning at revs of 4,000 rpm. Thus, patterns with a pitch of 320 nm and a line width of 240 nm are formed. Next, the resultant wafer is subjected to 60 seconds' development (positive development) with a 2.38 mass % aqueous solution of tetramethylammonium hydroxide (positive developer), and further to rinse with purified water. Thus, 80-nm (1:1) line-and-space resist patterns are obtained.

Examples 13 to 23

Negative Development and Change in Development Condition 80-nm (1:1) Line-and-space resist patterns are formed in the same manner as in Example 1, except that the combination of resist composition, negative developer and rinse liquid for negative development is changed to each of the combinations shown in Table 4.

Evaluation of Scum

With respect to the 80-nm (1:1) line-and-space patterns obtained in each of Examples 1 to 23 and Comparative Examples 1 and 2, top surfaces of line patterns and space areas are observed under a critical dimension scanning electron microscope (S-9260, made by Hitachi Ltd.). Cases where no resist residue is observed at all are rated as A, cases where almost no resist residue is observed are rated as B, cases where resist residues are observed in small quantities are rated as C, and cases where resist residues are observed in considerable quantities are rated as D. Results obtained are shown in Table 4.

Evaluation of Line Edge Roughness (LER)

A 80-nm (1:1) line-and-space pattern obtained in each of Examples 1 to 23 and Comparative Examples 1 and 2 is observed under a critical dimension scanning electron microscope (S-9260, made by Hitachi Ltd.), and the 80-nm line pattern is examined for distance from its edge line along the length direction to a base line, on which the edge line should be, at 50 different points on a 2-μm edge segment. And standard deviation is determined from these distance measurements, and 3σ is further calculated. The smaller the value thus calculated, the better the performance. Results obtained are shown in Table 4.

Evaluation of In-Plane Uniformity of Line Width

By means of a critical dimension scanning electron microscope (S-9260, made by Hitachi Ltd.), line widths of 80-nm (1:1) line-and-space resist patterns obtained by each of Examples 1 to 23 and Comparative Examples 1 and 2 are measured at 50 points having a spacing of 2 mm. From these measured values, standard deviation is determined and further 3σ is calculated. The smaller the value thus calculated, the better the performance. Results obtained are shown in Table 4.

Evaluation of Receding Contact Angle with Respect to Water

Each of the resist compositions shown in Table 3 is applied to a silicon wafer surface by means of a spin coater, and the coating solvent used therein is dried by 60 seconds' heating on a 120° C. hot plate. Thus, resist film having a thickness of 150 nm is formed. The contact angle of each resist film with respect to purified water is measured with a contact angle meter DM500 made by Kyowa Interface Science Co., Ltd. The measurement is carried out under conditions that the temperature is 25° C. and the humidity is 50%.

Evaluation of Following Capability of Water

Figure 4:
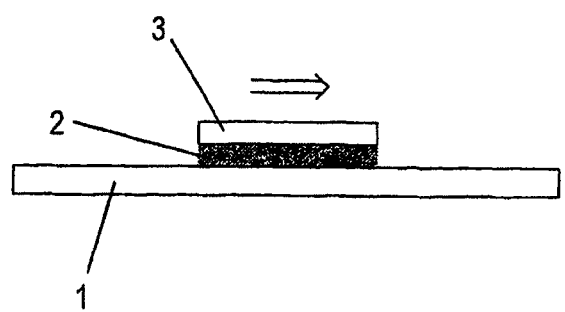
FIG. 4 is a diagrammatic illustration of a method for evaluating following capability of water.

A negative resist composition prepared is applied to a silicon wafer surface, and baked at 120° C. for 60 seconds, thereby forming resist film having a thickness of 150 nm. Then, as shown in FIG. 4, a space between the resist film-coated wafer 1 and a quartz glass substrate 3 is filled with purified water 2. In this condition, the quartz glass substrate 3 is moved (scanned) in parallel with the surface of the resist film-coated wafer 1, and the state of purified water following the parallel movement is observed by the naked eye. The scanning speed of the quartz glass substrate 3 is increased gradually until the purified water cannot follow the scanning speed of the quartz glass substrate 3 and droplets thereof comes to remain on the receding side. By determining this limiting scanning speed (unit: mm/sec), evaluation of following capability of water is made. The greater this limiting speed of possible scanning, the higher speed of scanning the water can follow, which indicates that water has the better following capability on the resist film.

TABLE 4

|  | Resist Composition | Negative Developer (ratio by weight) | Rinse liquid for Negative Development (ratio by weight) | Positive Development | Receding Contact Angle (degree) | Scum | LER (nm) | In-Plane Uniformity of Line Width (nm) | Following Capability of Water (mm/sec) |
|---|---|---|---|---|---|---|---|---|---|
| Example 1 | Ra1 | Butyl acetate (100) | 1-Hexanol (100) | Not performed | 90 | A | 3.6 | 5.0 | 500 |
| Example 2 | Ra2 | Butyl acetate (100) | 1-Hexanol (100) | Not performed | 70 | C | 7.2 | 7.5 | 300 |
| Example 3 | Ra3 | Butyl acetate (100) | 1-Hexanol (100) | Not performed | 94 | C | 6.0 | 5.9 | 500 |
| Example 4 | Ra4 | Butyl acetate (100) | 1-Hexanol (100) | Not performed | 82 | A | 7.6 | 4.3 | 450 |
| Example 5 | Ra5 | Butyl acetate (100) | 1-Hexanol (100) | Not performed | 72 | B | 3.8 | 3.0 | 300 |
| Example 6 | Ra6 | Butyl acetate (100) | 1-Hexanol (100) | Not performed | 77 | A | 3.7 | 4.7 | 400 |
| Example 7 | Ra7 | Butyl acetate (100) | 1-Hexanol (100) | Not performed | 90 | A | 6.1 | 6.5 | 500 |
| Example 8 | Ra8 | Butyl acetate (100) | 1-Hexanol (100) | Not performed | 80 | A | 3.6 | 4.6 | 450 |
| Example 9 | Ra9 | Butyl acetate (100) | 1-Hexanol (100) | Not performed | 70 | B | 3.2 | 3.5 | 300 |
| Example 10 | Ra10 | Butyl acetate (100) | 1-Hexanol (100) | Not performed | 71 | B | 3.1 | 3.5 | 300 |
| Example 11 | Ra1 | Butyl acetate (100) | 1-Hexanol (100) | performed | 90 | A | 4.3 | 3.9 | 500 |
| Example 12 | Ra1 | Butyl acetate (100) | 1-Hexanol (100) | performed | 90 | A | 4.3 | 4.3 | 500 |
| Example 13 | Ra1 | Isoamyl acetate (100) | 1-Hexanol (100) | Not performed | 90 | A | 3.3 | 5.1 | 500 |
| Example 14 | Ra1 | Methyl isobutyl ketone (100) | 1-Hexanol (100) | Not performed | 90 | A | 4.4 | 4.3 | 500 |
| Example 15 | Ra1 | 2-Hexanone (100) | 1-Hexanol (100) | Not performed | 90 | A | 4.2 | 3.5 | 500 |
| Example 16 | Ra1 | n-Butyl ether (100) | 1-Hexanol (100) | Not performed | 90 | A | 3.9 | 4.9 | 500 |
| Example 17 | Ra1' | Methyl ethyl ketone (100) | Decane (100) | Not performed | 90 | A | 7.7 | 6.7 | 500 |
| Example 18 | Ra1' | Dipropyl ether (100) | Decane (100) | Not performed | 90 | A | 7.6 | 7.4 | 500 |
| Example 19 | Ra1 | Butyl acetate/ 2-Hexanone (80/20) | 1-Hexanol (100) | Not performed | 90 | A | 4.2 | 4.3 | 500 |
| Example 20 | Ra1 | Isoamyl acetate/ n-Butyl ether (70/30) | 1-Hexanol (100) | Not performed | 90 | A | 4.3 | 5.1 | 500 |
| Example 21 | Ra1 | Isoamyl acetate (100) | 2-Heptanol (100) | Not performed | 90 | A | 3.2 | 3.8 | 500 |
| Example 22 | Ra1 | Isoamyl acetate (100) | Decane (100) | Not performed | 90 | A | 3.3 | 4.4 | 500 |
| Example 23 | Ra1 | Isoamyl acetate (100) | 2-Heptanol/Decane (50/50) | Not performed | 90 | A | 3.1 | 5.1 | 500 |
| Compar. Example 1 | Rb1 | Butyl acetate (100) | 1-Hexanol (100) | Not performed | 35 | D | 11.5 | 11.2 | 100 |
| Compar. Example 2 | Ra6' | Not used | Not used | performed | 77 | D | 10.0 | 10.1 | 400 |

The term "ratio by weight" in Table 4 represents the ratio by weight between two kinds of organic solvents used in a mixed state as a negative developer or a rinse liquid for negative development. Herein, the ratio by weight in the case of using only one kind of organic solvent as a negative developer or a rinse liquid for negative development is 100. In Comparative Example 2, on the other hand, neither negative development process nor rinse process after negative development is carried out, but the positive development process is carried out using an aqueous solution of tetramethylammonium hydroxide (2.38 mass %) and the rinse process using purified water is carried out after the positive development.

Vapor pressures and boiling points of the solvents constituting the negative developers for negative development and the rinse liquids used in Examples are shown in Table 5.

TABLE 5

|  | Name of Solvent | Vapor Pressure at 20° C. (kPa) | Boiling Point (° C.) |
|---|---|---|---|
| Negative Developer | Butyl acetate | 1.2 | 126 |
|  | Isoamyl acetate | 0.53 | 142 |
|  | Methyl isobutyl ketone | 2.1 | 117-118 |
|  | 2-Hexanone | 0.36 | 126-128 |
|  | Methyl ethyl ketone | 10.5 | 80 |
|  | Dipropyl ether | 8.33 | 88-90 |
|  | n-Butyl ether | 0.64 | 142 |
| Rinse liquid for Negative Development | 1-Hexanol | 0.13 | 157 |
|  | 2-Heptanol | 0.133 | 150-160 |
|  | Decane | 0.17 | 174.2 |

As is evident from the results obtained in Examples, the resist compositions used for negative development in accordance with the invention allow consistent formation of high-accuracy fine patterns that are prevented from suffering scum, reduced in line edge roughness and satisfactory in in-plane uniformity of line width. In addition, it is also apparent that the resist compositions used for negative development in accordance with the invention ensure an immersion liquid good following capability in immersion exposure.

In accordance with the present pattern formation method, patters reduced in scum appearing after development and improved in line edge roughness and in-plane uniformity of line width can be formed with high precision.

The entire disclosure of each and every foreign patent application from which the benefit of foreign priority has been claimed in the present application is incorporated herein by reference, as if fully set forth.

What is claimed is:

1. A system comprising:
a substrate coated with a resist film having a receding contact angle of 70 degrees or above with respect to water, wherein the resist film contains a resin capable of increasing its polarity by the action of an acid and becomes more soluble in a positive developer which is an alkali developer and becomes less soluble in a negative developer containing an organic solvent upon irradiation with an actinic ray or radiation,
an immersion exposure apparatus, and
a developing apparatus that develops the substrate with the negative developer containing an organic solvent.

2. The system of claim 1, wherein the organic solvent which the negative developer contains is at least one organic solvent selected from the group consisting of a ketone solvent, an ester solvent, an alcohol solvent, an amide solvent, an ether solvent, and a hydrocarbon solvent.

3. The system of claim 1, further comprising,
a developing apparatus that develops the substrate with the positive developer that is an alkali developer.

4. The system of claim 2, wherein the organic solvent which the negative developer contains is a ketone solvent or an ester solvent.

5. The system of claim 2, wherein the organic solvent which the negative developer contains is butyl acetate.

6. A system for forming patterns, comprising:
a substrate coated with a resist film, wherein the resist film contains a resin capable of increasing its polarity by the action of an acid and becomes more soluble in a positive developer which is an alkali developer and becomes less soluble in a negative developer containing an organic solvent upon irradiation with an actinic ray or radiation,
an immersion exposure apparatus for exposing the resist film, and
a developing apparatus that develops the exposed resist film on the substrate with the negative developer containing the organic solvent,
wherein the resist film is formed from a coating on the substrate of a resist composition for negative development which comprises:
(A) the resin capable of increasing the polarity by the action of an acid, which becomes more soluble in the positive developer and less soluble in the negative developer upon irradiation with an actinic ray or radiation,
(B) a compound capable of generating an acid upon irradiation with an actinic ray or radiation,
(C) a solvent, and
(D) a resin having at least either a fluorine atom or a silicon atom,
wherein the amount of the component (D) is 0.1 mass % or more, based on the total solids in the resist composition.

7. The system of claim 6, further comprising,
a developing apparatus that develops the substrate with the positive developer which is an alkali developer.

8. The system of claim 6, wherein the organic solvent which the negative developer contains is at least one organic solvent selected from the group consisting of a ketone solvent, an ester solvent, an alcohol solvent, an amide solvent, an ether solvent, and a hydrocarbon solvent.

9. The system of claim 8, wherein the organic solvent which the negative developer contains is a ketone solvent or an ester solvent.

10. The system of claim 8, wherein the organic solvent which the negative developer contains is butyl acetate.

* * * * *